(12) United States Patent
Sadaka et al.

(10) Patent No.: US 7,675,090 B2
(45) Date of Patent: Mar. 9, 2010

(54) SEMICONDUCTOR DEVICE HAVING A CONTACT ON A BUFFER LAYER THEREOF AND METHOD OF FORMING THE SAME

(75) Inventors: Mariam Gergi Sadaka, Austin, TX (US); Berinder P. S. Brar, Newbury Park, CA (US); Wonill Ha, Thousand Oaks, CA (US); Chanh Ngoc Minh Nguyen, Calabasas, CA (US)

(73) Assignee: Flextronics International USA, Inc., San Jose, CA (US)

( * ) Notice: Subject to any disclaimer, the term of this patent is extended or adjusted under 35 U.S.C. 154(b) by 0 days.

(21) Appl. No.: 11/732,301

(22) Filed: Apr. 3, 2007

(65) Prior Publication Data

US 2007/0187717 A1    Aug. 16, 2007

Related U.S. Application Data

(63) Continuation-in-part of application No. 11/128,623, filed on May 13, 2005, now Pat. No. 7,339,208.

(51) Int. Cl.
*H01L 31/0328* (2006.01)
(52) U.S. Cl. ........................ 257/194; 257/192
(58) Field of Classification Search ................. 257/192, 257/194
See application file for complete search history.

(56) References Cited

U.S. PATENT DOCUMENTS

| | | | |
|---|---|---|---|
| 4,499,481 | A | 2/1985 | Greene |
| 4,570,174 | A | 2/1986 | Huang et al. |
| 4,636,823 | A | 1/1987 | Margalit et al. |
| 4,807,022 | A | 2/1989 | Kazior et al. |
| 4,903,089 | A | 2/1990 | Hollis et al. |
| 4,903,189 | A | 2/1990 | Ngo et al. |
| 4,967,243 | A | 10/1990 | Baliga et al. |
| 5,055,889 | A | 10/1991 | Beall |
| 5,068,756 | A | 11/1991 | Morris et al. |

(Continued)

FOREIGN PATENT DOCUMENTS

EP    1 256 985 A2    11/2002

(Continued)

OTHER PUBLICATIONS

Berroth, M., et al., "Extreme Low Power 1:4 Demultiplexer Using Double Delta Doped Quantum Well GaAs/AlGaAs Transistors," Japanese Journal of Applied Physics, Extended Abstracts of the 22nd 1990 International Conference on Solid State Devices and Materials, 1990, pp. 75-78, Tokyo, Japan.

(Continued)

*Primary Examiner*—Thomas L Dickey
(74) *Attorney, Agent, or Firm*—Slater & Matsil, L.L.P.

(57) ABSTRACT

A semiconductor device and method of forming the same. The semiconductor device includes an epitaxially grown and conductive buffer layer having a contact covering a substantial portion of a bottom surface thereof and a lateral channel above the buffer layer. The semiconductor device also includes another contact above the lateral channel and an interconnect that connects the lateral channel to the buffer layer, operable to provide a low resistance coupling between the contact and the lateral channel.

20 Claims, 46 Drawing Sheets

U.S. PATENT DOCUMENTS

| | | | |
|---|---|---|---|
| 5,106,778 A | | 4/1992 | Hollis et al. |
| 5,126,701 A | * | 6/1992 | Adlerstein .................. 333/17.2 |
| 5,126,714 A | | 6/1992 | Johnson |
| 5,223,449 A | | 6/1993 | Morris et al. |
| 5,231,037 A | | 7/1993 | Yuan et al. |
| 5,244,829 A | | 9/1993 | Kim |
| 5,292,686 A | | 3/1994 | Riley et al. |
| 5,342,795 A | | 8/1994 | Yuan et al. |
| 5,343,071 A | * | 8/1994 | Kazior et al. ................ 257/621 |
| 5,369,042 A | | 11/1994 | Morris et al. |
| 5,374,887 A | | 12/1994 | Drobnik |
| 5,407,842 A | | 4/1995 | Morris et al. |
| 5,468,661 A | | 11/1995 | Yuan et al. |
| 5,554,561 A | | 9/1996 | Plumton |
| 5,555,494 A | | 9/1996 | Morris |
| 5,610,085 A | | 3/1997 | Yuan et al. |
| 5,624,860 A | | 4/1997 | Plumton et al. |
| 5,700,703 A | | 12/1997 | Huang et al. |
| 5,712,189 A | | 1/1998 | Plumton et al. |
| 5,747,842 A | | 5/1998 | Plumton |
| 5,756,375 A | | 5/1998 | Celii et al. |
| 5,783,984 A | | 7/1998 | Keuneke |
| 5,784,266 A | | 7/1998 | Chen |
| 5,804,943 A | | 9/1998 | Kollman et al. |
| 5,889,298 A | | 3/1999 | Plumton et al. |
| 5,909,110 A | | 6/1999 | Yuan et al. |
| 5,910,665 A | | 6/1999 | Plumton et al. |
| 5,920,475 A | | 7/1999 | Boylan et al. |
| 5,933,717 A | | 8/1999 | Hause et al. |
| 5,956,245 A | | 9/1999 | Rozman |
| 5,956,578 A | | 9/1999 | Weitzel et al. |
| 6,008,519 A | | 12/1999 | Yuan et al. |
| 6,038,154 A | | 3/2000 | Boylan et al. |
| 6,094,038 A | | 7/2000 | Lethellier |
| 6,097,046 A | | 8/2000 | Plumton |
| 6,156,611 A | | 12/2000 | Lan et al. |
| 6,181,231 B1 | | 1/2001 | Bartilson |
| 6,191,964 B1 | | 2/2001 | Boylan et al. |
| 6,208,535 B1 | | 3/2001 | Parks |
| 6,218,891 B1 | | 4/2001 | Lotfi et al. |
| 6,229,197 B1 | | 5/2001 | Plumton et al. |
| 6,287,908 B1 | | 9/2001 | Brand |
| 6,309,918 B1 | | 10/2001 | Huang et al. |
| 6,323,090 B1 | | 11/2001 | Zommer |
| 6,348,848 B1 | | 2/2002 | Herbert |
| 6,362,986 B1 | | 3/2002 | Schultz et al. |
| 6,477,065 B2 | | 11/2002 | Parks |
| 6,483,724 B1 | | 11/2002 | Blair et al. |
| 6,525,603 B1 | | 2/2003 | Morgan |
| 6,549,436 B1 | | 4/2003 | Sun |
| 6,661,276 B1 | | 12/2003 | Chang |
| 6,741,099 B1 | | 5/2004 | Krugly |
| 6,775,159 B2 | | 8/2004 | Webb et al. |
| 6,873,237 B2 | | 3/2005 | Chandrasekaran et al. |
| 6,980,077 B1 | | 12/2005 | Chandrasekaran et al. |
| 7,012,414 B1 | | 3/2006 | Mehrotra et al. |
| 7,046,523 B2 | | 5/2006 | Sun et al. |
| 7,176,662 B2 | | 2/2007 | Chandrasekaran |
| 7,285,807 B2 | | 10/2007 | Brar et al. |
| 7,321,283 B2 | | 1/2008 | Mehrotra et al. |
| 7,417,266 B1 | | 8/2008 | Li et al. |
| 7,439,556 B2 | | 10/2008 | Brar et al. |
| 7,439,557 B2 | | 10/2008 | Brar et al. |
| 7,462,891 B2 | | 12/2008 | Brar et al. |
| 2002/0121647 A1 | * | 9/2002 | Taylor ........................ 257/192 |
| 2003/0141518 A1 | | 7/2003 | Yokogawa et al. |
| 2003/0198067 A1 | | 10/2003 | Sun et al. |
| 2003/0203583 A1 | | 10/2003 | Malik |
| 2005/0001235 A1 | * | 1/2005 | Murata et al. ............... 257/192 |
| 2005/0024179 A1 | | 2/2005 | Chandrasekaran et al. |
| 2005/0104080 A1 | | 5/2005 | Ichihara et al. |
| 2006/0038650 A1 | | 2/2006 | Mehrotra et al. |
| 2006/0091430 A1 | | 5/2006 | Sriram et al. |
| 2006/0118824 A1 | | 6/2006 | Otsuka et al. |
| 2006/0187684 A1 | | 8/2006 | Chandrasekaran et al. |
| 2006/0197510 A1 | | 9/2006 | Chandrasekaran |
| 2006/0198173 A1 | | 9/2006 | Rozman |
| 2006/0202299 A1 | | 9/2006 | Chertouk |
| 2006/0208279 A1 | * | 9/2006 | Robinson et al. ............ 257/194 |
| 2006/0226477 A1 | | 10/2006 | Brar et al. |
| 2006/0226478 A1 | | 10/2006 | Brar et al. |
| 2007/0007579 A1 | | 1/2007 | Scheuerlein et al. |
| 2007/0045765 A1 | | 3/2007 | Brar et al. |
| 2007/0069286 A1 | | 3/2007 | Brar et al. |
| 2007/0145417 A1 | | 6/2007 | Brar et al. |
| 2007/0296028 A1 | | 12/2007 | Brar et al. |
| 2007/0298559 A1 | | 12/2007 | Brar et al. |
| 2007/0298564 A1 | | 12/2007 | Brar et al. |

FOREIGN PATENT DOCUMENTS

| | | |
|---|---|---|
| EP | 1 638 147 A2 | 3/2006 |
| WO | WO 2005/015642 A1 | 2/2005 |

OTHER PUBLICATIONS

Eisenbeiser, K., et al., "Manufacturable GaAs VFET for Power Switching Applications," IEEE Electron Device Letters, Apr. 2000, pp. 144-145, vol. 21, No. 4, IEEE.

Kollman, R., et al., "10 MHz PWM Converters with GaAs VFETs," IEEE Eleventh Annual Applied Power Electronics Conference and Exposition, Mar. 1996, pp. 264-269, vol. 1, IEEE.

Liu, W., "Fundamentals of III-V Devices: HBTs, MESFETs, and HFETs/HEMTs," §5-5: Modulation Doping, 1999, pp. 323-330, John Wiley & Sons, New York, NY.

Nguyen, L.D., et al., "Ultra-High-Speed Modulation-Doped Field-Effect Transistors: A Tutorial Review," Proceedings of the IEEE, Apr. 1992, pp. 494-518, vol. 80, No. 4, IEEE.

Niemela, V.A., et al., "Comparison of GaAs and Silicon Synchronous Rectifiers in a 3.3V Out, 50W DC-DC Converter," 27th Annual, IEEE Power Electronics Specialists Conference, Jun. 1996, pp. 861-867, vol. 1, IEEE.

Plumton, D.L., et al., "A Low On-Resistance High-Current GaAs Power VFET," IEEE Electron Device Letters, Apr. 1995, pp. 142-144, vol. 16, No. 4, IEEE.

Weitzel, C.E., "RF Power Devices for Wireless Communications," 2002 IEEE MTT-S CDROM, 2002, pp. 285-288, paper TU4B-1, IEEE, Los Alamitos, CA.

Williams, R., "Modern GaAs Processing Methods," 1990, pp. 66-67, Artech House, Inc., Norwood, MA.

Wu, C.S., et al., "Pseudomorphic HEMT Manufacturing Technology for Multifunctional Ka-Band MMIC Applications," IEEE Transactions on Microwave Theory and Techniques, Feb. 1995, pp. 257-265, vol. 43, No. 2, IEEE, New York, US.

Asano, K. et al., "Novel High Power AlGaAs/GaAs HFET with a Field-Modulating Plate Operated at 35V Drain Voltage," IEDM 98, 1998, pp. 59-62, IEEE, Los Alamitos, CA.

Lan, E., et al., "A Field Plate Device by Self-Aligned Spacer Process," The International Conference on Compound Semiconductor Manufacturing Technology, 2004, pp. 35-38, GaAs Mantech, St. Louis, MO.

Sickmiller, M., "Packaging of Ultrathin Semiconductor Devices Through the ELO Packaging Process," Mat. Res. Soc. Symp. Proc., 2001, pp. 17.3.1-17.3.6, vol. 681E, Materials Research Society, Warrendale, PA.

Tkachenko, Y., et al., "Improved Breakdown Voltage and Hot-Electron Reliability PHEMT for High Efficiency Power Amplifiers," Asia Pacific Microwave Conference (AMPC'99), Nov. 30, 1999, pp. 618-621, vol. 3, IEEE, Los Alamitos, CA.

Bergman, J., "Development of Indium Arsenide Quantum Well Electronic Circuits: A Dissertation Presented to the Academic Faculty," http://smartech.gatech.edu/bitstream/1853/5033/1/bergman_joshua_i_200407_phd.pdf, Jul. 2004, 225 pp., Georgia Institute of Technology, Atlanta, GA.

"Advanced Synchronous Rectified Buck MOSFET Drivers with Pre-POR OVP," ISL6612A, ISL6613A, Data Sheet FN9159.6, Jul. 27, 2006, 12 pp., Intersil Americas Inc., Milpitas, CA.

Storm, D.F., et al., "Reduction of Buffer Layer Conduction Near Plasma-Assisted Molecular-Beam Epitaxy Grown GaN/AlN Interfaces by Beryllium Doping," Applied Physics Letters, Nov. 11, 2002, pp. 3819-3921, vol. 81, No. 20, American Institute of Physics, Melville, NY.

Ajit, J.S., "design of MOS-Gated Biopolar Transistors with Integral Antiparallel Diode," IRRR Electron Device Letters, pp. 344-347, Jul. 1996, vol. 17, Issue 7, IEEE, Los Alamitos, CA.

Peppel, M., et al., "Optimized Reverse Diode Operation of Power MOSFETs," 2000 IEEE Industry Applications Conference, Oct. 8, 2000, pp. 2961-2965, vol. 5, IEEE, Los Alamitos, CA.

* cited by examiner

SEMICONDUCTOR DEVICE HAVING A CONTACT ON A BUFFER LAYER THEREOF AND METHOD OF FORMING THE SAME

This application is a continuation in part of, and claims priority to, U.S. patent application Ser. No. 11/128,623, entitled "Semiconductor Device Having Multiple Lateral Channels and Method of Forming the Same," filed on May 13, 2005 now U.S. Pat. No. 7,339,208, which is incorporated herein by reference.

TECHNICAL FIELD

The present invention is directed, in general, to semiconductor devices and, more specifically, to a semiconductor device having reduced on-resistance, and a method of forming the same.

BACKGROUND

A field-effect transistor (also referred to as a "FET") is a conventional semiconductor device employable in switch-mode power supplies for use in data processing and telecommunication systems as well as for other applications that use conditioned power for the operation of sensitive electronic circuits. Field-effect transistors have almost universally replaced bipolar transistors previously used for inverters (a type or portion of a power supply) as well as the p-n and Schottky diodes used for rectification. The proliferation of field-effect transistors has, at least in part, been driven by the need to provide highly efficient power supplies with low dc output voltages such as five volts or less at higher current levels. The broad acceptance of field-effect transistors for the aforementioned applications is a consequence of the low forward voltage drop and fast switching speed as well as the low power consumption employed to enable or disable conduction thereof. As a result, the use of field-effect transistors has contributed to compact and efficient power supplies that can be produced at low cost.

As the loads for the power supplies are generally designed with integrated circuits employing shrinking feature sizes for the circuit elements, a need is continually evolving for new designs with lower output voltages (e.g., one volt or less) at higher current levels (e.g., 50 to 100 amperes or more). Present switch-mode power supplies providing input-output circuit isolation (via a transformer) and employing silicon-based field-effect transistors as synchronous rectifiers therein and designed with best current practice are usually operable with switching frequencies only up to several hundred kilohertz ("kHz") due, at least in part, to the slower switching speeds of the silicon-based field-effect transistors. To accommodate continuing developments in integrated circuit technology, however, the power supply switching frequencies above one megahertz ("MHz") are desirable to reduce the size of magnetic devices and the capacitive filtering elements of the power supply without compromising the power conversion efficiency. In accordance therewith, field-effect transistors with previously unrealizable characteristics are not only being requested, but are necessary to satisfy the aforementioned conditions.

A material of choice for high performance field-effect transistors is a semiconductor with high electron mobility and wide band gap for high breakdown voltage that is capable of being processed with conventional equipment and methods not substantially different from those already developed for silicon and present generations of compound semiconductors. A particularly desirable material is the compound semiconductor known as gallium arsenide ("GaAs"), which has been used for integrated circuits operable at frequencies well above one gigahertz, and which has been used to produce power field-effect transistors with high performance characteristics. An exemplary performance of gallium arsenide in comparison to other semiconductor materials for high performance field-effect transistors is described in "Fundamentals of III-V Devices" by W. Liu, published by John Wiley and Sons (1999), and "Modern GaAs Processing Methods" by R. Williams, published by Artech House (1990), which are incorporated herein by reference.

Additionally, examples of gallium arsenide field-effect transistors employing a controllable vertical channel between a source and drain thereof are provided in the following references, namely, U.S. Pat. No. 5,889,298 entitled "Vertical JFET Field Effect Transistor," by Plumton, et al., issued on Mar. 30, 1999, U.S. Pat. No. 5,342,795 entitled "Method of Fabricating Power VFET Gate-Refill," by Yuan, et al., issued on Aug. 30, 1994, U.S. Pat. No. 5,468,661 entitled "Method of Making Power VFET Device," by Yuan, et al., issued on Nov. 21, 1995, U.S. Pat. No. 5,610,085 entitled "Method of Making a Vertical FET using Epitaxial Overgrowth," by Yuan, et al., issued on Mar. 11, 1997, and U.S. Pat. No. 5,624,860 entitled "Vertical Field Effect Transistor and Method," by Plumton, et al., issued on Apr. 29, 1997, which are incorporated herein by reference.

An exemplary gallium arsenide field-effect transistor as generally described in the aforementioned references is illustrated with respect to FIG. 1. The gallium arsenide field-effect transistor includes buried and inter-coupled gate fingers (also referred to as a gate and one of which is designated 110) formed in etched trenches in an n-type doped drain 120 thereby producing vertical channels 130. The gates 110 exhibit a gate length (generally designated "GL") and the vertical channels 130 provide a channel opening (generally designated "CO"). The trenches are back-filled epitaxially with p-type doped gallium arsenide to form the gates 110. A p+ implant 140 provides a top surface contact to the gates 110, and is made through a further n-type doped epitaxial layer that forms a source 150. External connection to the gates 110 is made through metallized contacts 160 deposited over the heavily doped p+ implants 140. An external source contact 170 and drain contact 180 are made through metal depositions over further heavily doped areas. The structure produces vertical field-effect transistor channels between the gates 110, and provides source and drain contacts 170, 180, respectively, on opposing sides of the die. The device, therefore, operates with vertical carrier flow and the buried gates 110, typically doped opposite from the vertical channels 130, exhibit limited control over a fill profile thereof.

The field-effect transistor as described above, however, does not accommodate a careful doping profiling and epitaxial layer design necessary to produce a modulation-doped channel that can be formed in a lateral channel and that may be employed to substantially reduce the on-resistance of the device. The field-effect transistor described above is not configured with a channel having a strained material, which would significantly improve a mobility of the current carrying carriers and, consequently, a switching speed thereof. This design methodology of constructing such gallium arsenide field-effect transistors has been analyzed in the following references, namely, "Comparison of GaAs and Silicon Synchronous Rectifiers in a 3.3V Out, 50 W D-DC Converter," by V. A. Niemela, et al., 27th Annual, IEEE Power Electronics Specialists Conference, Vol. 1, June 1996, pp. 861-67, "10 MHz PWM Converters with GaAs VFETs," by R. Kollman, et al., IEEE Eleventh Annual Applied Power Electronics Conference and Exposition, Vol. 1, March 1996, pp. 264-69, "A Low On-Resistance High-Current GaAs Power VFET," by D. L. Plumton, et al., IEEE Electron Device Letters, Vol. 16, Issue 4, April 1995, pp. 142-44, and "RF Power Devices for Wireless Communications," by C. E. Weitzel, IEEE MTT-S2002, paper TU4B-1, which are incorporated herein by reference. The structure as generally described in the aforementioned references has higher channel and gate resistance per unit die area than the desired resistance and produces a device operable only in the depletion mode, which may limit the applicability of the device in certain situations. Additionally, the devices described in the aforementioned references do not include a body diode. The resulting cost and performance have resulted in limited marketability in view of the presently available silicon-based technology.

Another example of a vertical channel gallium arsenide field-effect transistor is described in "Manufacturable GaAs VFET for Power Switching Applications," by K. Eisenbeiser, et al., IEEE Electron Device Letters, Vol. 21, No. 4, pp. 144-45 (April 2000), which is incorporated herein by reference. The reference describes forming a source contact on a top surface of the die and a drain contact on the bottom. A vertical channel, however, is still provided in the design proposed by Eisenbeiser, et al. Although economies of manufacture are achieved using implants rather than etching and epitaxial growth as described by Eisenbeiser, et al., possible disadvantages of a channel with a vertical structure limit the switching speed and operation as an enhancement-mode device.

R. Williams describes a GaAs power field-effect transistor in "Modern GaAs Processing Methods," incorporating both the source and drain contacts on the upper side of a die with a lateral channel and is illustrated with respect to FIG. 2A. The gallium arsenide field-effect transistor acting as a power field-effect transistor includes a gate 205 interposed between a source 210 and drain 215, creating a lateral channel in an n-type doped GaAs layer 220. A depletion region 225 is formed under the gate 205 and a shallower depletion region 230 forms generally under an upper surface of the die as a result of an inherent existence of surface states at the surface of the crystal (i.e., a surface pinning effect). The gallium arsenide field-effect transistor is formed over a semi-insulating GaAs substrate 235. Designing the source and drain contacts on the same surface of the die requires a complicated multilayer metallization process and results in increased die area and reduced chip yield. The aforementioned configuration can also lead to increased inductance, which is of significance in applications for microwave signal amplification. Also, the gallium arsenide field-effect transistor does not include an intrinsic body diode.

Another gallium arsenide field-effect transistor is described by R. Williams at pp. 66-67 of "Modern GaAs Processing Methods," which is configured with source and drain contacts on opposing sides of the die and a lateral channel, and is illustrated with respect to FIG. 2B. The gallium arsenide field-effect transistor includes a plated air bridge 250 coupled to a source (generally designated "S") on an upper side of the die. Gates (generally designated "G") are interposed between drains (generally designated "D"), and are also located on the upper surface of the die. Couplings to the source are brought down to a lower surface of the die by vias 265 that are plated-through holes between the lower surface and the source and are further coupled together by a plated heat sink 280. Although this arrangement can provide low-inductance external connections to the source, it is limited in its ability to provide a low-resistance channel tightly coupled to the lower surface of a highly conductive substrate, or an intrinsic body diode.

The aforementioned design also does not accommodate large drain contacts desirable for a higher power device, which will increase the resistive and inductive losses. This configuration requires a complex air-bridge processing step, which will increase the cost and potentially affect the reliability of the device. For the large gate width field-effect transistor, the parasitic resistance in series with the source will increase due to the long air-bridge connection. This design also is incompatible with today's packaging techniques for higher power devices embodied in a vertical device configuration.

Additionally, U.S. Pat. No. 6,309,918 entitled "Manufacturable GaAs VFET Process," by Huang, et al., issued on Oct. 30, 2001, is directed toward a vertical FET with source and drain contacts on opposing sides of a die. U.S. Pat. No. 5,956,578 entitled "Method of Fabricating Vertical FET with Schottky Diode," by Weitzel, et al., issued on Sep. 21, 1999, and U.S. Pat. No. 6,097,046 entitled "Vertical Field Effect Transistor and Diode," by Plumton, issued on Aug. 1, 2000, are directed toward a vertical FET on a compound semiconductor substrate with an integrated Schottky diode on an upper surface of the die. Neither of the aforementioned references, which are also incorporated herein by reference, provides low on-resistance using a conductivity-enhanced lateral channel.

Still further references such as U.S. Pat. No. 5,068,756 entitled "Integrated Circuit Composed of Group III-V Compound Field Effect and Bipolar Semiconductors," by Morris, et al., issued on Nov. 26, 1991, and U.S. Pat. No. 5,223,449 entitled "Method of Making an Integrated Circuit Composed of Group III-V Compound Field Effect and Bipolar Semiconductors," by Morris, et al., issued on Jun. 29, 1993, which are incorporated herein by reference, describe an integration of multiple semiconductor devices on a die including n- and p-channel junction field-effect transistors with a lateral channel. These devices include an isolation trench surrounding the devices, etched to a lower semi-insulating gallium arsenide layer and backfilled with silicon nitride. The aforementioned devices, however, are configured with contacts on a top surface, which restricts their application from low voltage, high current systems wherein efficiency is an important design element.

Low on-resistance compound semiconductor field-effect transistors has been enhanced by the use of a layering structure called modulation doping as described in "Fundamentals of III-V Devices" by W. Liu (p. 323) and "Ultra-High Speed Modulation-Doped Field-Effect Transistors: A Tutorial Review," L. D. Nguyen, et al., Proceedings of the IEEE, Vol. 80, No. 4, pp. 494-518 (April 1992), which are incorporated herein by reference and are particularly applicable to devices with a lateral channel. The objective of modulation doping is to avoid electron scattering in the current conducting channel by ionized impurities due to dopants, which increases channel resistivity due to the decreased carrier mobility. Channel conductivity may be modulated by a separate control element such as a gate that controls channel depletion.

A structural layer of field-effect transistors such as a gallium arsenide field-effect transistor that contributes to its on-resistance is the substrate on which the device is formed. Substrate resistivity can be reduced by introducing dopants (e.g., silicon) at high concentration levels and by substantially thinning the wafer during device processing to improve the geometry of carrier flow.

Complete or partial removal of a substrate to separate the wafer into die during wafer processing has been described by M. Sickmiller in a paper entitled "Packaging of Ultrathin Semiconductor Devices Through the ELO Packaging Process," Material Research Society Symposium Proceedings, Vol. 681E, 2001, which is incorporated herein by reference. In this paper, Sickmiller describes etching deep trenches around bipolar transistors, bonding the etched wafer to a carrier, and then thinning the wafer to a depth that intersects the depth of the etched trenches. The result of this processing sequence mechanically isolates the devices, avoiding thereby a wafer-sawing step to form individual dice. The thinning process does not alter a device on-resistance. The thinning process thermally and electrically insulates the semiconductor substrate and couples the electronics more intimately with the heat sink. By performing the thinning process, one can reduce operating temperature and increase power density and interconnection speeds while minimizing electrical parasitics to the device and the package. The wafer thinning process described hereinbelow, which typically does not include a trench-etching step that encircles a die, does not result in a separated die as a consequence of an etching and thinning sequence.

A lateral device incorporating a strained channel can supply substantial advantages over devices formed using other technologies. A remaining challenge for a gallium-arsenide FET, however, is the need to further reduce device on-resistance as well as its thermal resistance. Considering the limitations as described above, a field-effect transistor design with a further reduction in on-resistance and thermal resistance would provide further enhancements for the more severe applications that lie ahead.

Accordingly, what is needed in the art is a gallium arsenide and other compound semiconductor devices configured for wide acceptance, particularly in low voltage and high current applications, formed with reduced device on-resistance and thermal resistance, overcoming many of the aforementioned limitations. In accordance therewith, a compact and efficient power supply, particularly for very low voltage and high current loads such as microprocessors, as well as amplifiers for telecommunications and other applications, would benefit from a robust field-effect transistor without incurring unnecessary costs or the need to commit a substantial portion of the physical volume of the end device to the volume of the power supply.

SUMMARY OF THE INVENTION

These and other problems are generally solved or circumvented, and technical advantages are generally achieved, by advantageous embodiments of the present invention, which includes a semiconductor device and method of forming the same. The semiconductor device includes an epitaxially grown and conductive buffer layer having a contact covering a substantial portion of a bottom surface thereof and a lateral channel above the buffer layer. The semiconductor device also includes another contact above the lateral channel and an interconnect that connects the lateral channel to the buffer layer, operable to provide a low resistance coupling between the contact and the lateral channel.

The foregoing has outlined rather broadly the features and technical advantages of the present invention in order that the detailed description of the invention that follows may be better understood. Additional features and advantages of the invention will be described hereinafter which form the subject of the claims of the invention. It should be appreciated by those skilled in the art that the conception and specific embodiment disclosed may be readily utilized as a basis for modifying or designing other structures or processes for carrying out the same purposes of the present invention. It should also be realized by those skilled in the art that such equivalent constructions do not depart from the spirit and scope of the invention as set forth in the appended claims.

BRIEF DESCRIPTION OF THE DRAWINGS

For a more complete understanding of the present invention, and the advantages thereof, reference is now made to the following descriptions taken in conjunction with the accompanying drawings, in which.

DETAILED DESCRIPTION OF ILLUSTRATIVE EMBODIMENTS

Figure 1:
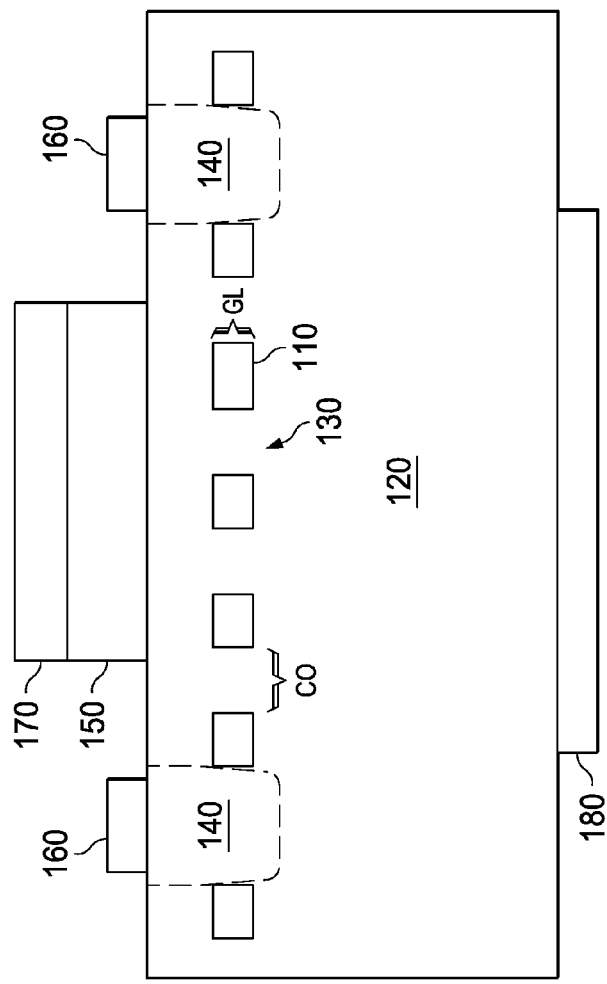
FIGS. 1, 2A and 2B illustrate cross-sectional views of field-effect transistors according to the prior art.
Figure 2A:
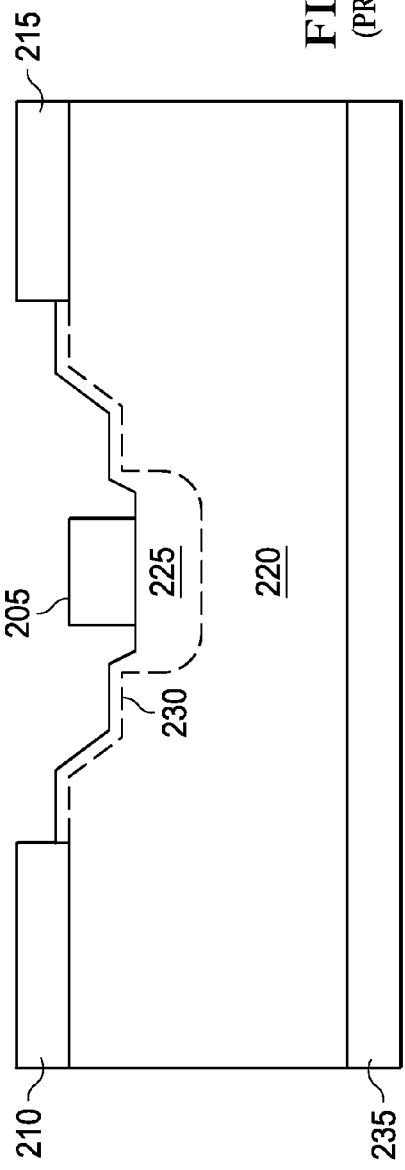
Figure 2B:
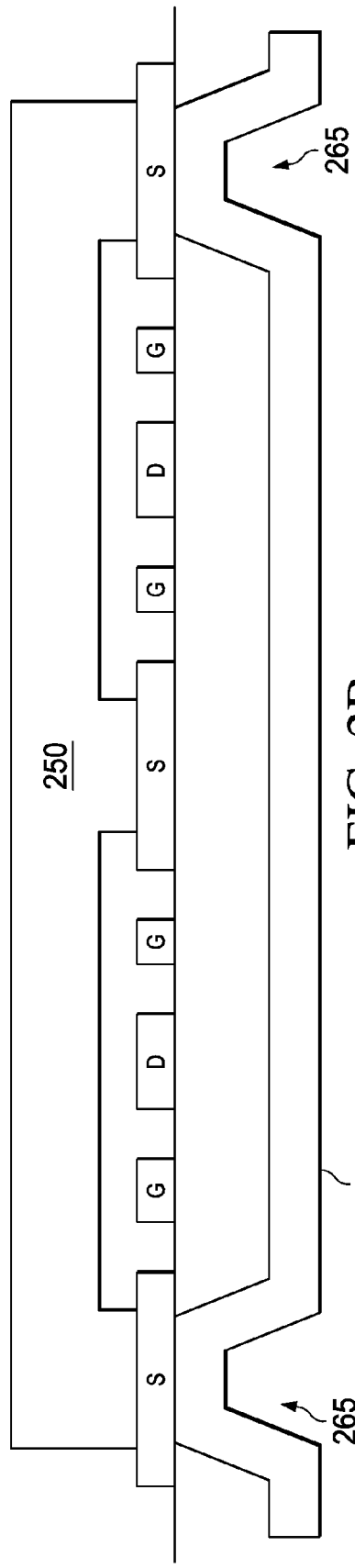

The making and using of the presently preferred embodiments are discussed in detail below. It should be appreciated, however, that the present invention provides many applicable inventive concepts that can be embodied in a wide variety of specific contexts. The specific embodiments discussed are merely illustrative of specific ways to make and use the invention, and do not limit the scope of the invention.

The present invention will be described with respect to exemplary embodiments in a specific context, namely, a semiconductor device and, more particularly, a lateral FET wherein a contact (e.g., a source contact) is formed directly on a buffer layer (e.g., a highly doped epitaxial buffer layer), which is an n+ epitaxial layer in the present exemplary embodiment. Another contact (e.g., a drain contact) of the lateral FET is coupled to an opposing surface of the device to provide a low on-resistance device with very fast switching transition times.

A modulation doping technique has been developed for lateral channels using, for instance, gallium arsenide as an undoped, narrower band gap channel and including an adjacent, doped, wider band gap layer of aluminum gallium arsenide, which provides an abundant and controllable source of free carriers to the gallium arsenide channel. Other combinations of compound semiconductors can be used such as an undoped indium gallium arsenide channel and an adjacent, doped aluminum gallium arsenide layer as the source of free carriers. Successful and repeatable applications of modulation doping, which is based on precision formation of a pseudomorphic layer, employs lateral channel arrangements that are not presently available in devices configured with vertical channels.

A field-effect transistor formed in a compound semiconductor device such as gallium arsenide with a lateral channel structure as described in U.S. Patent Application Publication No. 2006/0226478, entitled "Semiconductor Device Having a Lateral Channel and Contacts on Opposing Surfaces Thereof," to Brar, et al., filed Mar. 29, 2005, and U.S. Patent Application Publication No. 2007/0145417, entitled "High Voltage Semiconductor Device Having a Lateral Channel and Enhanced Gate-to-Drain Separation," to Brar, et al., filed Feb. 27, 2007, which are incorporated herein by reference, accommodates a careful doping profiling with an epitaxial layer design to produce a modulation-doped, lateral channel. The lateral, modulation-doped channel structure may be employed to substantially reduce the on-resistance of the device while preserving high switching speed. Further reduction of on-resistance of the device and its thermal resistance could advantageously provide enhancement in efficiency and other metrics such as power conversion density of an end product such as a power converter.

For examples of power supplies that provide an environment for the lateral FET, see U.S. Patent Application Publication No. 2005/0024179, entitled "Extended E Matrix Integrated Magnetics (MIM) Core," to Chandrasekaran, et al., published Feb. 3, 2005, U.S. Pat. No. 6,775,159, entitled "Switching Power Converter Circuits Providing Main and Auxiliary Output Voltages," to Webb, et al, issued Aug. 10, 2004, U.S. Pat. No. 6,549,436, entitled "Integrated Magnetic Converter Circuit and Method with Improved Filtering," to Sun, issued Apr. 15, 2003, U.S. Pat. No. 7,046,523, entitled "Core Structure and Interleaved DC-DC Converter Topology," to Sun, et al., issued May 16, 2006, U.S. Pat. No. 7,012,414, entitled "Vertically Packaged Switched-Mode Power Converter," to Mehrotra, et al., issued Mar. 14, 2006, U.S. Patent Application Publication No. 2006/0187684, entitled "Power Converter Employing Integrated Magnetics with a Current Multiplier Rectifier and Method of Operating the Same," to Chandrasekaran, et al., published Aug. 24, 2006, and U.S. Pat. No. 7,176,662, entitled "Power Converter Employing a Tapped Inductor and Integrated Magnetics and Method of Operating the Same," to Chandrasekaran, issued Feb. 13, 2007, all of which are incorporated herein by reference.

A structural layer of a gallium arsenide field-effect transistor that contributes to its on-resistance is the substrate on which the device is formed. Substrate resistivity can be reduced by introducing dopants (e.g., silicon) at high concentration levels and by substantially thinning the wafer during device processing to improve the geometry of carrier flow. The substrate doping levels, however, are limited by segregation of dopants during formation of the gallium arsenide boule from which the wafer is sawn, particularly at high doping concentrations. Increasing silicon doping levels beyond, for instance, a density of $5 \times 10^{-18}$ cm$^3$ can be very challenging, especially due to the need to control the doping level over the entire distance between the seed and tail of the semiconductor ingot during its production. Usually substrates are specified with a large process window for substrate resistivity (such as $0.8 \times 10^{-3}$ to $5 \times 10^{-3}$ ohm·cm) to maintain high wafer yield, which is important for low wafer cost. However, such process windows are often inadequate to control end device properties such as on-resistance of a production FET. Substrates with high or even moderate doping levels cost substantially more than semi-insulating (e.g., undoped) substrates, which is a further significant disadvantage for their use.

Compound semiconductor wafers can be thinned by a grinding process to about 75-μm, where 25 μm is a particularly challenging thinning level for state-of-the-art wafer processing, and is ordinarily not optimized to manage wafer yields and cost. Substantially thinned wafers with high substrate doping concentrations result in lower device operating temperatures and reduced on-resistance that contribute to reductions in package size and cost, which in turn increase device reliability. Nonetheless, even with substantial thinning, the presence of a substrate with a thickness that might be in the range of 75-25 μm still has significant contribution to device on-resistance and device operating temperature.

A further disadvantage incurred by the substrate, particularly a gallium-arsenide substrate, is its poor thermal conductivity. Substrate thermal conductivity directly affects device operating temperature, which results in an increase in on-resistance as device temperature increases, with adverse effects on package size and device reliability. The thermal conductivity of a gallium arsenide substrate is substantially poorer than that of its silicon counterpart (e.g., 55 verses 130 W/m·K), which provides further motivation for its thinning or removal altogether. As described above, wafer thinning to about 75 μm can be performed using standard practices, and thinning to about 25 μm can be performed in some existing production facilities with state-of-the-art processes with corresponding increases in wafer cost. Nonetheless, the remaining resistance of the substrate after thinning still provides a significant contribution to the on-resistance of the device.

During the ordinary manufacturing steps to form a lateral FET, the process starts with a substrate, which is generally highly doped to reduce the on-resistance of the end device. During the processing steps for the lateral FET as described below, the substrate is removed before completion of device processing to allow a metallic contact to be formed directly on an internal, highly doped epitaxial buffer layer, thereby avoiding the resistance of the substrate that would otherwise include a layer interposed in the series flow of charged carriers if not removed. Removal of the substrate during device processing accommodates use of a semi-insulating substrate with the attendant reduced cost compared to the cost of a low resistance substrate with a high doping level. This also permits the use of GaAs on Si wafers.

In an exemplary embodiment, the lateral FET includes a plurality of lateral channels, among other things, to further reduce an on-resistance thereof. The principles of the present invention may be applied to a compound semiconductor FET with a single modulation-doped lateral channel and other semiconductor devices that include current-carrying channels including modulation-doped lateral channels and switched terminals on opposing surfaces thereof. Thus, the principles of the present invention apply to semiconductor devices having single or multiple lateral channels and contacts on opposing surfaces thereof. The principles of the present invention may also be applied to a compound semiconductor FET including a diode such as a Schottky diode formed in parallel with drain-source contacts of the device. For examples of related semiconductor devices, U.S. Patent Application Publication No. 2007/0045765, entitled "Semiconductor Device Having Substrate-Driven Field-Effect Transistor and Schottky Diode and Method of Forming the Same," to Brar, et al., filed Aug. 25, 2005, and U.S. Patent Application Publication No. 2007/0069286, entitled "Semiconductor Device Having an Interconnect with Sloped Walls and Method of Forming the Same," to Brar, et al., filed Sep. 27, 2005, which are incorporated herein by reference.

The inclusion of multiple lateral channels in a semiconductor device recognizes the limited improvement in on-resistance that can be obtained by simply increasing the thickness of a single lateral channel. Carriers in the lateral channel flow near the channel edges due to highly localized electric field distributions within the lateral channel, and this limits an improvement of the device on-resistance as the lateral channel is made thicker. A single thicker lateral channel made of material with a different lattice constant from a substrate exhibits more numerous atomic dislocations in the crystal lattice, which degrades the carrier mobility and device break down characteristics. A further benefit of multiple lateral channels is an increase in transconductance of the semiconductor device for a given device area. Improvements in the device on-resistance and transconductance for presently available semiconductor devices ordinarily comes at the expense of greater die area, which has a direct effect on the cost and yield of the semiconductor device. By incorporating multiple channels into the semiconductor device constructed according to the principles of the present invention, the semiconductor device can achieve improvements in on-resistance and transconductance over a device with a single channel without the limitations as discussed above.

Exemplary characteristics and advantages associated with the use of selected embodiments of the lateral FET according to the principles of the present invention are set forth below. The lateral FET may be capable of switching transition times on the order of nanoseconds, rather than switching transition times on the order of 35 to 50 nanoseconds realizable with the present silicon-based technology. The lateral FET may exhibit peak inverse voltage ratings such as 10 to 20 volts or less and should have low on-resistance including the parasitic electrical resistance from the device packaging approaching one milliohm or less. In addition, the lateral FET desirably has gates that can be driven with digital logic, with low gate charge and correspondingly low and controllable field-effect transistor threshold voltage. The lateral FET also desirably has current ratings of at least a dozen amperes, and should be cost competitive with presently available field-effect transistors having similar power ratings implemented in silicon-based technology. The lateral FET also desirably includes an intrinsic body diode that is capable of conducting substantially the full rated device current when the FET is turned off.

Additionally, the lateral FET having source and drain contacts on opposing sides of the die facilitates low resistance and inductance packaging by providing more area for contacts. The lateral FET may also operate as an enhancement-mode device that implies a normally-off device when a gate voltage is substantially zero volts to avoid short circuits during power supply start-up. The presence of an intrinsic body diode such as a Schottky diode with the anode coupled to a source interconnect and source contact can also provide substantial benefits in circuit design as well as cost reduction, particularly in power supply applications.

In the drawings, boundaries may be shown as lines to separate semiconductor regions or layers with apparent abrupt changes in doping levels or species. It is recognized that semiconductor manufacturing processes such as implantation and diffusion may cause doping concentrations and atomic species to vary in a continuous and sometimes gradual manner across a semiconductor device. Consequently, graded boundaries of device regions may be shown as lines in the drawings for explanatory purposes without compromising an understanding of the structure of the devices.

Many steps conventionally used to process a gallium arsenide (also referred to as "GaAs") die or wafer and other compound semiconductors as described herein are well known in the art, and, in the interest of brevity, will not be described in detail. The basic steps include, for example, molecular-beam epitaxy, metal-organic chemical vapor deposition, patterning, exposing, etching, vacuum depositing, plating, doping, alloying, annealing, and cleaning. For reference purposes, R. Williams describes many conventional processes for constructing a gallium arsenide device in "Modern GaAs Processing Methods." Additionally, several separate processing steps may be generally combined into a single step within the scope of the present invention, such as a combined annealing step wherein a number of alloys that are separately deposited are heated together to jointly activate the alloys. Further, alternative methods to perform a processing step such as vacuum deposition, sputtering, or plating processes may be combined or performed separately without further elaboration herein. Also, while selected doping levels and characteristics such as thickness of layers that make up an exemplary lateral FET will hereinafter be provided, those skilled in the art understand that alternative doping levels and characteristics may be provided and still be within the broad scope of the present invention. For instance and in the appropriate circumstances, the layers may be oppositely doped, such as a p-type layer may be replaced with an n-type layer.

The on-resistance of a lateral FET includes the sum of several resistance components such as a contact resistance of an ohmic contact to a drain, a sheet resistance of epitaxial layers, a resistivity of a channel under a gate, a resistivity of a structure at the bottom of a source trench, a substrate resistance, and a resistance of a metallic source contact. For a typical FET, substrate resistance of a practical device can be expected to contribute approximately 20 to 30% of the total on-resistance of the device.

Figure 3:
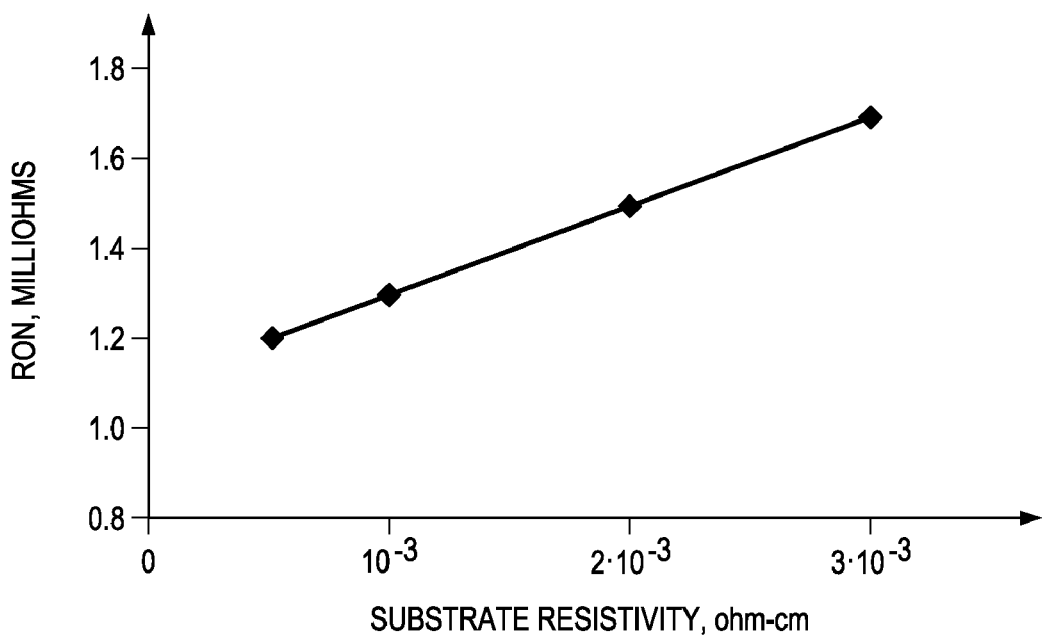
FIGS. 3 and 4 illustrate graphs of on-resistance of a semiconductor device as a function of substrate resistivity and substrate thickness, respectively.
Figure 4:
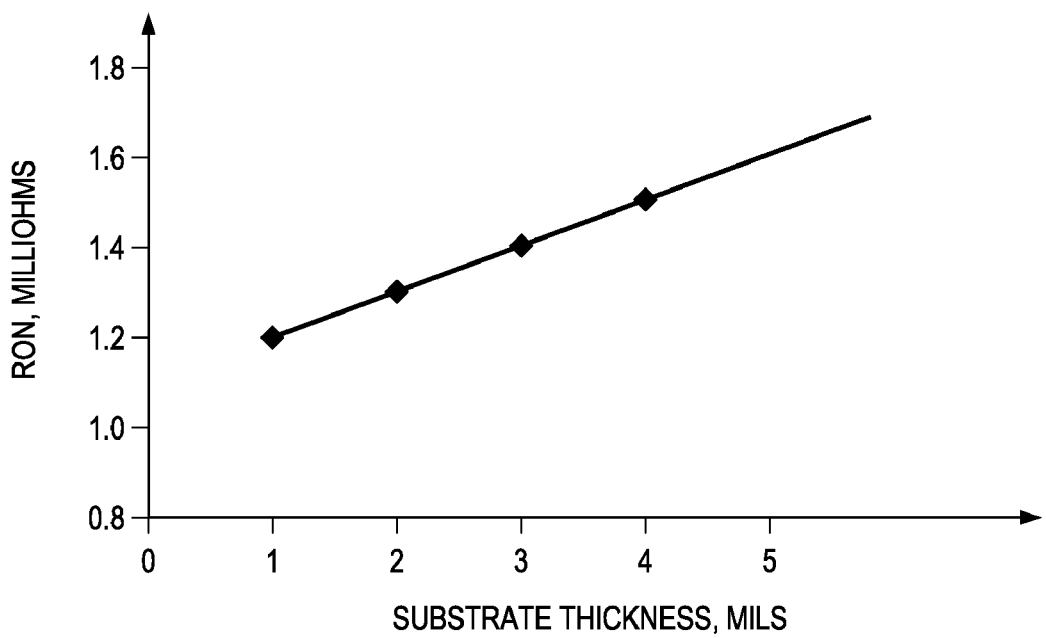

Referring now to FIGS. 3 and 4, illustrated are graphs of on-resistance of a semiconductor device as a function of substrate resistivity and substrate thickness, respectively.

FIG. 3 illustrates an exemplary graph showing an on-resistance of a gallium arsenide FET verses substrate resistivity. The graph is constructed assuming a nominal substrate thickness of $1 \times 10^{-2}$ cm (100 μm~4 mils) and clearly shows the advantages of providing low substrate resistivity for the on-resistance Ron of the gallium arsenide FET. FIG. 4 is a corresponding graph illustrating the effect of decreasing substrate thickness for the on-resistance of the device. The graph in FIG. 4 was constructed assuming a nominal substrate resistivity of $2 \times 10^{-3}$ ohm-cm. From this graph, the importance of a thin substrate for low on-resistance is apparent, as well as the potential effect of eliminating the substrate entirely, as described below.

Referring now to FIGS. 5 to 30, illustrated are cross-sectional views of an embodiment of constructing a semiconductor device (e.g., lateral FET) according to the principles of the present invention. Beginning with FIG. 5, the lateral FET is formed on a substrate (e.g., GaAs substrate) 301. The substrate 301 is preferably semi-insulating for low cost since it will be removed during a later processing step. Optionally, the substrate 301 may be a doped (e.g., n-type doped) conductive layer (e.g., a conductive substrate). The substrate 301 may be chosen to be sufficiently thick such as 650 μm to provide mechanical and chemical support for semiconductor processing and handling, and may be supported by a further underlying medium.

If the substrate 301 is optionally doped, a preferred n-type doping material for GaAs is silicon ("Si"), but selenium ("Se"), tellurium ("Te") or other doping materials or combinations thereof may be employed within the broad scope of the present invention. Although the lateral FET described herein is GaAs based, alternative semiconductor materials may be employed to form the substrate 301 such as a semiconductor material based on indium-phosphide ("InP") as well as oppositely doped semiconductors with essential properties of related materials appropriately altered.

Figure 5:
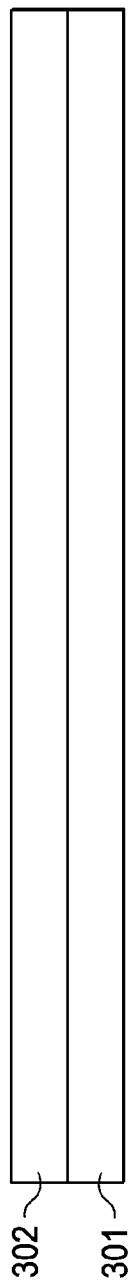
FIGS. 5 to 30 illustrate cross-sectional views of an embodiment of constructing a semiconductor device according to the principles of the present invention.

As further illustrated in FIG. 5, a first epitaxial buffer layer 302 (e.g., an n+ epitaxial buffer layer) is optionally deposited above the substrate 301. The first epitaxial buffer layer 302 is preferably grown by molecular beam epitaxy or metal-organic chemical-vapor deposition to a preferred thickness of about 3000 angstroms ("Å"). A suitable n-type doping material such as Si may be employed, but alternatively Se, Te or other n-type dopant or combinations thereof may be employed in the epitaxial growth process. A preferred doping density is in the range of $7 \times 10^{17}$ to $5 \times 10^{18}$ cm$^{-3}$. The addition of the first epitaxial buffer layer 302 generally provides a more uniform crystal structure for further epitaxial depositions than an ordinary, doped or undoped GaAs substrate 301, and thus is optionally included for the formation of the above layers for improved device characteristics.

Figure 6:
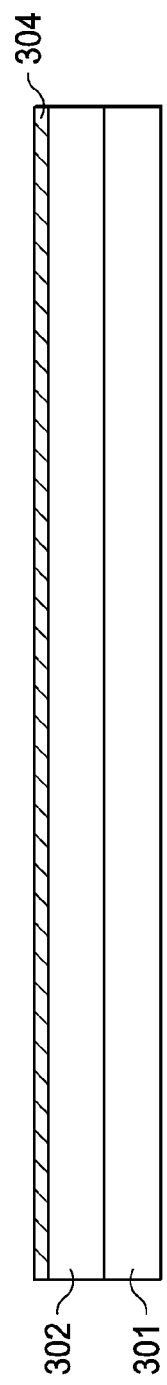

Referring now to FIG. 6, illustrated is a first etch stop layer 304 deposited above the first epitaxial buffer layer 302. The first etch stop layer 304 embodied in a thin aluminum-arsenide ("AlAs"), aluminum-gallium-arsenide ("AlGaAs"), indium-phosphide ("InP"), or indium-gallium-phosphide ("InGaP") epitaxial deposition is formed above the first epitaxial buffer layer 302. Chemical-vapor deposition or other vacuum deposition process such as molecular beam epitaxy can be used for formation of the first etch stop layer 304, using techniques well known in the art. When an aluminum-gallium-arsenide deposition is used for the first etch stop layer 304, a relatively higher concentration of aluminum (with respect to gallium) is typically used to provide a more robust etch stop layer for a subsequent etching process. The first etch stop layer 304 provides an etch stop for substantially complete removal of the substrate 301 and the first epitaxial buffer layer 302 in a later processing step. The first etch stop layer 304 is preferably about 25 to 500 Å thick, and can be optionally doped n-type with a doping level approximately in the range of $1 \times 10^{17}$ to $5 \times 10^{18}$ cm$^{-3}$, or left undoped.

In an alternative embodiment, the first etch stop layer 304 may be deposited as an intermediary layer within a second epitaxial buffer layer described below with reference to FIG. 7, et seq. In such alternative embodiment, a portion of the second epitaxial buffer layer is epitaxially deposited directly above the substrate 301, then the first etch stop layer 304 is deposited, followed by completion of deposition of the second epitaxial buffer layer.

Figure 7:
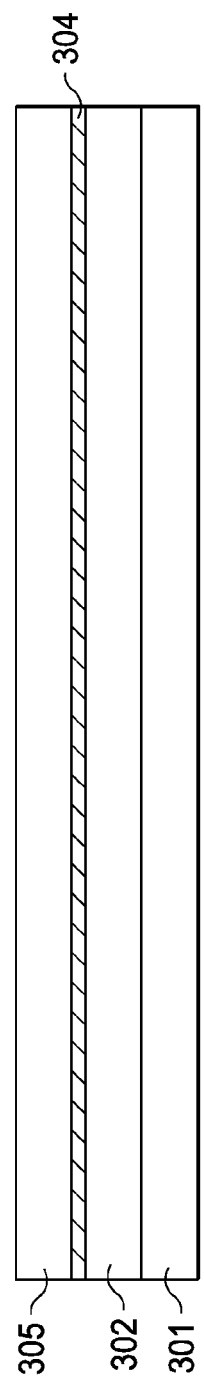

Turning now to FIG. 7, above the first etch stop layer 304 is a second epitaxial buffer layer (e.g., an n+ epitaxial buffer layer) 305 that is preferably grown by molecular beam epitaxy or metal-organic chemical-vapor deposition to a thickness of about 3000 angstroms ("Å"). In an alternative embodiment (see, e.g., FIG. 24 and the related description), an initial portion of the second epitaxial buffer layer 305 may be deposited directly onto the substrate 301. A suitable n-type doping material such as Si may be employed, but alternatively Se, Te or other n-type dopant or combinations thereof may be employed in the epitaxial growth process. A preferred doping density is in the range of $7 \times 10^{17}$ to $5 \times 10^{18}$ cm$^{-3}$. The addition of the second epitaxial buffer layer 305 generally provides a more uniform crystal structure for further epitaxial depositions than an ordinary, doped GaAs substrate 301, and thus may be optionally included for the formation of the above layers for improved device characteristics. A preferred thickness for the second epitaxial buffer layer 305 is 3000 Å, but a thicker layer may be grown to provide increased rigidity of the die after a later thinning step described below regarding removal of the substrate 301. The added device on-resistance of the device as a result of making the second epitaxial buffer layer 305 thicker is not significant.

Figure 8:
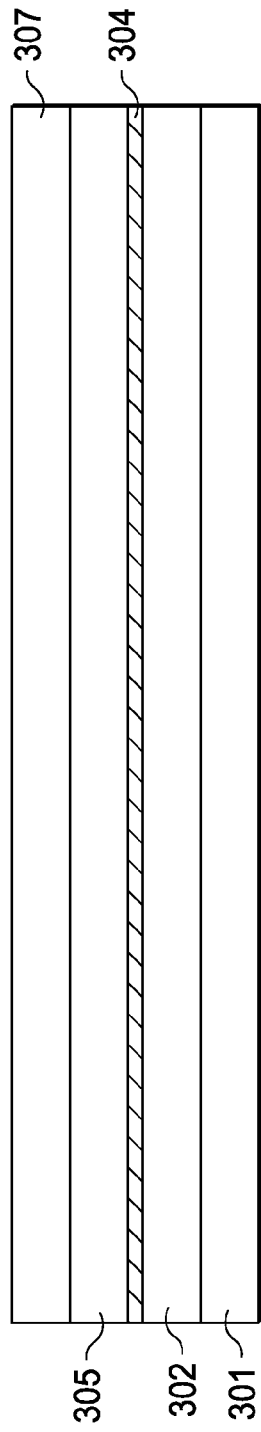
Figure 9:
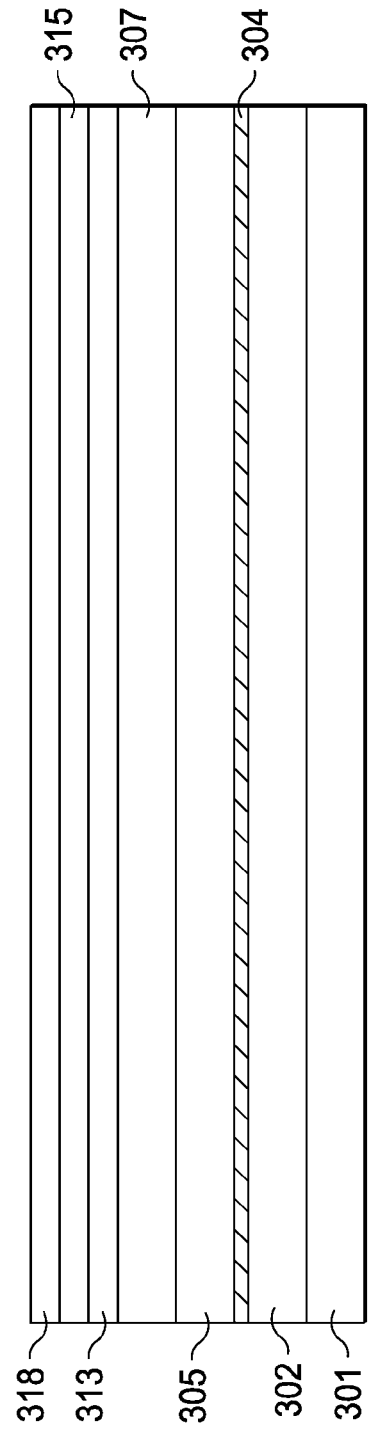

Turning now to FIGS. 8 and 9, above the second epitaxial buffer layer 305 is an isolation layer (e.g., a p-type doped isolation layer) 307 that is epitaxially grown and formed sufficiently thin to prevent substantial recombination of minority carriers that might be injected therein during certain modes of operation of the lateral FET. A preferred thickness of the isolation layer 307 is approximately 1000 Å and a preferred dopant is carbon with a doping density between about $5 \times 10^{18}$ cm$^{-3}$ to $5 \times 10^{19}$ cm$^{-3}$. A thickness of the isolation layer 307, however, can range from about 300 Å to 2000 Å and beyond, and may be deposited with a doping density roughly inversely proportional to the thickness.

The isolation layer 307 forms a pair of back-to-back diodes with n-type doped layers to be formed thereabove and the second epitaxial buffer layer 305 to substantially block current flow when the lateral FET is in a non-conducting state, particularly when a positive voltage is applied between the drain and source contacts thereof. The design parameters for the layers above the isolation layer 307 elicit engineering trade-offs and should be chosen to preserve a lifetime of the minority carriers (i.e., electrons) injected therein so that the minority carriers diffuse through the lateral FET with sufficiently limited recombination. Additionally, the above-referenced layers should be designed to provide a high degree of conductivity for the lateral FET, limit a breakdown voltage, and limit the internal fields when the layer(s) above the isolation layer 307 act as the cathode for the back-to-back diodes, thereby providing reverse voltage blocking capability. Also, the layers above the isolation layer 307 of the lateral FET should be provided to enhance a performance thereof such as sustaining a high drain-to-source voltage (e.g., 20 volts) when the lateral FET is in a non-conducting state and to provide support for lateral channels formed thereover.

A first spacer layer 313 is a thick, but lightly doped p-type GaAs layer that is epitaxially deposited at about 10000 Å and preferably lightly doped to about $1 \times 10^{15}$ cm$^{-3}$ above the isolation layer 307. The thickness of the first spacer layer 313 may be increased and its doping density decreased to provide a higher breakdown voltage for the lateral FET. The first spacer layer 313 limits an internal electric field within the lateral FET and helps to limit breakdown when the lateral FET is transitioned to a non-conducting state. As a result, an applied voltage is substantially blocked between the source and drain terminals thereof. The first spacer layer 313 is lightly doped and sufficiently thick, such as 5000 Å to 25000 Å, to provide a sufficiently high voltage blocking capability for the lateral FET. Different layer thickness ranging from 5000 Å to 25000 Å and doping levels such as $1 \times 10^{15}$ cm$^{-3}$ to $5 \times 10^{16}$ cm$^{-3}$ may be used depending on, for example, the appropriate level of voltage blocking necessary for the lateral FET. An undoped layer or a lightly doped n-type layer can also be used in place of the lightly doped p-type layer.

A super lattice buffer layer 315 located above the first spacer layer 313 is an alternating aluminum-gallium arsenide/gallium arsenide ("AlGaAs/GaAs") super lattice buffer that is sequentially deposited epitaxially to improve the smoothness of the surface of the crystal and to increase the mobility of the electrons in the channel to be formed thereabove. The presence of aluminum may also act as a "getter" to capture and disable oxygen atoms that may otherwise be present in the subsequent growth. The super lattice buffer layer 315 is deposited preferably with ten alternating layers of AlGaAs (0.24 Al), preferably about 185 Å thick, and GaAs, preferably about 15 Å thick. The total thickness of the super lattice buffer layer 315 is approximately 2000 Å.

A first barrier layer 318 located above the super lattice buffer layer 315 is an aluminum-gallium arsenide-phosphide AlGaAsP (0.24 Al and 0.05 P) bottom barrier/spacer that is epitaxially deposited at approximately 1000 Å to substantially block free carriers from flowing down to the layers therebelow. An n-pulse doping with Si ("delta doped"), preferably to a doping level of about $4 \times 10^{12}$ cm$^{-2}$, is thereafter performed thereon to supply the free carriers to the channel thereabove by the mechanism of modulation doping. The isolation layer 307, therefore, lies between n-type doped layers, thereby forming the back-to-back diodes that provide an isolation capability for the lateral FET. During transient conditions lasting perhaps a nanosecond when the lateral FET is transitioned to a non-conducting state, however, a cloud of free electrons positioned above the isolation layer 307 is not able to substantially recombine therein. The effect is to enable a brief period of conduction in the parasitic npn transistor wherein the n-type doped layer above forms the emitter, the p-type doped layers form the base, and the n-type doped layer below forms the collector. The resulting parasitic transistor is able to shunt current between the source and the drain during transient conditions when, for instance, the lateral FET is transitioned to a non-conducting state. When the overlying electron gas is dissipated after brief transient conditions, the parasitic transistor transitions to a non-conducting state.

Figure 10:
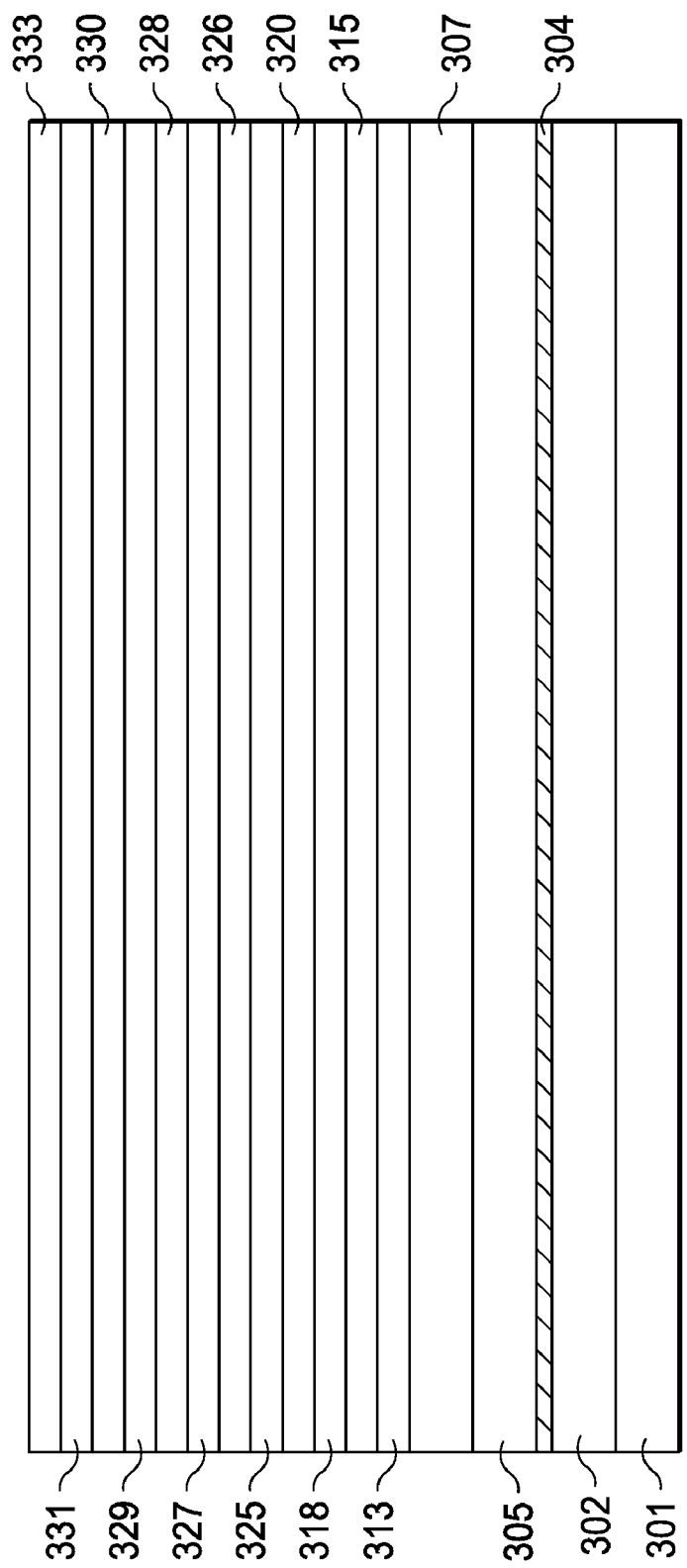

Turning now to FIG. 10, a second spacer layer 320 [e.g., a substantially undoped AlGaAsP (0.24 Al and 0.05 P) spacer] is then epitaxially deposited at approximately 40 Å above the first barrier layer 318 to separate the effects of dopants from the channel, thereby separating the free carriers from the ionized sites and improving electron mobility therein. Above the second spacer layer 320 is a thin, indium-gallium arsenide ("InGaAs") layer that is epitaxially deposited with about 20% indium to form a first lateral channel 325 with controllable conductivity. Due to the substantial lattice mismatch between GaAs and InGaAs, the first lateral channel 325 is inherently lattice-strained (i.e., it is "pseudomorphic," and the resulting device is referred to as a pseudomorphic high-electron-mobility transistor, or a "pHEMT") and is preferably less than about 100 Å to prevent lattice dislocations and formation of polycrystalline structure in the layers to be deposited thereabove. The lattice-strained channel provides higher carrier mobility owing to a reduced effective mass of the carriers. The first lateral channel 325 provides the controllable conduction mechanism between the source and drain of the lateral FET and provides a modulation-doped channel with reduced crystalline irregularities for free carriers supplied by adjacent pulsed doped layers.

A third spacer layer 326 [e.g., a substantially undoped AlGaAsP (0.24 Al and 0.05 P) spacer] is then epitaxially deposited at approximately 40 Å above the first lateral channel 325 to separate the effects of dopants from the channel, thereby separating the free carriers from the ionized sites and improving the electron mobility therein. An n-pulse doping with Si ("delta doped"), preferably to a level of about $4 \times 10^{12}$ cm$^{-2}$, is thereafter performed thereon to supply free carriers to the first lateral channel 325 below and to a second lateral channel to be deposited thereabove by the mechanism of modulation doping. A fourth spacer layer 327 [e.g., a substantially undoped AlGaAsP (0.24 Al and 0.05 P) spacer] is then epitaxially deposited at approximately 40 Å above the third spacer layer 326 to separate the effects of dopants from a second lateral channel to be deposited thereabove, again separating free carriers from the ionized sites and improving electron mobility of a second lateral channel.

Above the fourth spacer layer 327 is a second, thin, indium-gallium arsenide ("InGaAs") layer that is epitaxially deposited with about 20% indium to form a second lateral channel 328 with controllable conductivity. Again, due to the substantial lattice mismatch between GaAs and InGaAs, the second lateral channel 328 is inherently lattice-strained and is preferably less than about 100 Å to prevent lattice dislocations and formation of polycrystalline structure in the layers to be deposited thereabove.

A fifth spacer layer 329 [e.g., a substantially undoped AlGaAsP (0.24 Al and 0.05 P) spacer] is then epitaxially deposited at approximately 40 Å above the second lateral channel 328 to separate the effects of dopants from the second lateral channel 328 as described hereinabove. An n-pulse doping with Si ("delta doped"), preferably to a level of about $4 \times 10^{12}$ cm$^{-2}$, is thereafter performed thereon to supply free carriers to the second lateral channel 328 and to a third lateral channel to be deposited thereabove by the mechanism of modulation doping. A sixth spacer layer 330 [e.g., a substantially undoped AlGaAsP (0.24 Al and 0.05 P) spacer] is then epitaxially deposited at approximately 40 Å above the fifth spacer layer 329 to separate the effects of dopants from a third lateral channel above, thereby separating free carriers from the ionized sites and improving electron mobility of a third lateral channel.

Above the sixth spacer layer 330 is a third, thin, indium-gallium arsenide ("InGaAs") layer that is epitaxially deposited with about 20% indium to form a third lateral channel 331 with controllable conductivity. Again, due to the substantial lattice mismatch between GaAs and InGaAs, the third lateral channel 331 is inherently lattice-strained and is preferably less than about 100 Å to reduce lattice dislocations and formation of polycrystalline structure in the layers to be deposited thereabove.

Above the third lateral channel 331 is another region (see below) that is epitaxially deposited including sub-layers of AlGaAsP (0.24 Al and 0.05 P) to provide additional free carriers (electrons) for modulation doping of the third lateral channel 331, and to provide a barrier for the free carriers in the third lateral channel 331. A seventh spacer layer 333 is undoped and deposited at about 40 Å to provide a spacer layer separating the free carriers in the third lateral channel 331 from ionized impurity sites. An n-pulse doping with Si ("delta doped"), preferably to a level of about $4 \times 10^{12}$ cm$^{-2}$, is performed on the seventh spacer layer 333 to induce additional free electrons with enhanced mobility that migrate across the seventh spacer layer 333 to the third lateral channel 331.

The inclusion of phosphorus in the spacer layers mentioned above provides a mechanism to at least partially compensate for the mismatch of the lattice constant for the lateral channels. For example, the lattice constant for InAs is 6.0584 Å, which indicates that the inclusion of indium in the lateral channels increases the lattice constant thereof. In comparison, the lattice constant for GaAs, which forms the foundation of the lateral FET, is 5.6533 Å. The lattice constant for GaP is smaller (5.4512 Å) than that for GaAs and, as such, indicates that the inclusion of phosphorus in the spacer layers produces an opposite component of strain on the crystal thereby providing the compensation for the longer atomic spacing in the lateral channels resulting from the inclusion of indium atoms therein. In addition, the inclusion of phosphorus improves carrier confinement in the lateral channels due to its wider bandgap energy as opposed to, for instance, AlGaAs with the same aluminum composition. The strain balancing can be achieved by one of the following, namely, adjusting an indium composition in the lateral channels or a thickness thereof, and adjusting the phosphorous composition in the spacer layers or a thickness thereof. This will change the localized strain in the lateral channels and will change the carrier mobility. It also changes the height of the spacer layers and the aforementioned parameters may be adjusted to improve device performance. Thus, modulation doping is preferably achieved by separating the channel-conduction carriers from the carrier-contributing donor atoms located in the Si-pulsed areas. Carrier mobility in the first, second and third lateral channels 325, 328, 331 is thereby improved by providing a conductive path substantially undisturbed by lattice imperfections that would otherwise be affected by in-channel dopants.

Although the semiconductor device as described herein includes three lateral channels, semiconductor devices with one or more lateral channels are well within the broad scope of the present invention. When modifying the number of lateral channels, attention should be given to the concentration of phosphorous in the spacer layers, which relaxes the strain from the indium as described above. The inclusion of a plurality lateral channels improves the on-resistance of a semiconductor device designed with a given die area, almost in proportion to the number of lateral channels. In addition, the breakdown voltage of the semiconductor device may be increased by the inclusion of the multiple lateral channels due to reduced localized electric field distribution around the edges thereof.

Figure 11:
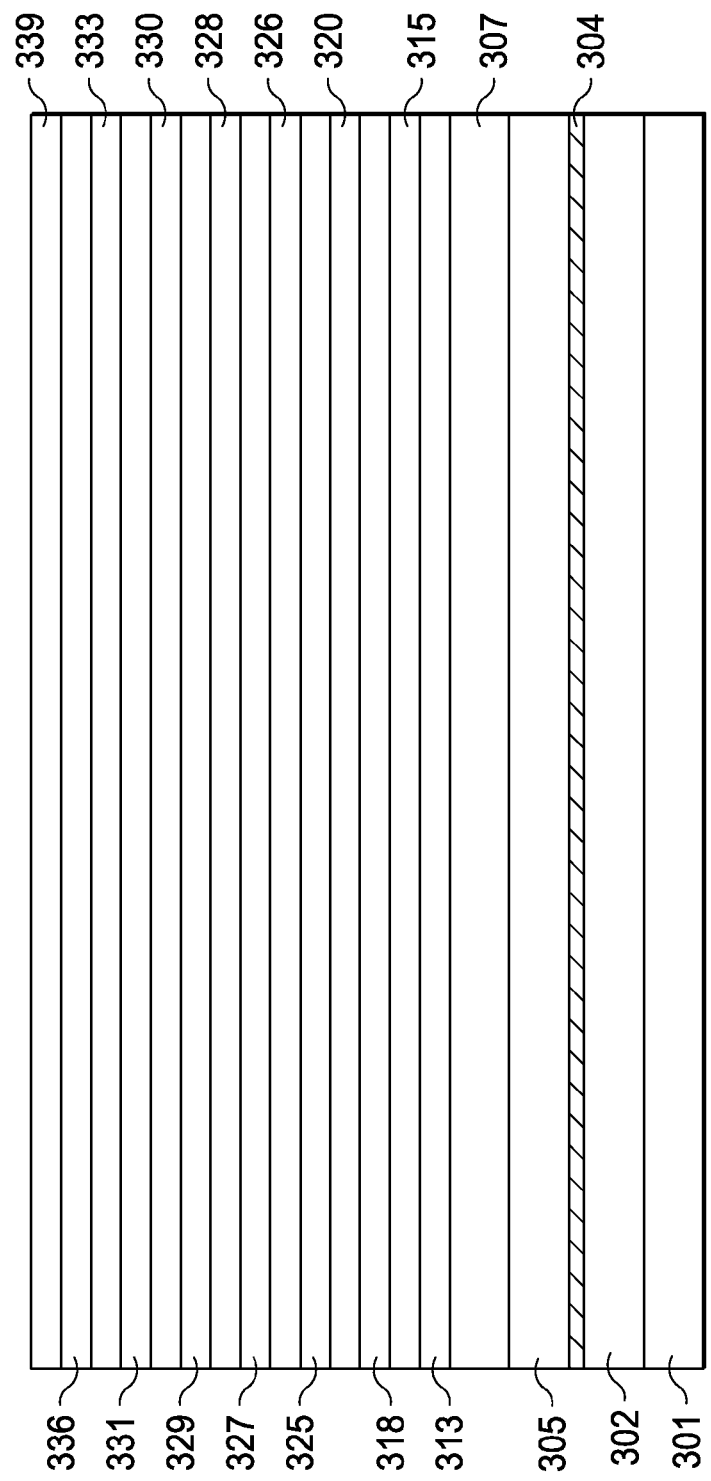

Turning now to FIG. 11, a second barrier layer 336 (embodied in an undoped AlGaAs layer) is then epitaxially deposited at about 210 Å with an n-doping level in the range of $1 \times 10^{17}$ to $5 \times 10^{17}$ cm$^{-3}$ or undoped. A recess layer 339 of GaAs is then epitaxially deposited, preferably at about 230 Å and Si-doped with a doping level in the range of $1 \times 10^{17}$ to $5 \times 10^{17}$ or undoped.

Figure 12:
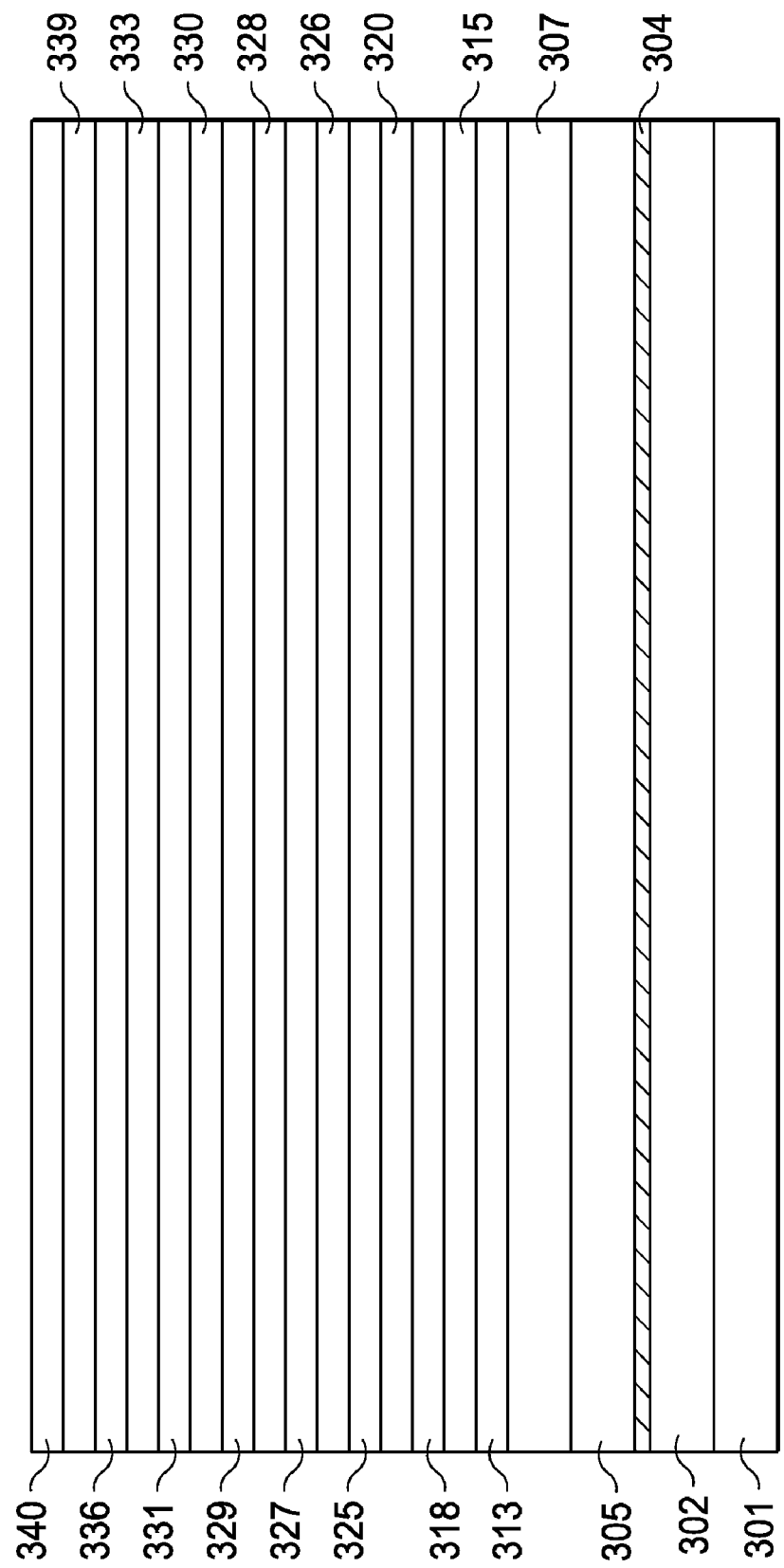

Turning now to FIG. 12, a second etch stop layer 340 embodied in a thin aluminum-arsenide ("AlAs"), indium-phosphide ("InP"), or indium-gallium-phosphide ("InGaP") epitaxial deposition is formed above the recess layer 339. The second etch stop layer 340 provides an etch stop for a later, trench-forming process for GaAs layers to be further deposited and doped thereabove. The second etch stop layer 340 is preferably about 25 Å thick and can be doped n-type with a doping level in the range of $1 \times 10^{17}$ to $5 \times 10^{18}$ cm$^{-3}$ or undoped.

Figure 13:
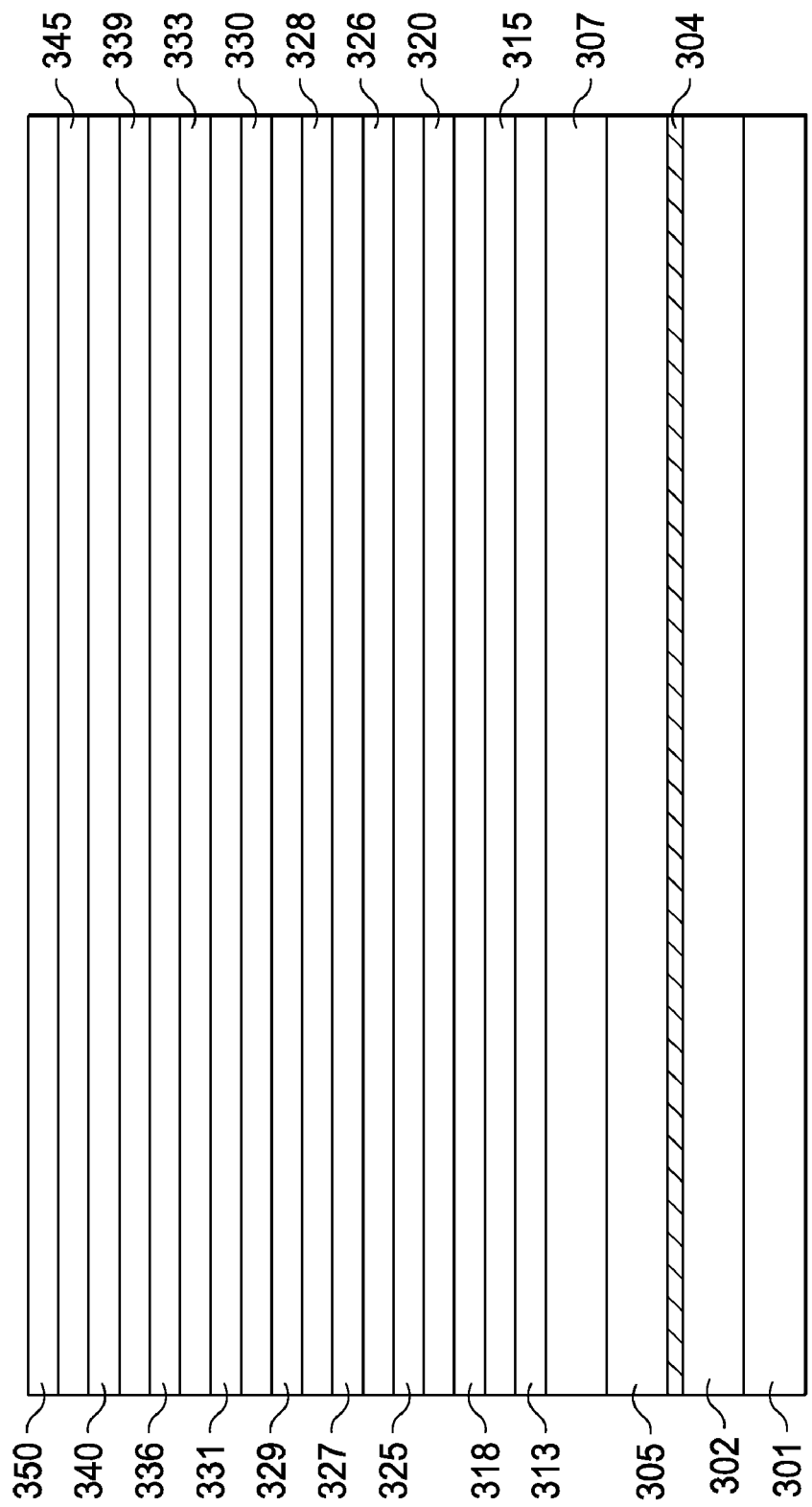
Figure 14:
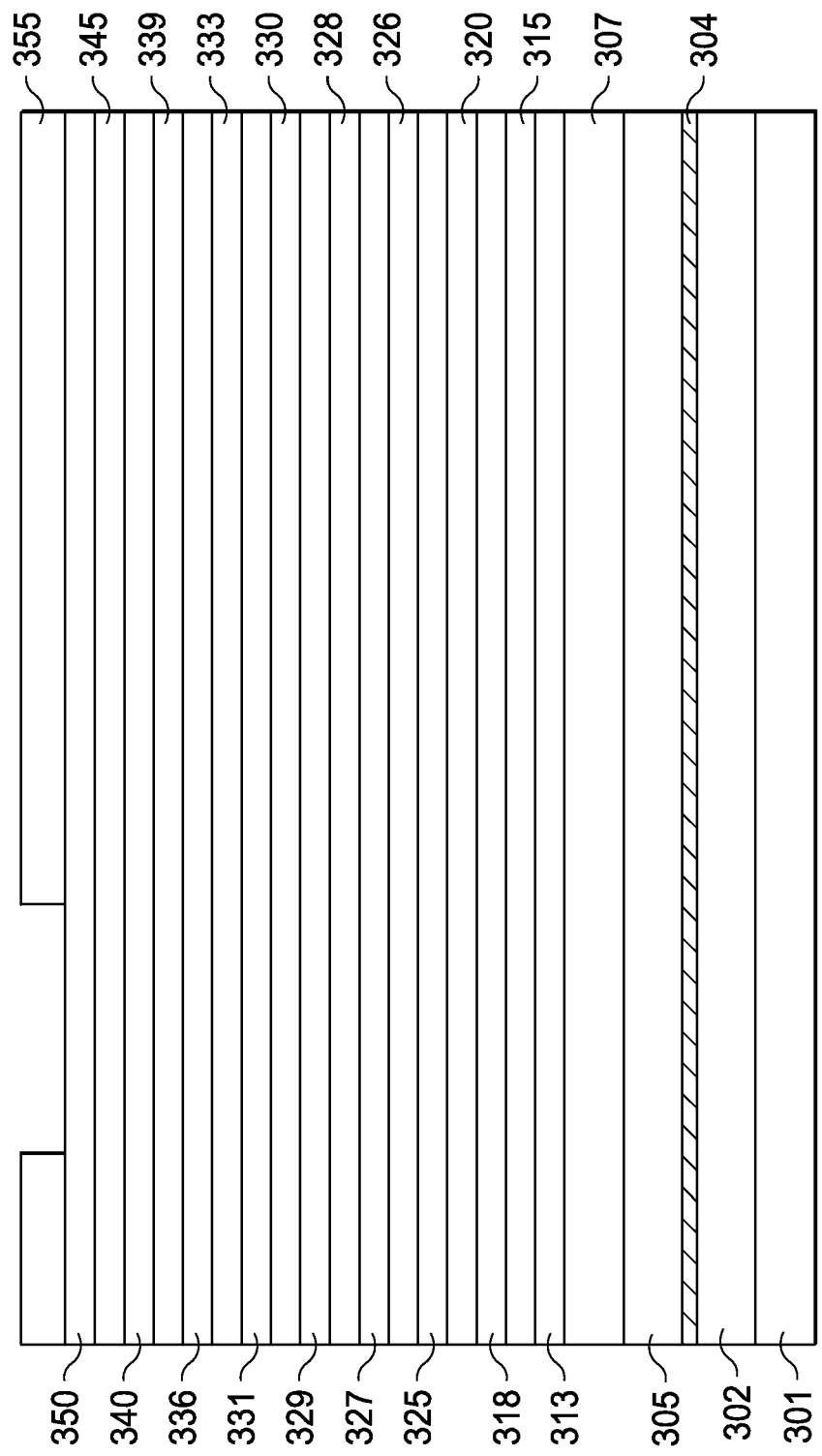
Figure 15:
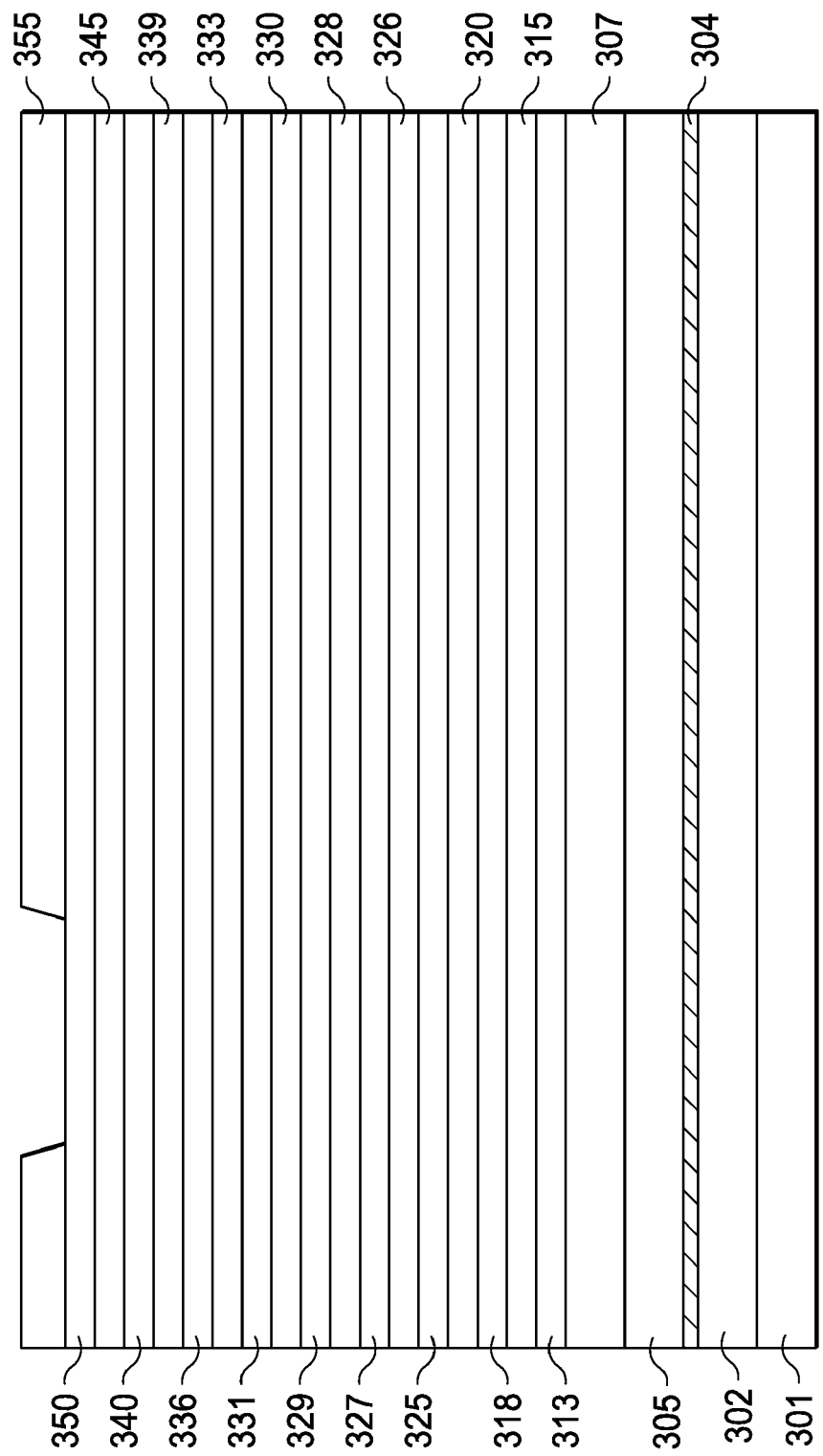

Turning now to FIG. 13, layers of GaAs are epitaxially deposited above the second etch stop layer 340 to form source and drain contact layers for the lateral FET. First, a first source/drain contact layer 345 of about 300 Å of an n-type doped layer of GaAs is epitaxially deposited, preferably using Si as the dopant with a doping level in the range of $1 \times 10^{17}$ to $1 \times 10^{18}$ cm$^{-3}$. Then, a second source/drain contact layer 350 of about 500 Å of a heavily doped n+ layer of GaAs is epitaxially deposited with a doping level in the range of $1 \times 10^{18}$ to $1 \times 10^{19}$ cm$^{-3}$ to improve formation of ohmic contacts for the source and drain and to reduce resistance in the source-to-gate and drain-to-gate regions of the channels.

Turning now to FIGS. 14 to 18, illustrated are cross-sectional views of an embodiment of constructing a source interconnect through the lateral FET in accordance with the principles of the present invention. The source interconnect is configured to create a low-resistance ohmic contact between the first, second and third lateral channels (also referred to as "lateral channels") 325, 328, 331 and the second epitaxial buffer layer 305. A spun-on photoresist 355 is illustrated with respect to FIG. 14 that has been masked, exposed and developed as is well known in the art to form a trench for access to the layers therebelow. The photoresist 355 is then baked (e.g., reflowed) such as on a hot plate or oven at about 110 to 150 degrees Celsius and in a normal atmosphere, which cures the photoresist 355 and causes a lower surface of the photoresist 355 facing the trench to encroach toward the trench, forming a generally angular aspect to the trench as illustrated with respect to FIG. 15. The angle of the slope in the photoresist 355 can be controlled by modifying a duration and temperature profile of the reflow process as is well understood in the art.

Figure 16:
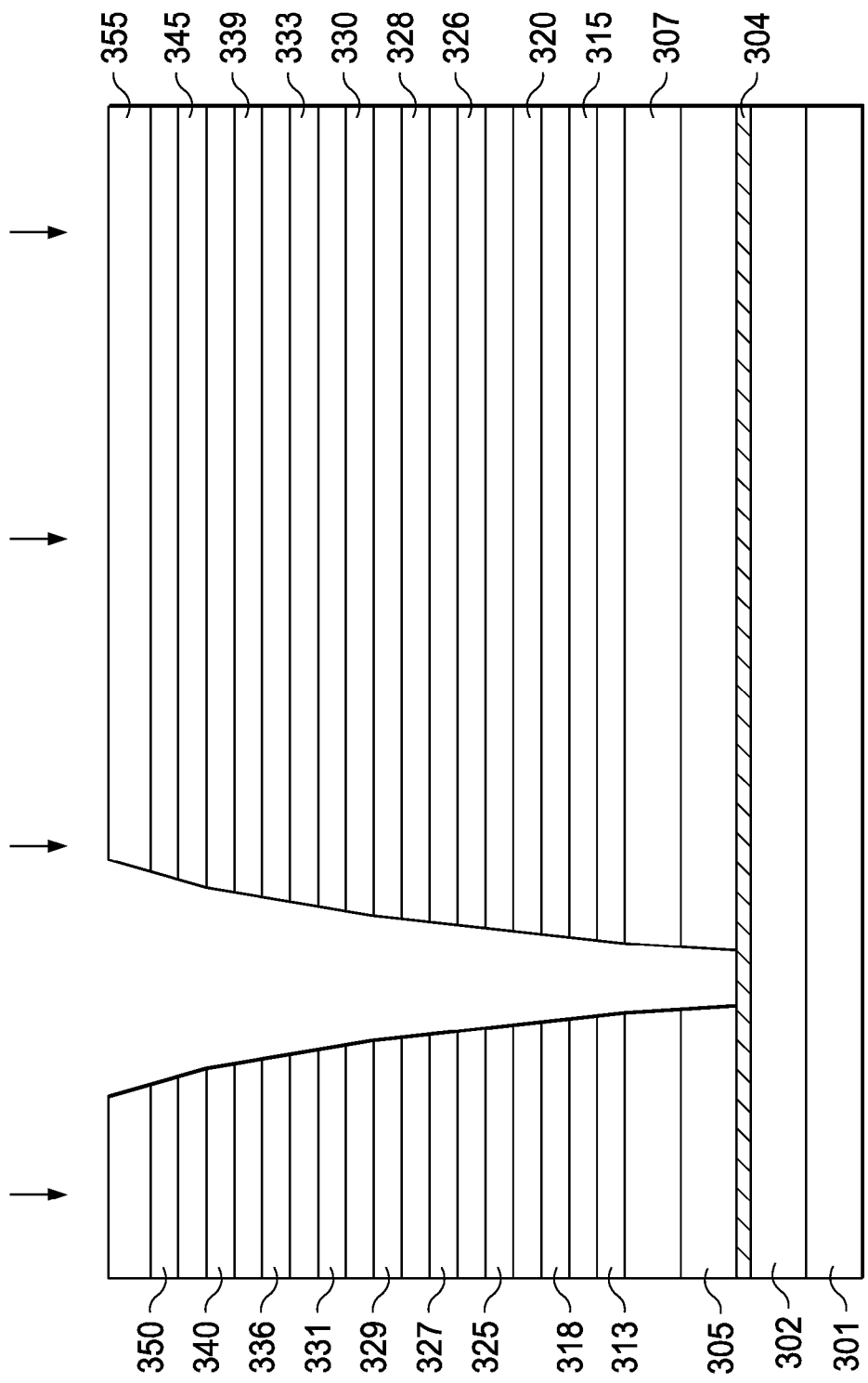

Turning now to FIG. 16, the portion of the lateral FET unprotected by the photoresist 355 is anisotropically dry etched, preferably using an inductively coupled plasma (i.e., an "ICP" dry etch). The anisotropic dry etch forms a source via (or trench) through the layers of the lateral FET down to the first etch stop layer 304 to create a low-resistance contact between the first, second and third lateral channels 325, 328, 331 and a metal layer (a source contact) illustrated and described below with reference to FIG. 29. The non-selective etching may further alter a profile of the photoresist 355. Gallium arsenide is generally etched faster than the photoresist 355 by the ICP dry etching, producing a general slope in the walls of the trench in exposed portions of the GaAs and can also produce sloping walls in exposed intervening layers (some slopes not shown).

The presence of the first etch stop layer 304 facilitates controllably forming the source trench to the bottom of the second epitaxial buffer layer 305. The etching process is preferably continued for a controlled period of time until the source trench is opened to the second epitaxial buffer layer 305. The presence of the first etch stop layer 304 facilitates controllably forming the source trench to the bottom of the second epitaxial buffer layer 305.

Figure 17:
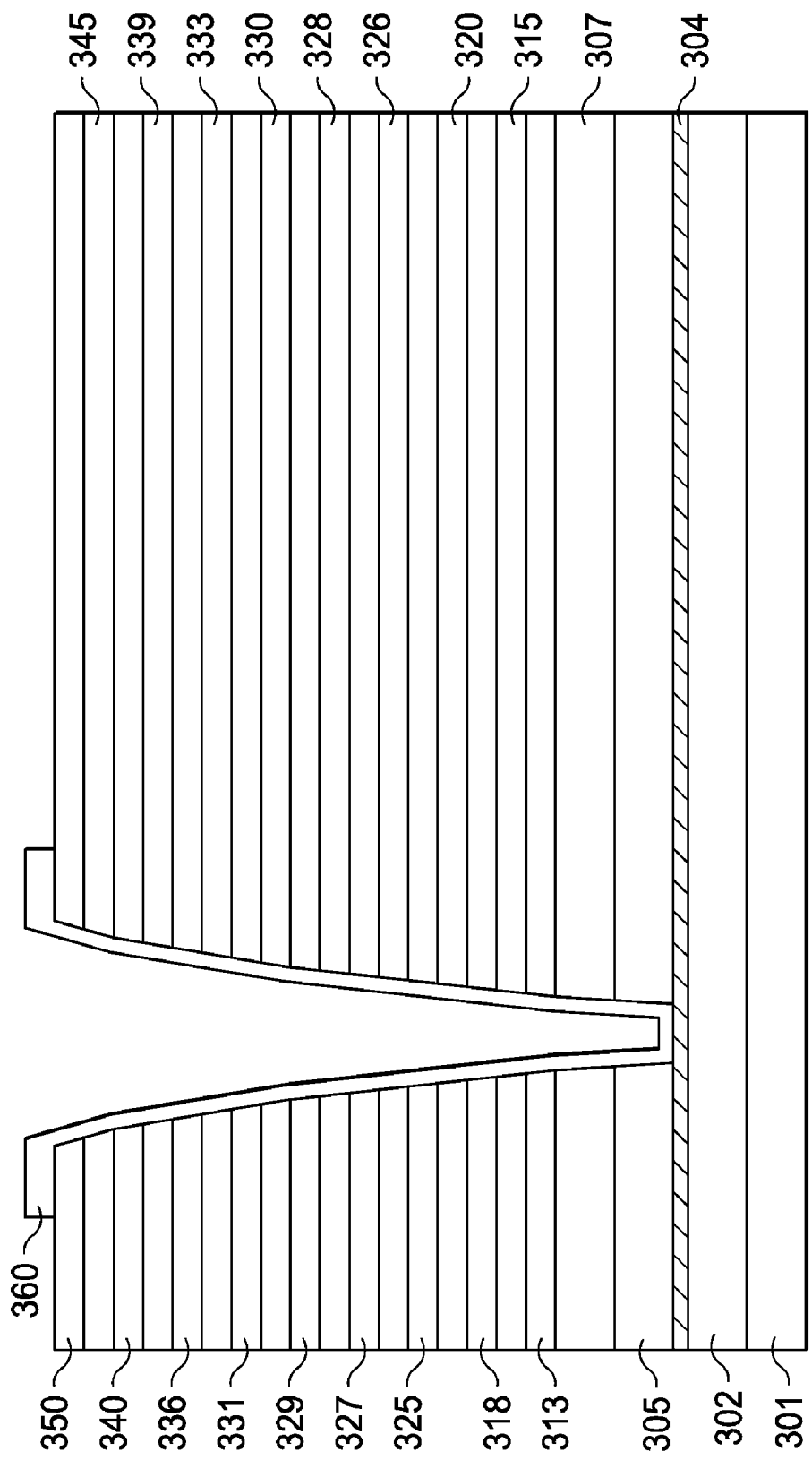

Turning now to FIG. 17, the walls of the source trench should be sufficiently sloped so that a thin metal layer (generally designated 360) can be deposited on horizontal and semi-horizontal surfaces, preferably by a vacuum evaporation and deposition process. The metal material is anisotropically deposited onto the horizontal surfaces such as the bottom of the source trench and on the sloped surfaces. Typically, about 3000-4000 Å of gold ("Au"), germanium ("Ge"), nickel ("Ni"), and then gold are preferably sequentially deposited and annealed to produce an alloy with a low-resistance ohmic contact and good adhesion with the first, second and third lateral channels 325, 328, 331 and the second epitaxial buffer layer 305. A low-resistance ohmic contact is also formed with the second epitaxial buffer layer 305 located above the substrate 301. Other alloys such as palladium-germanium-gold, nickel-indium-germanium, palladium-germanium and aluminum-tin-nickel may be employed to advantage. Annealing causes an alloy to form among the metallic species and allows migration of metal into adjacent semiconductor material forming a metal semiconductor eutectic, thereby enhancing its low-resistance, ohmic property.

Figure 18:
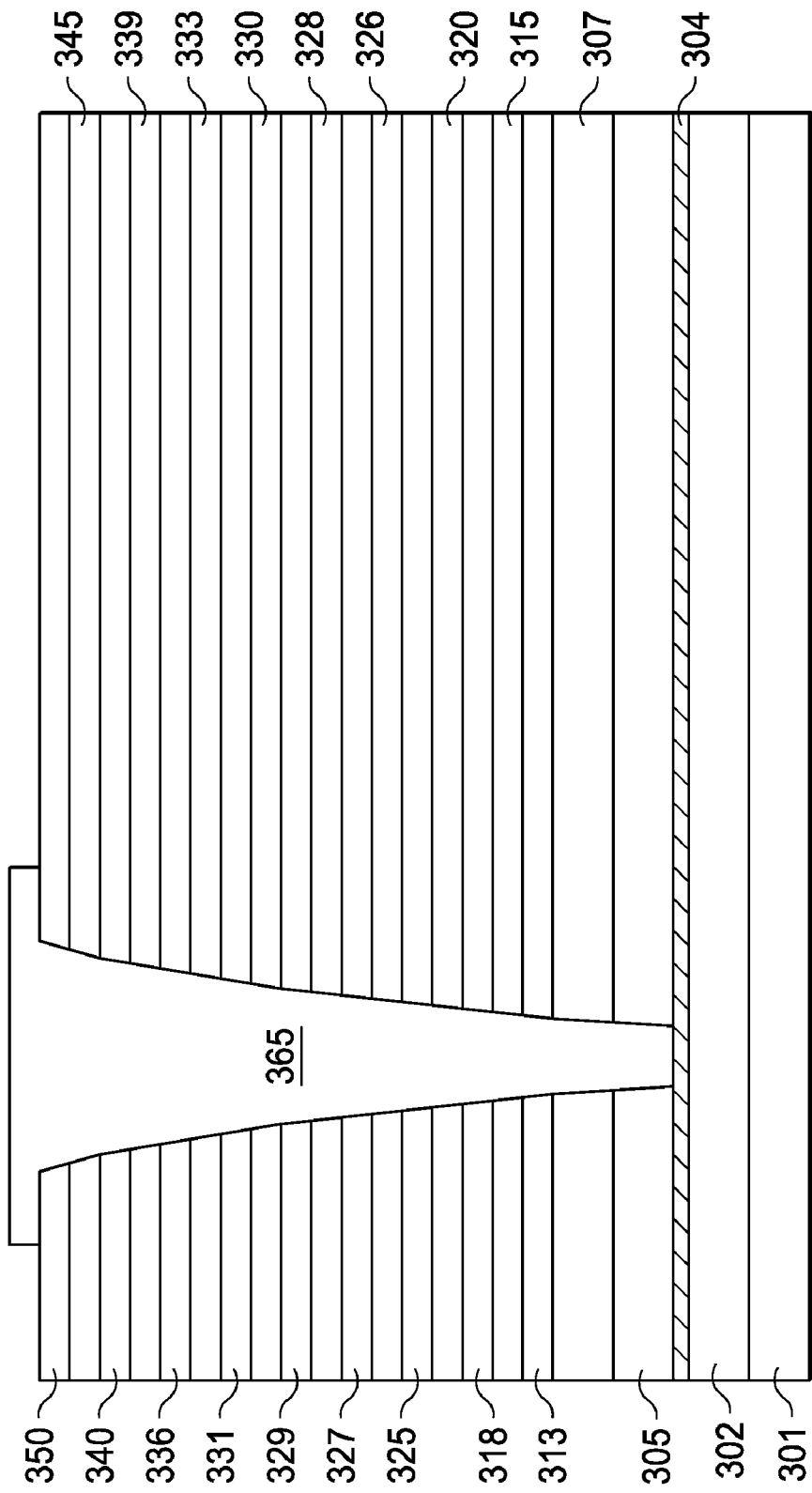

Turning now to FIG. 18, an electroplating process is thereafter performed to form a low-resistance source interconnect 365. The source interconnect 365 is filled with plated platinum and gold. The wafer is dipped into a plating solution and is connected to an electrical current source. A metal material of the plating solution (e.g., either platinum or gold) becomes ionized and is deposited on a conductive surface. The creation of the source interconnect 365 enhances a metallic path between the highly conductive portions of the first, second and third lateral channels 325, 328, 331 and the second epitaxial buffer layer 305. In this manner, the lateral channels 325, 328, 331 between a source contact and a drain contact can be formed and a low-resistance contact to the source (coupled to the lateral channels 325, 328, 331) can be configured on an opposing surface of the lateral FET from a contact for the drain (also coupled to the lateral channels 325, 328, 331). Alternatively, an implant may be formed to create the source interconnect such as illustrated in U.S. Patent Application Publication No. 2006/0226477, entitled "Substrate Driven Field-Effect Transistor," to Brar, et al., published Oct. 12, 2006, which is incorporated herein by reference.

Figure 19:
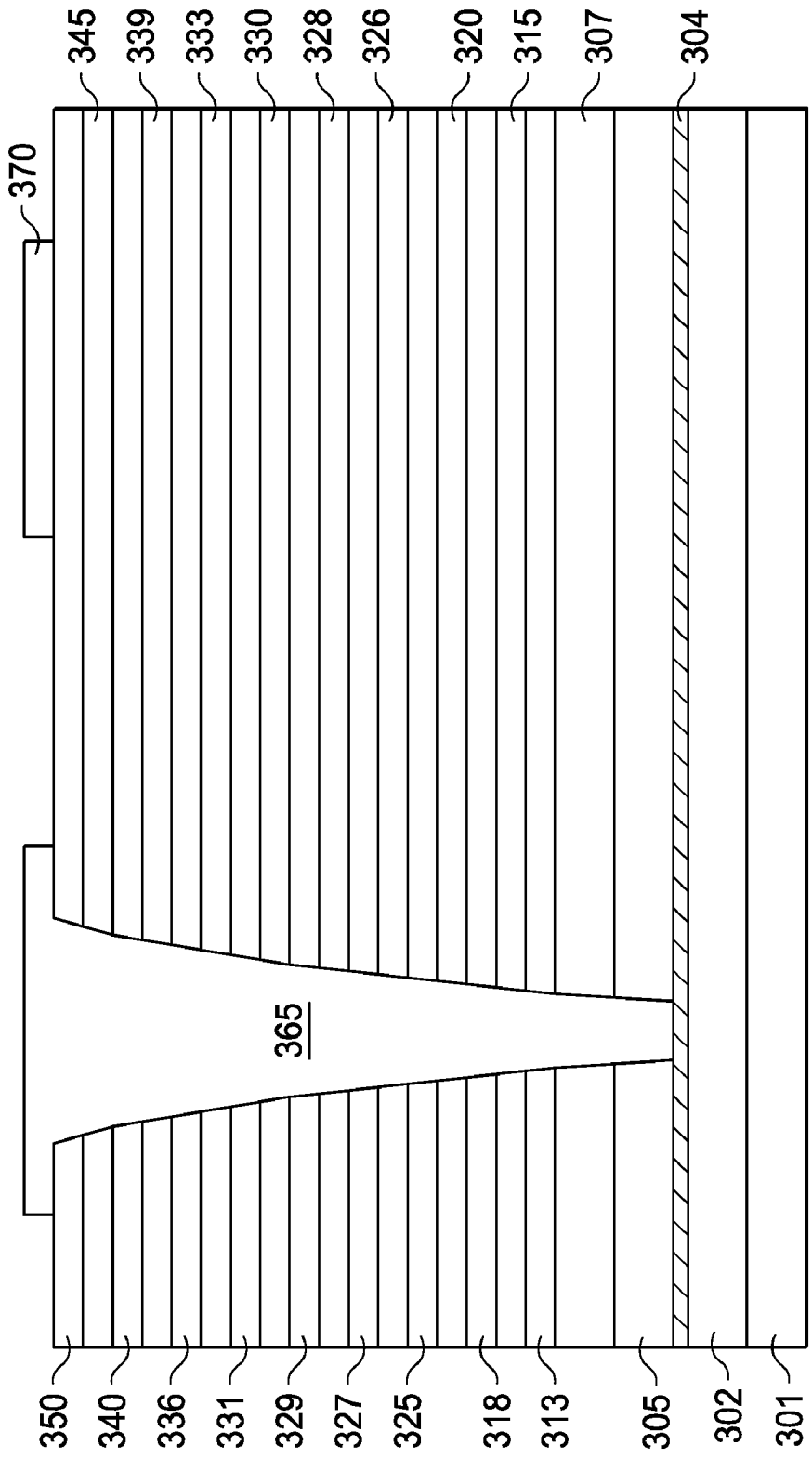

Turning now to FIG. 19, a metal layer 370 is deposited in an area associated with the drain, preferably by a vacuum evaporation and deposition process employing a patterned photoresist. The metal layer 370 provides a low-resistance ohmic contact for the drain. The metal layer 370 also provides a plating base for a process of constructing a drain post as set forth below. Additionally, the metal layer 360 described above and the present metal layer 370 may be deposited at the same time by a technique referred to as a metal lift off process. In such a case, a photoresist is spun on the surface and patterned such that an area where the metal is desired gets exposed and the other areas are covered by the photoresist. Metal evaporation is thereafter performed on the patterned wafer. When the wafer is dipped into solvents, the metal on the top of the patterned photoresist gets removed and only the metal on the exposed area remains. With this process, ohmic contacts may be created at the same time.

Figure 20:
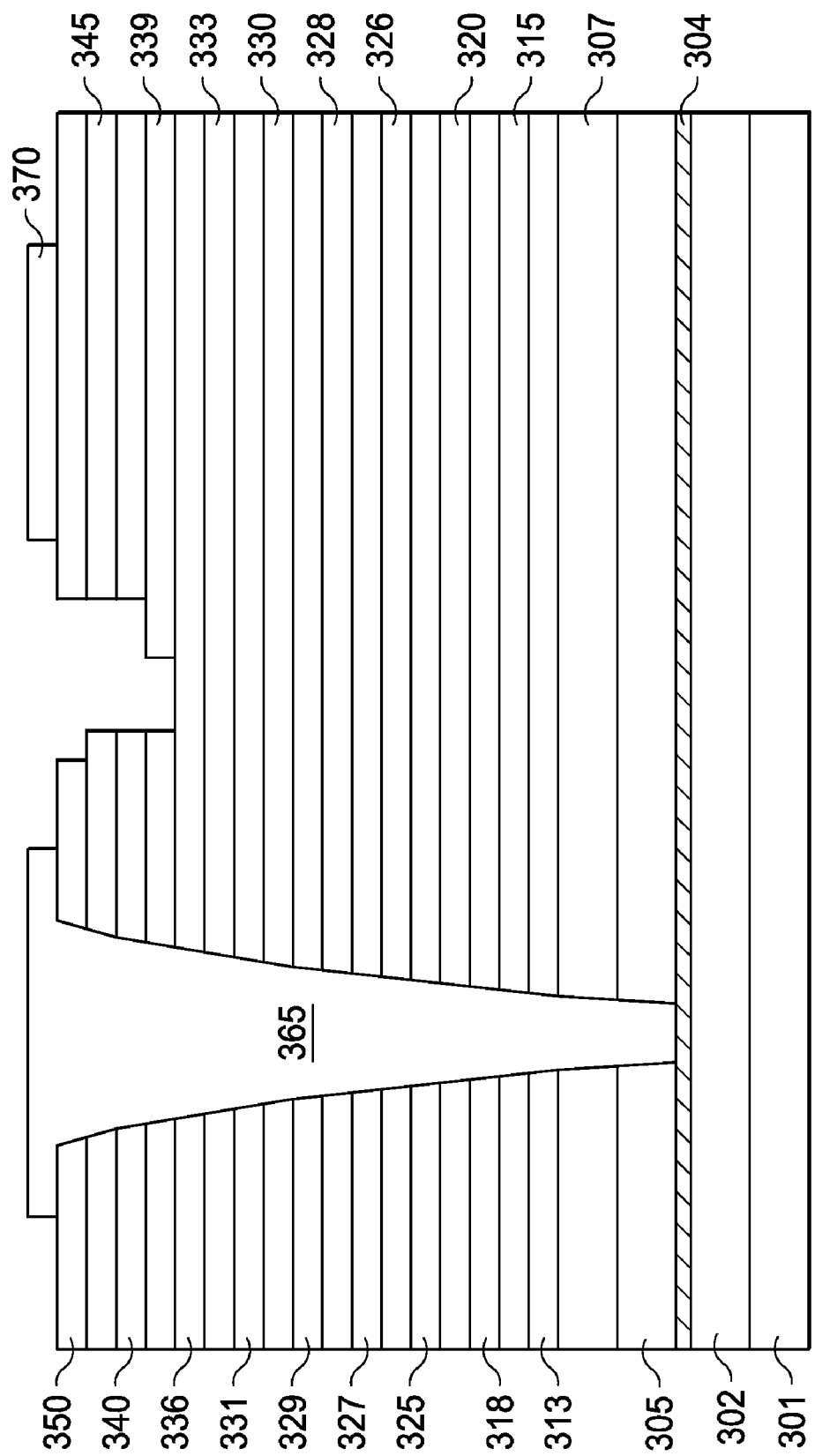

Turning now to FIG. 20, the first and second drain contact layers 345, 350 are then patterned and selectively etched to form a wide recess area, to provide a gate-to-drain separation distance as described below, down to the second etch stop layer 340. The second etch stop layer 340 is etched by a selective wet etch process. A gate recess is thereafter formed by patterning and selectively etching through the recess layer 339 down to the second barrier layer 336. The unetched portion of the recess layer 339 between a gate and drain allows the lateral FET to sustain a higher voltage (e.g., 20 volts) by reducing a high internal electric field that would otherwise damage or destroy the device. An appropriate etchant or etchants are used for the selective removal of the respective layers as is well understood in the art.

Figure 21:
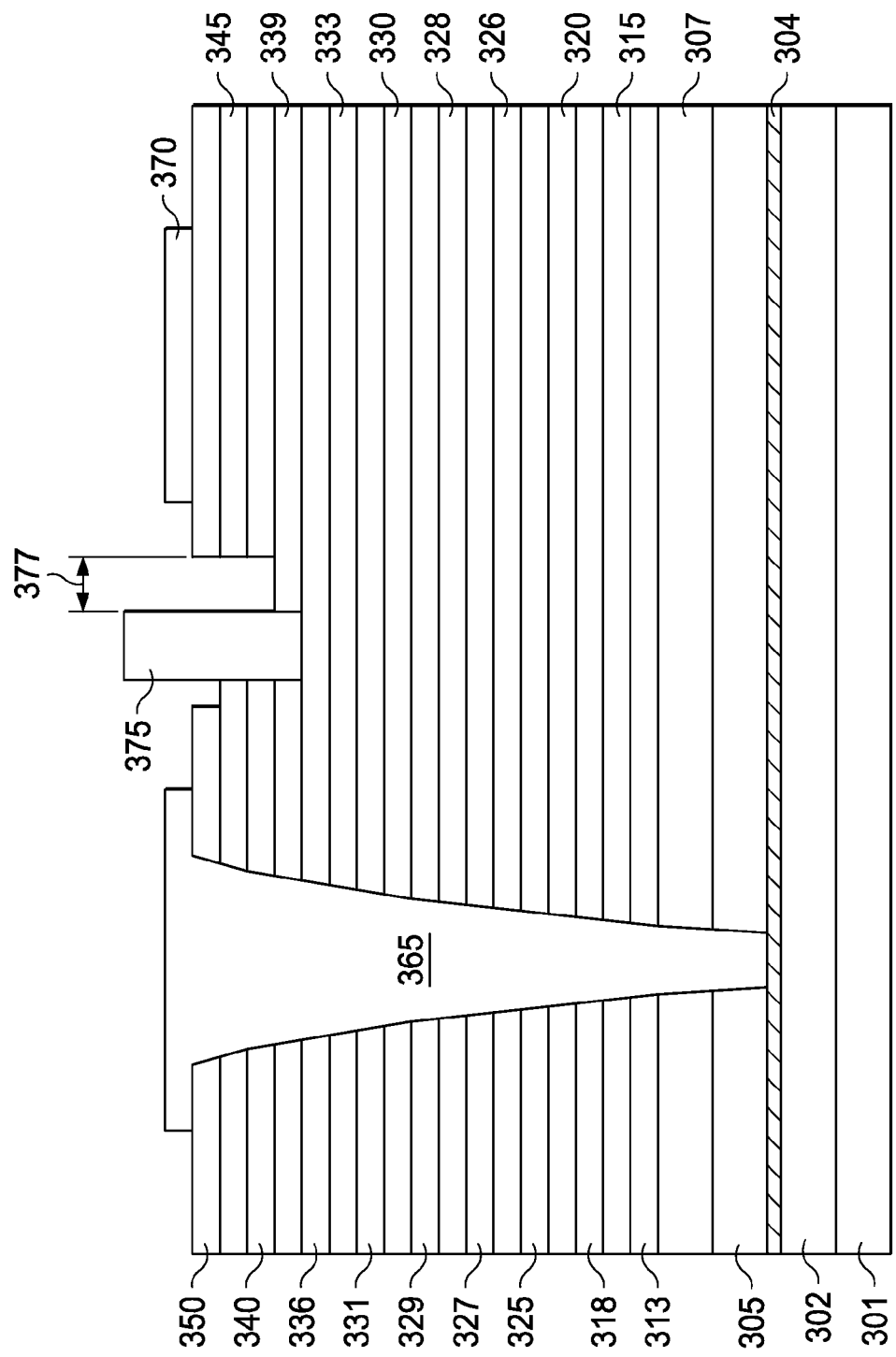
Figure 22:
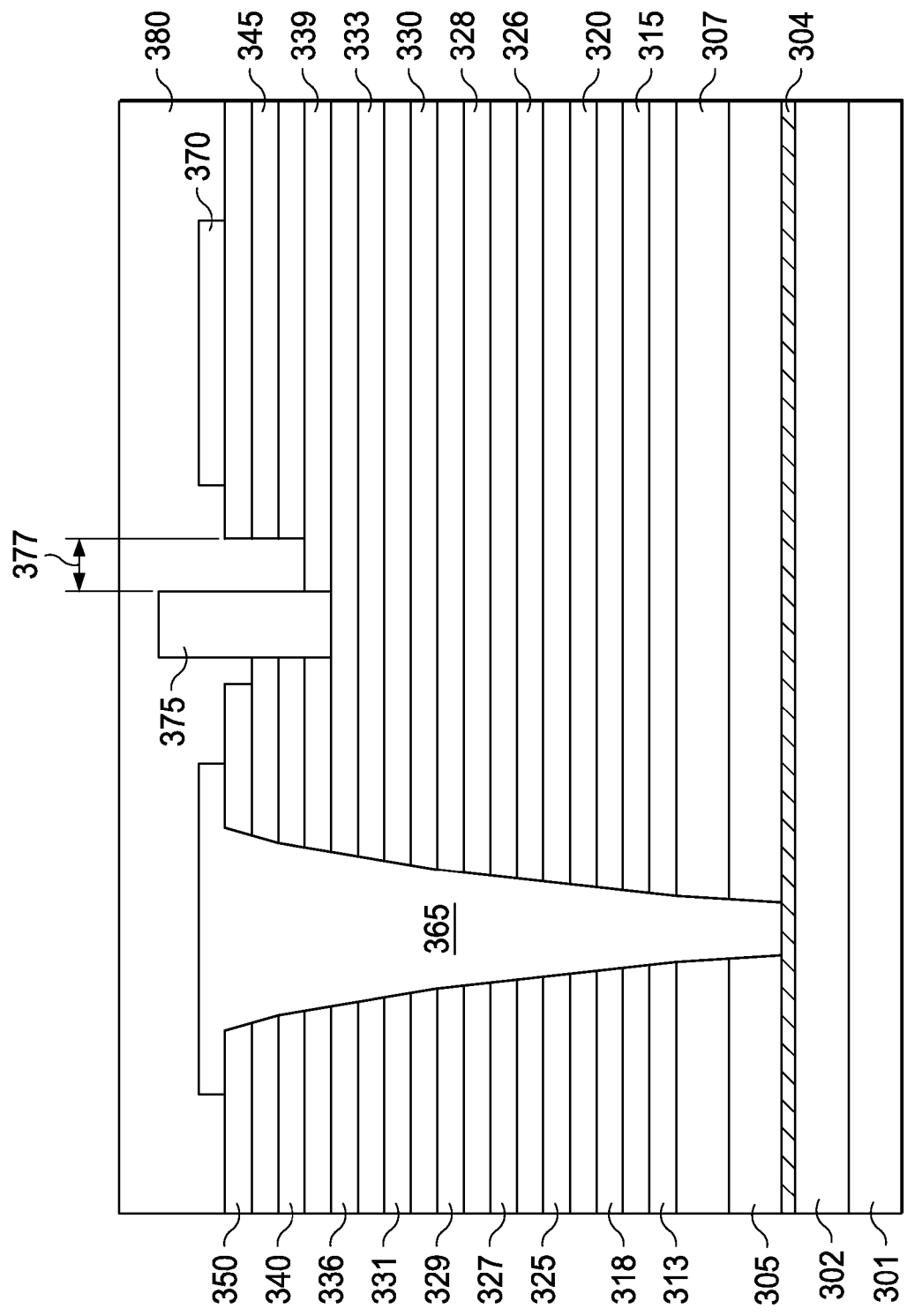

Turning now to FIGS. 21 and 22, a gate 375 is patterned and formed preferably by a self-aligned process in the gate recess. An enhanced gate-to-drain separation distance 377 between the gate 375 and drain formed in part by the first source/drain contact layer 345 is illustrated herein. An exemplary gate-to-drain separation distance is 0.2 µm for a lower voltage device and 1.5 µm for a higher voltage device. The drain is, therefore, offset from one side of the gate 375 by the gate-to-drain separation distance 377. It should be understood that the first source/drain contact layer 345 forms at least a portion of the source and drain on opposite sides of the gate 375 of the lateral FET. The gate 375 forms a Schottky junction and is formed with multiple layers, preferably metallic multi-layer titanium-platinum-gold ("TiPtAu"), but other Schottky-junction forming layers such as titanium-tungsten ("TiW"), tantalum-nitrogen ("TaN"), and tungsten-silicon ("WSi") can also be used within the scope of the present invention. Also, a thin layer providing dielectric surface passivation such as silicon nitride ("$Si_3N_4$," not shown) may then be optionally deposited on an upper surface of the lateral FET. A dielectric layer 380 is then formed about the lateral FET, preferably with a low dielectric constant material (e.g., BCB, polyimide, Si glass, or other flowable oxide) to preserve a performance of the lateral FET. The dielectric layer 380 is typically spun on and cured as necessary for planarization and for further surface passivation. The thickness of the dielectric layer 380 advantageously can be controlled by a spinning speed and duration. The cured dielectric layer 380 is strong enough to provide mechanical and chemical support for subsequent processing steps.

Figure 23:
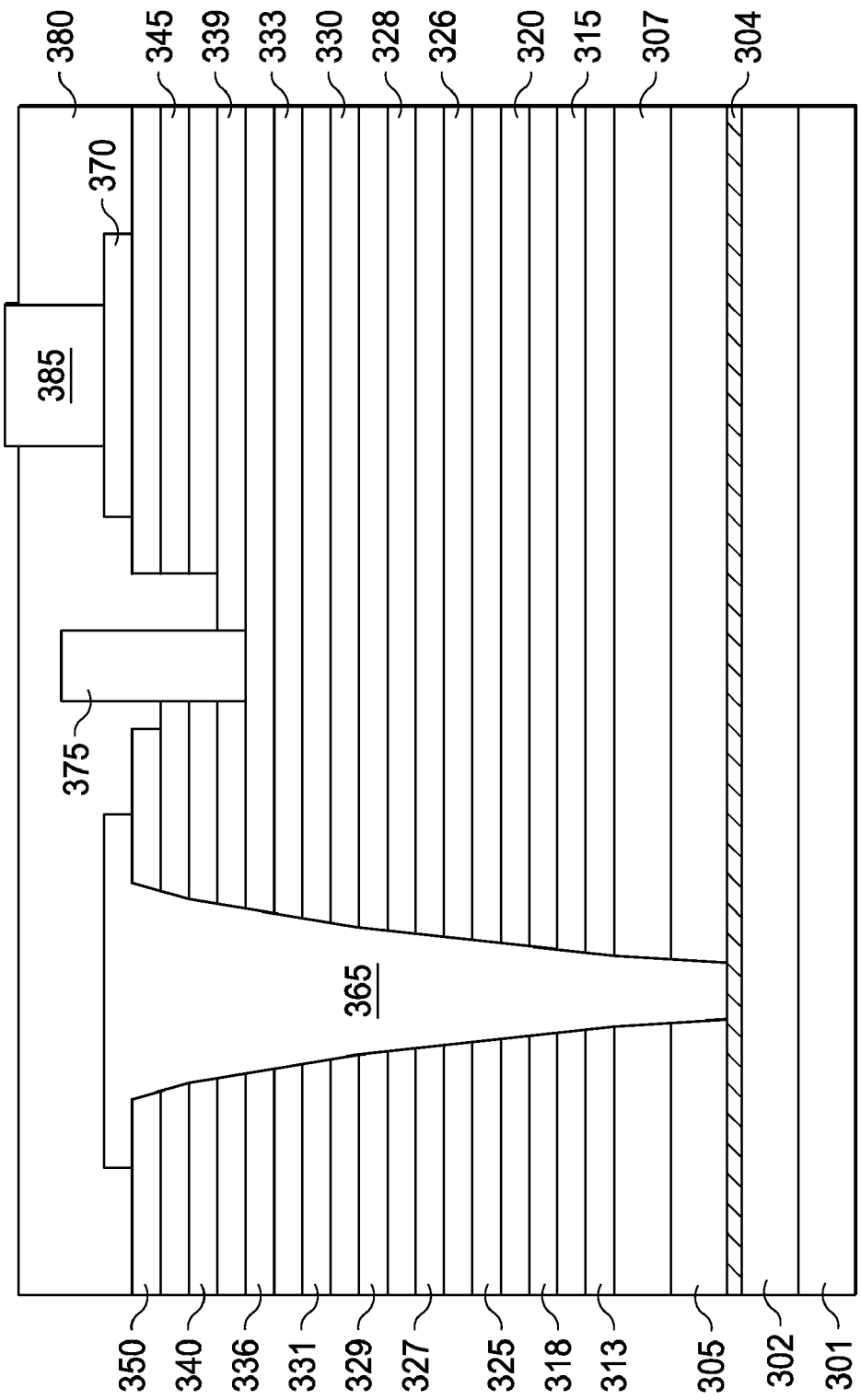

Turning now to FIG. 23, the dielectric layer 380 is then patterned and etched down to the metal layer 370 to form a drain post. An electroplating process is thereafter performed to form a drain post or finger 385. Analogous to the process for creating the source interconnect 365, the wafer is dipped into a gold plating solution and ionized gold elements are deposited on an electrically conductive surface. The drain post 385 is a metallic interconnect that forms a wide area, low-resistance interconnect to a top surface of the lateral FET. The alternative is to plate the drain post 385 first, apply the dielectric material 380 and etch the dielectric layer 380 down to the top of the drain post 385 using an etch-back technique. In addition, this metal interconnect can be formed by metal evaporation and subsequent lift-off process. (A seed layer is not required to ensure plating, assuming the process is not started with a conductive substrate.)

Figure 24:
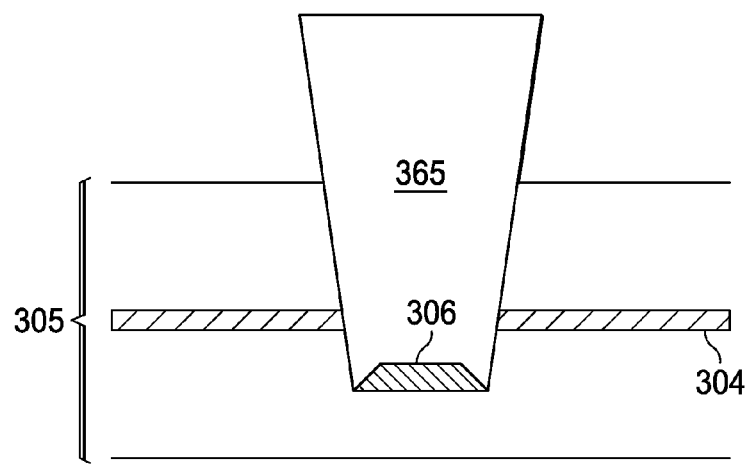

As described above with reference to FIGS. 6 and 7 and illustrated in FIG. 24, the first etch stop layer 304 may be deposited as an intermediary layer within the second epitaxial buffer layer 305. A location of the first etch stop layer 304 may vary within the second epitaxial buffer layer 305 and an ohmic contact 306 is formed at the lower end of the source interconnect 365 with the second epitaxial buffer layer 305. In a preferred embodiment as illustrated in FIG. 23, the source interconnect 365 is formed to the bottom of the second epitaxial buffer layer 305 to provide a path with electrical low resistance to a metal layer (a source contact described below with reference to FIG. 29) that will be deposited on the lower surface of the second epitaxial buffer layer 305 in a later processing step. In addition to low electrical resistance that can be advantageously achieved by extending the source interconnect 365 to the bottom of the second epitaxial buffer layer 305, the thermal resistance of the device is also thereby enhanced.

Figure 25:
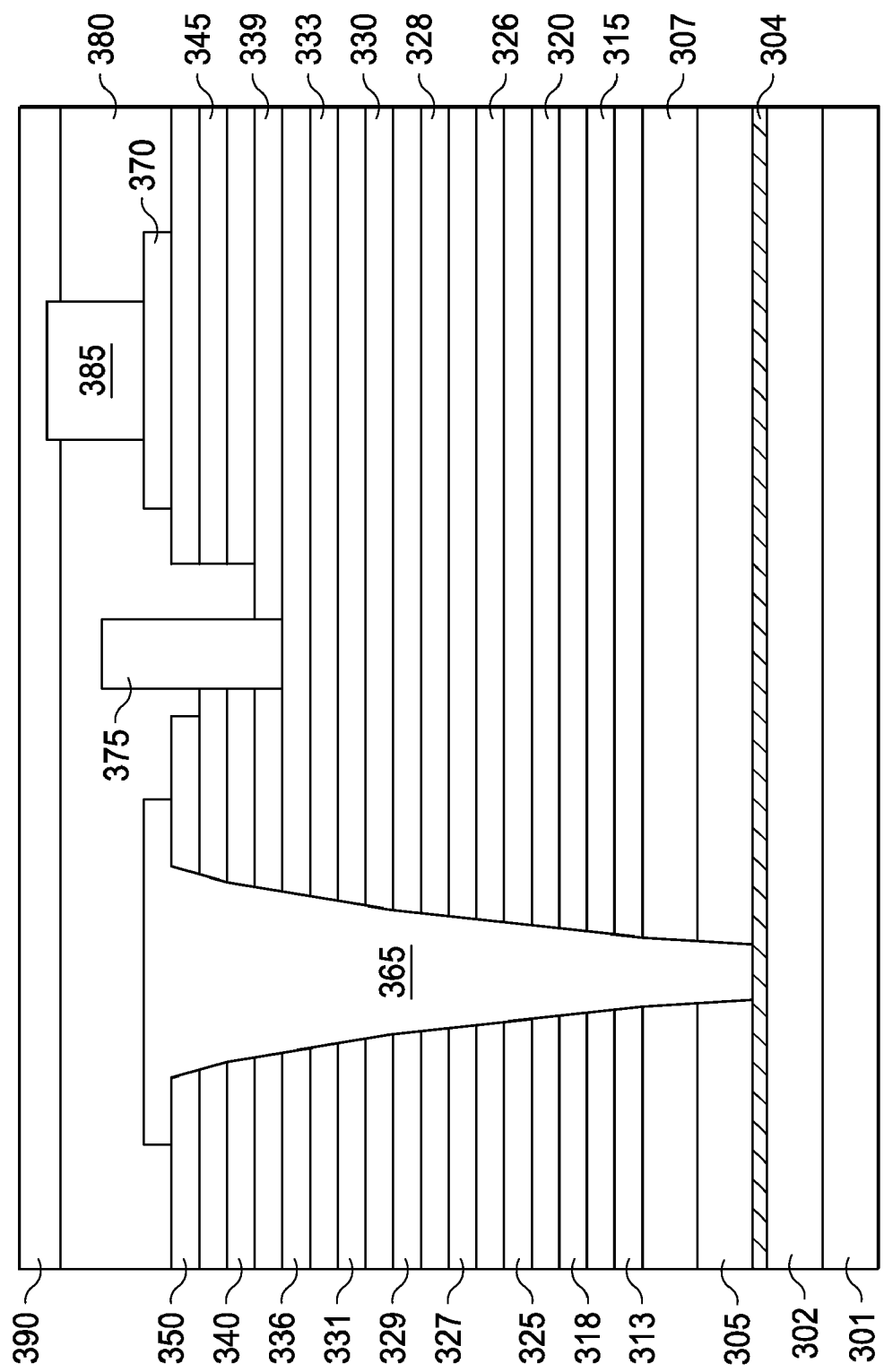

Turning now to FIG. 25, metallized top contact (also referred to as a drain contact 390) coupled to the drain post 385 is sequentially deposited and preferably patterned on the top surface of the lateral FET, preferably using a metallic alloy such as titanium-platinum-gold for the top contact to form a low-resistance large area contact. The deposition process may be performed by vacuum deposition, sputtering, plating processes or combinations thereof. The drain contact 390 is typically a few microns in thickness to accommodate the packaging process including die attachment and bonding and cover a substantial portion of a top surface of the lateral FET.

As previously mentioned, the isolation layer 307 forms a pair of back-to-back diodes with the second epitaxial buffer layer 305 and the n-type doped layers thereabove. For instance, an intrinsic body diode is formed with the isolation layer 307 acting as an anode and the first barrier layer 318 and other n-type layers above such as the first and second drain contact layers 345, 350 acting as the cathode. The intrinsic body diode provides a conductive path between the drain contact 390 of the lateral FET and a source contact (illustrated and described below with reference to FIG. 29) that will be deposited in a processing step to be described later that is formed below the second epitaxial buffer layer 305. While the back-to-back diodes are formed with an npn structure in the illustrated embodiment, those skilled in the art should understand that other diode structures are well within the broad scope of the present invention.

Figure 26:
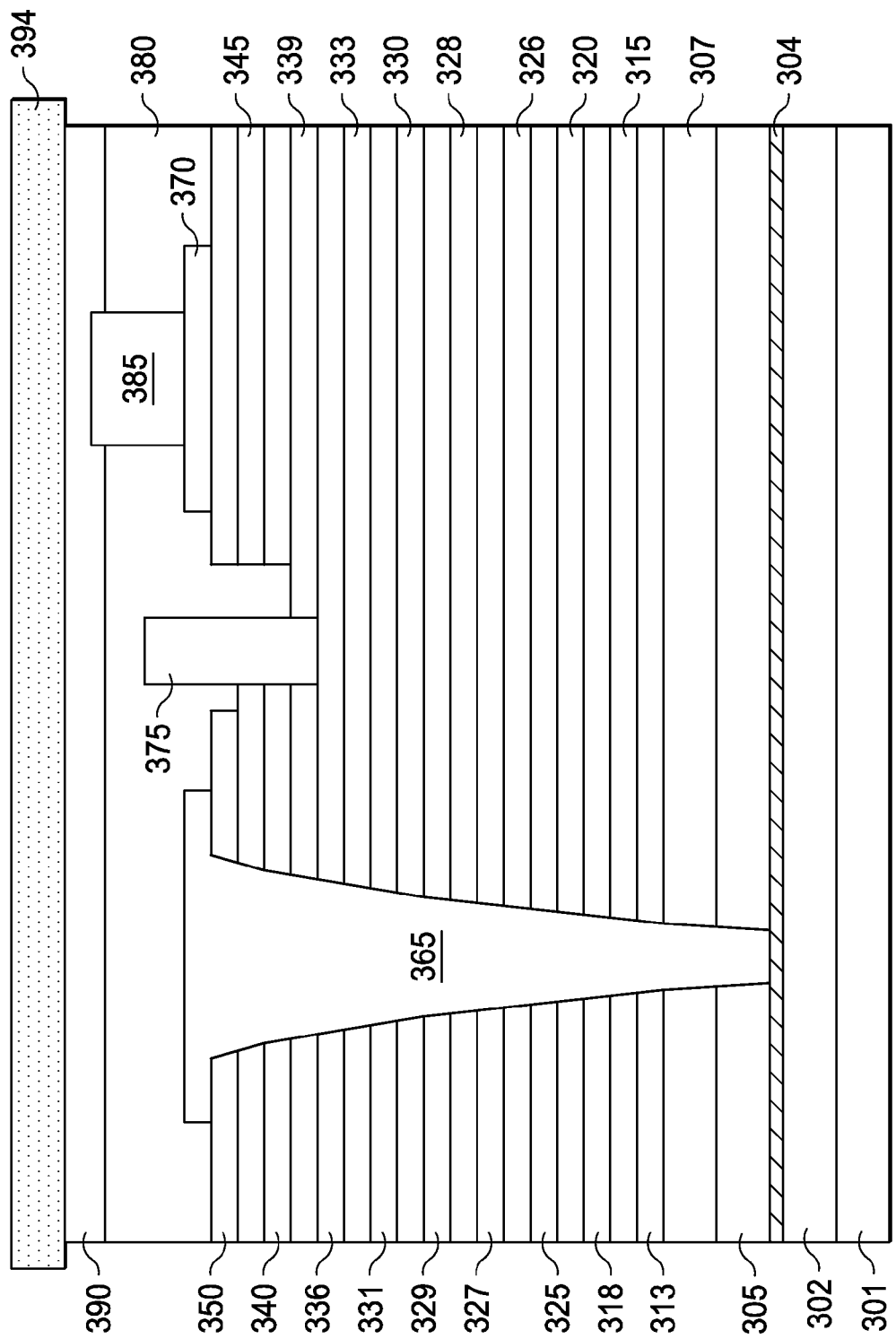
Figure 27:
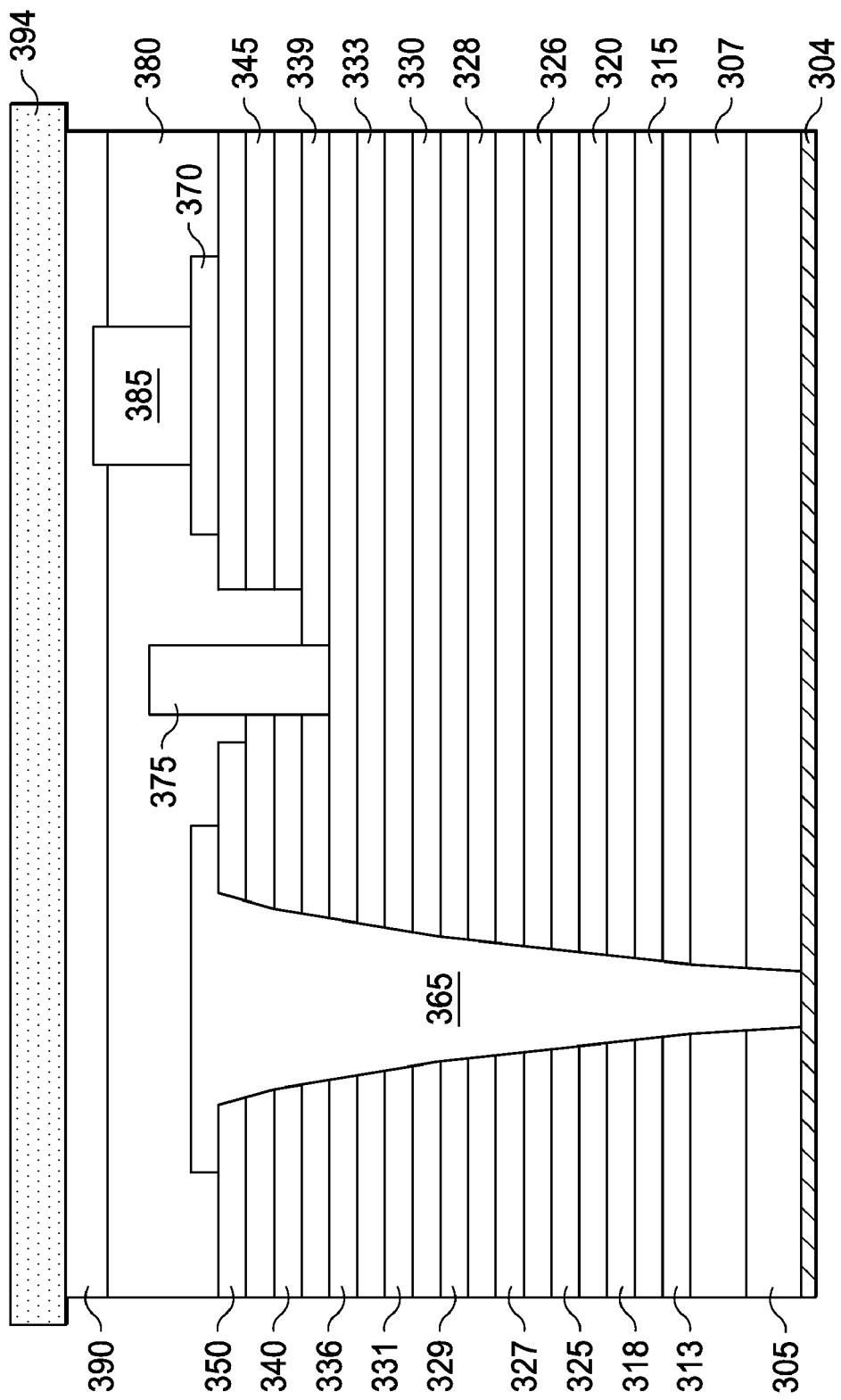
Figure 28:
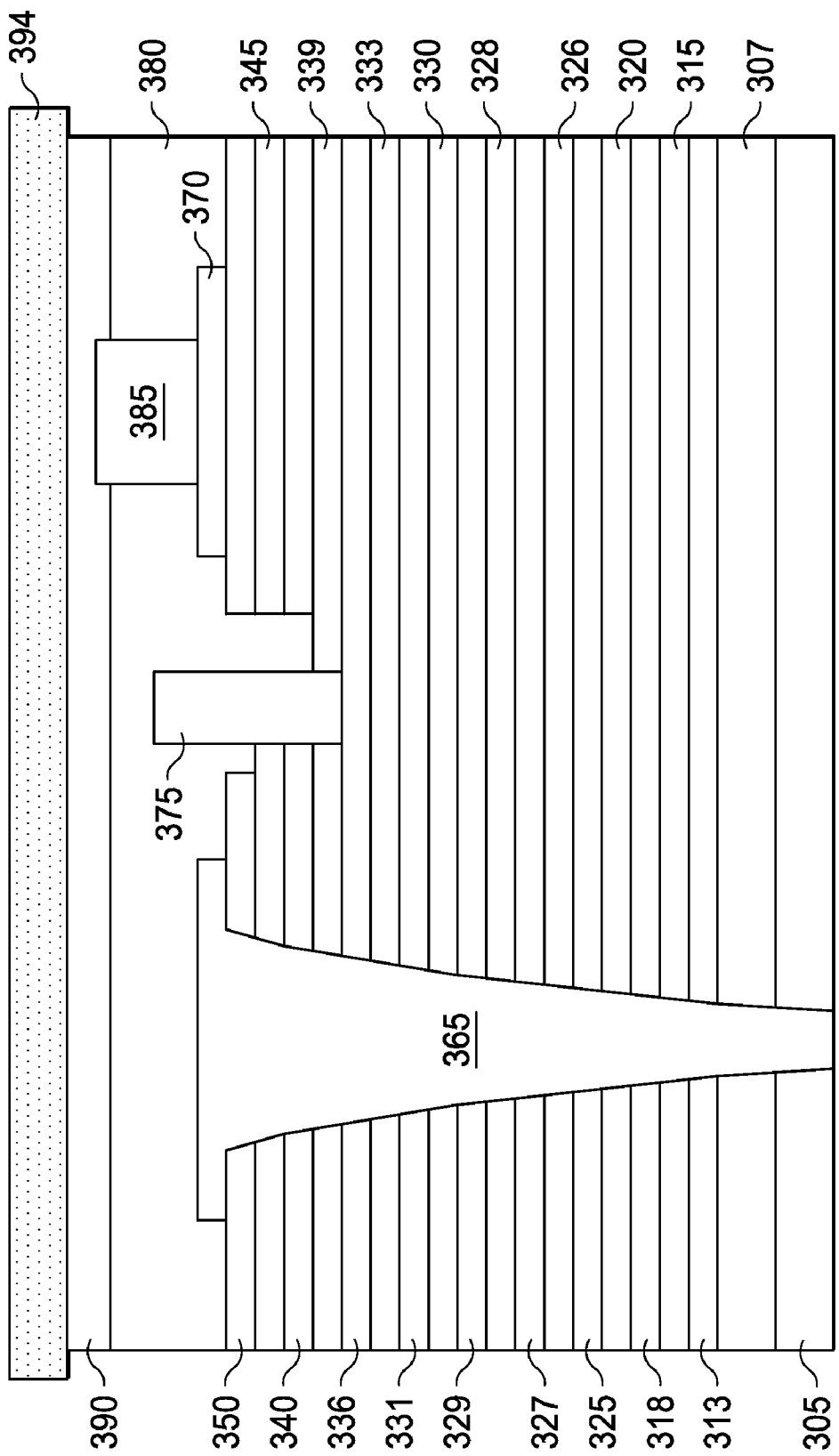

Turning now to FIGS. 26 to 28, the wafer is removably bonded face up (i.e., with the substrate 301 exposed) onto a carrier 394 (e.g., a sapphire, aluminum oxide carrier). Suitable bonding materials for a removable bonding include high-temperature wax or tape, as commonly used in the art. The substrate 301 and the first epitaxial buffer layer 302 are then thinned, initially by grinding and then by wet etching, using techniques similar to those used for standard wafer thinning. After the bulk of the substrate 301 and the first epitaxial buffer layer 302 are removed, the remainder of the thinning can be performed with a dry etching process, such as a plasma dry etching with fluorine-based gas, that has high throughput and is highly selective to the first etch stop layer 304. A fluorine-based etch can form a protective surface of aluminum fluoride ("$AlF_3$") across the first etch stop layer 304 during a dry-etching process. The dry etch should be performed with high uniformity across the wafer, using techniques well known in the art. The result of these etching processes is complete removal of the substrate 301 and the first epitaxial buffer layer 302 as illustrated in FIG. 27, leaving the first etch stop layer 304 as the outer layer of the wafer. As illustrated in FIG. 28, the first etch stop layer 304 is thereafter removed using a wet etch such as a hydrochloric acid ("HCl")-based etch that is selective to gallium arsenide, exposing thereby the second epitaxial buffer layer 305.

Figure 29:
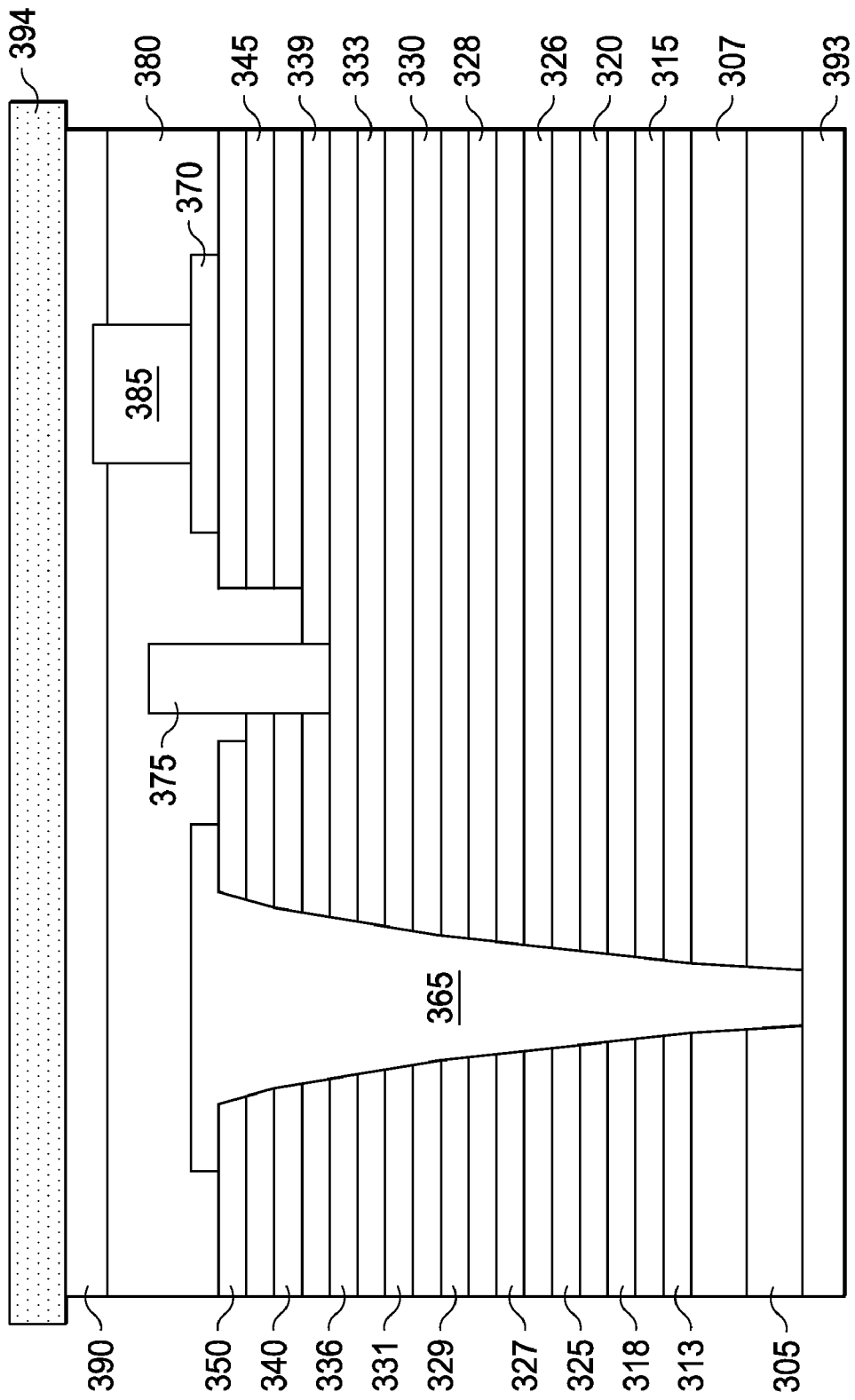

Turning now to FIG. 29, a metallic layer of gold-germanium-nickel-gold is selectively or blanket evaporated onto the second epitaxial buffer layer 305 on the back of the wafer to form a wide-area, low-resistance ohmic source contact 393 with the second epitaxial buffer layer 305. A further sublayer of gold may be optionally plated onto the gold-germanium-nickel-gold layer to provide further mechanical support and to reduce resistance of this layer. A plating process is more desirable for a substantial portion of the plating than an evaporation-based process because of faster throughput for manufacturing. However, an evaporation-based or sputtering-based process may be used to initiate/seed the plating process. A liftoff process (e.g., a metal-selective process) can also be used for deposition of a metallic layer. The metallic layer is preferably deposited sufficiently thick to provide mechanical support for the die in view of the absence of the substrate, which previously provided a mechanical-support function. If a lift-off process is used for deposition of the metallic layer, the metallic layer can be evaporated only onto active areas of the die, thereby keeping saw streets open to accommodate later die separation. A liftoff process can include patterning and processing a photoresist to form open areas, evaporating metal substantially everywhere over the photoresist which forms discontinuities in the metal surface at the edges of the photoresist, and dissolving the photoresist, which "lifts off" metal deposited thereupon. If an ordinary plating process is used, an additional masking step may be required to define streets on the back of the wafer for later sawing up to separate die.

An alternative to deposition of the source contact 393 for mechanical support as well as an electrical contact is to bond the thin wafer to another carrier. For example, the wafer can be bonded to a highly conductive substrate such as one of silicon carbide, or to a metal heatsink, such as one of aluminum. A heat sink can be bonded to the die using solder, or high thermal conductivity epoxy adhesive paste that also has low electric resistivity. As described above with reference to FIG. 7, the second epitaxial buffer layer 305 can be grown thick to provide additional rigidity for the wafer.

Figure 30:
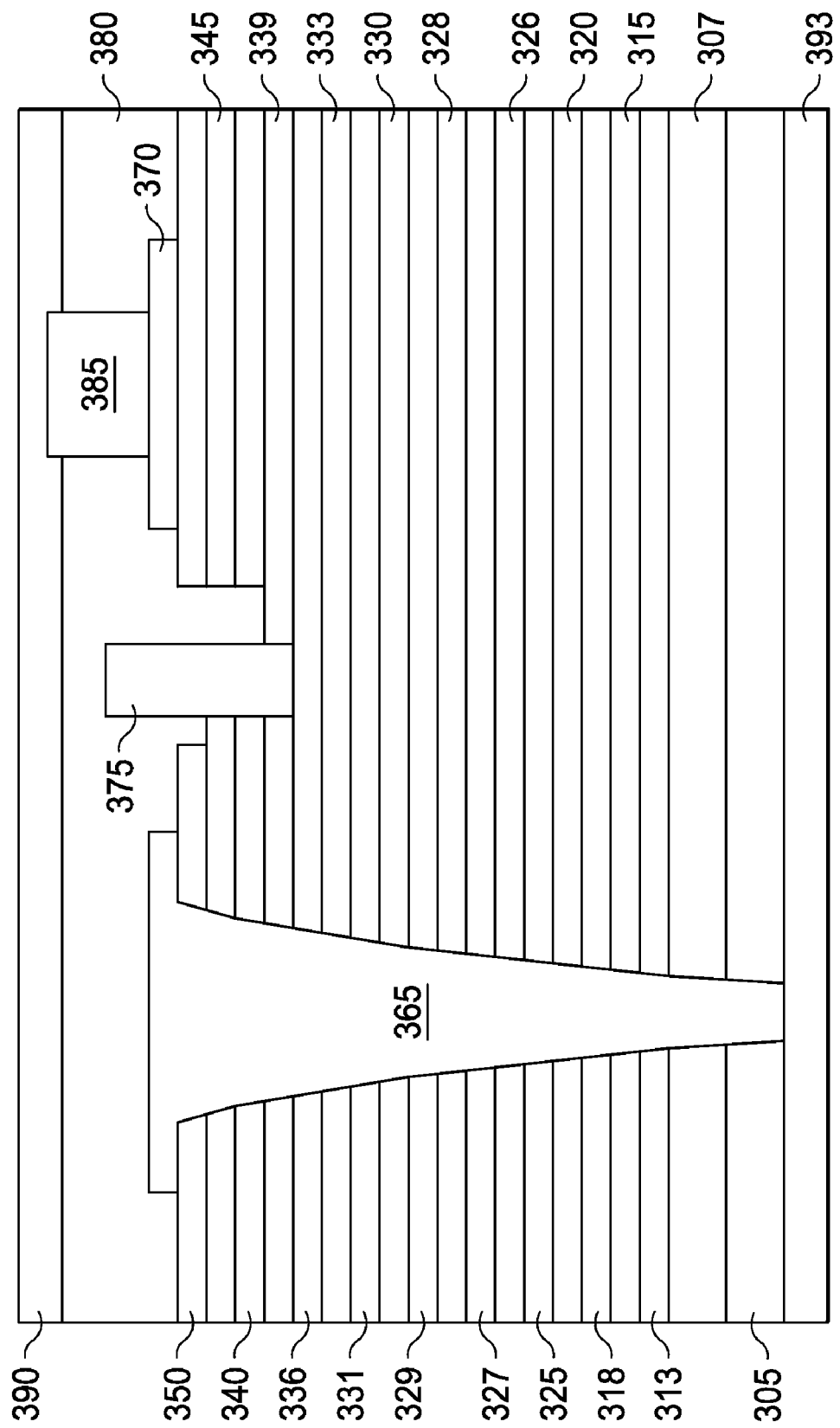

The carrier 394 is then removed using ordinary techniques in the art to separate a carrier from a wafer, which was removably bonded to the wafer using a high-temperature wax or tape, as described previously above. The result is illustrated in FIG. 30. The resulting wafer now has a metal drain contact on the top layer and a metal source contact on the bottom layer, the metal source contact formed directly on the highly doped epitaxial buffer layer 305, thereby avoiding resistance that would otherwise be provided by a substrate.

Thus, as described above with reference to FIGS. 5 to 30, a semiconductor device is advantageously formed with reduced on-resistance by depositing an etch stop layer above a substrate, which can be a semi-insulating substrate, and then performing substantially all the top-side processing of the wafer. A carrier is then bonded to the top of the wafer, and the substrate and the etch stop are sequentially removed. A plated metallic contact is formed on the bottom side of the wafer, and the carrier is removed. In an alternative embodiment, a heatsink is bonded to the bottom side of the wafer, after which the carrier is removed.

Figure 31:
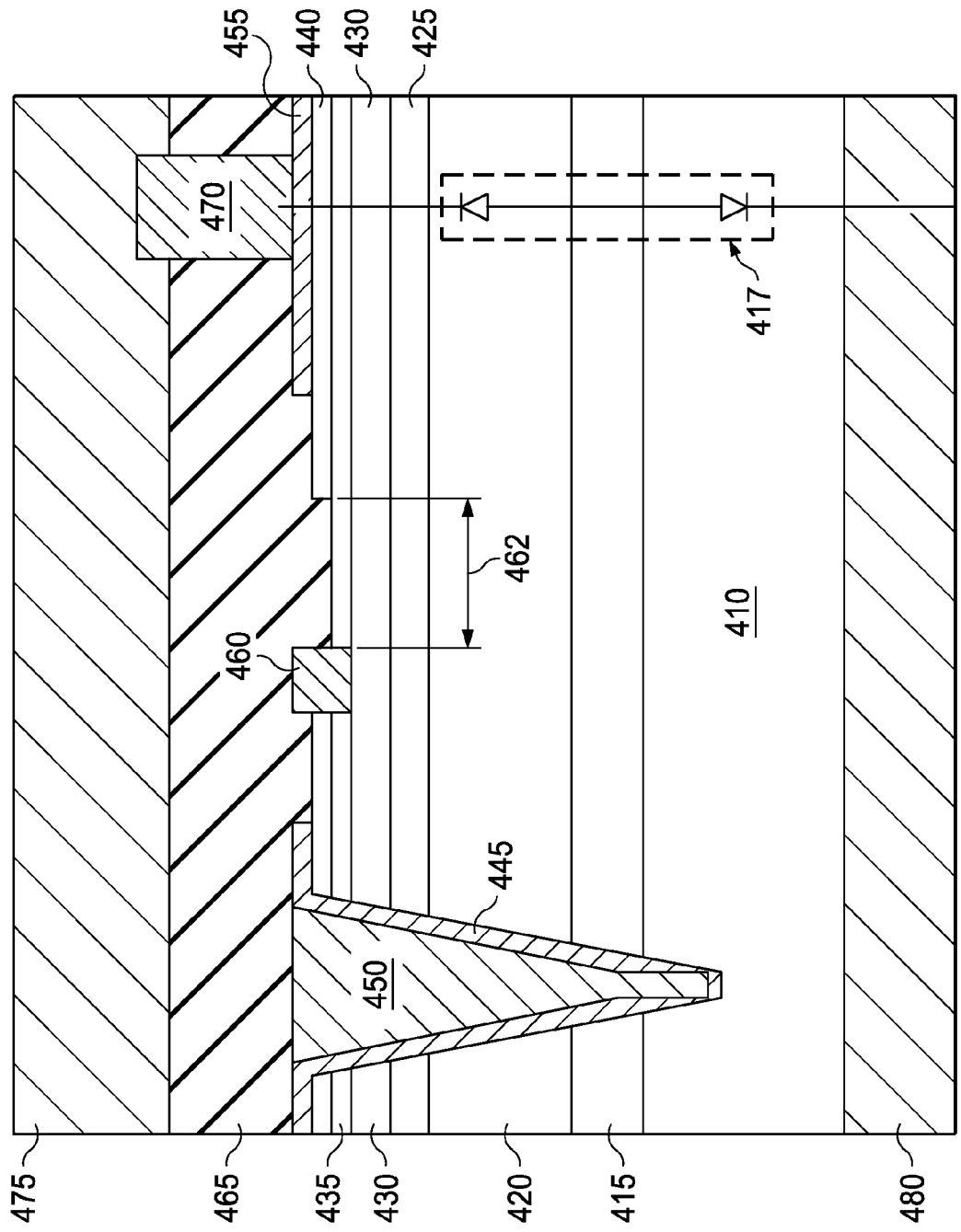
FIGS. 31 and 32 illustrate cross-sectional and perspective views, respectively, of another embodiment of a semiconductor device constructed according to the principles of the present invention.
Figure 32:
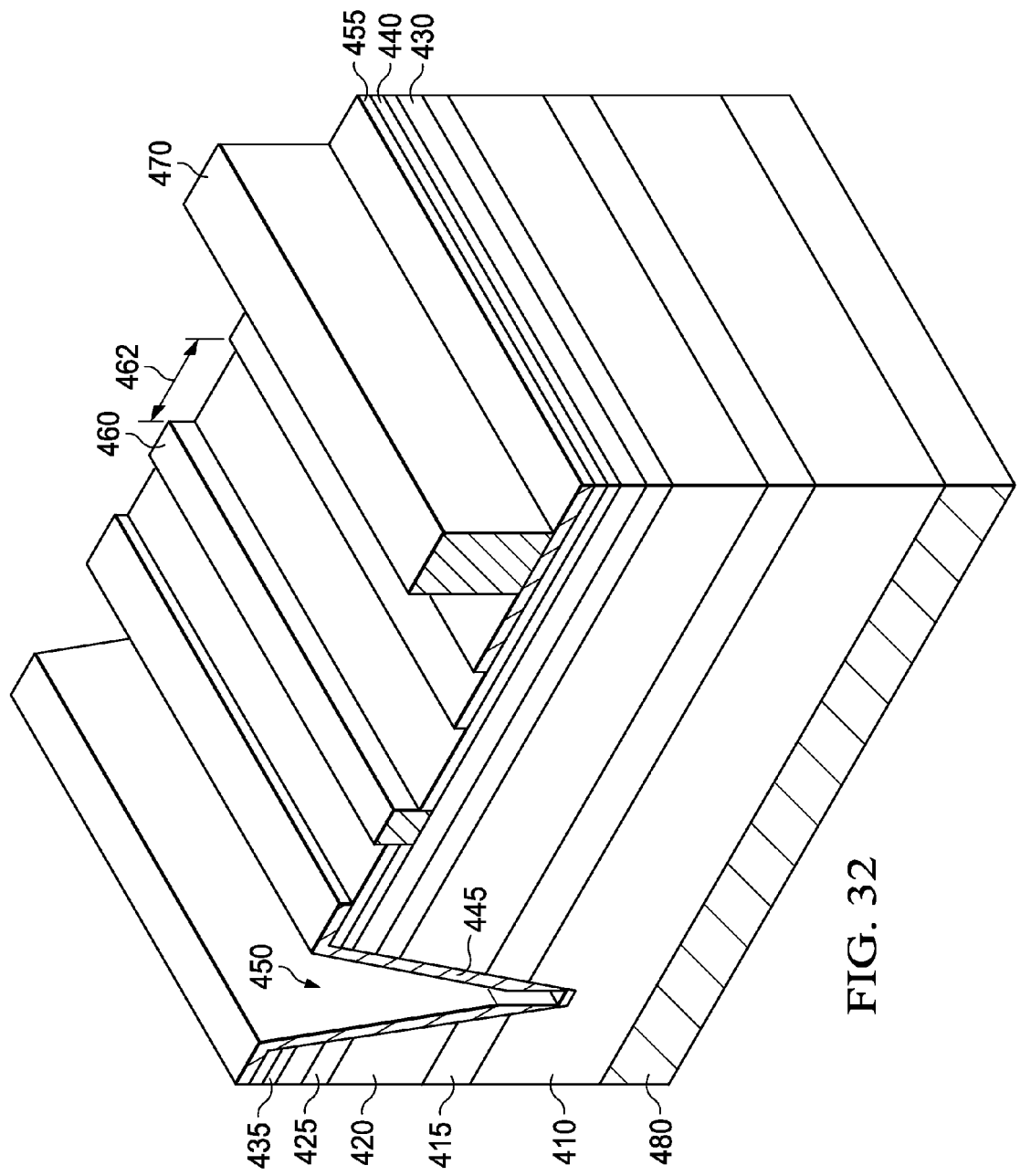

Turning now to FIGS. 31 and 32, illustrated are cross-sectional and perspective views of another embodiment of a semiconductor device (e.g., lateral FET) constructed according to the principles of the present invention. The lateral FET includes a highly conductive epitaxial buffer layer 410. Above the buffer layer 410 is a p-type doped isolation layer 415 that is epitaxially grown and formed sufficiently thin to prevent substantial recombination of minority carriers that might be injected therein during certain modes of operation of the lateral FET.

The isolation layer 415 forms a pair of back-to-back diodes (generally designated 417 in FIG. 31) at least in part with a region 420 formed thereabove and the buffer layer 410 (both of which include layers or portions thereof that are doped n-type) to substantially block current flow when the lateral FET is in a non-conducting state, particularly when a positive voltage is applied between the drain and source contacts thereof. The pair of back-to-back diodes differ from structures that dedicate active die area to build such a structure as illustrated in U.S. Pat. No. 5,956,578 entitled "Method of Fabricating Vertical FET with Schottky Diode," by Weitzel, et al., issued on Sep. 21, 1999, and U.S. Pat. No. 6,097,046 entitled "Vertical Field Effect Transistor and Diode," by Plumton, issued on Aug. 1, 2000, which are incorporated herein by reference. The aforementioned references employ structures that increase cost or resistance of the channel because active die area is taken away from the field-effect transistor for use by the diodes.

In short, the principles of the present invention create back-to-back diodes on a die with a source contact bonded directly to a highly conductive epitaxial layer (e.g., the buffer layer 410) without a separate structure that takes up additional die area or additional footprint beyond the structure of the field-effect transistor. To accommodate the intrinsic body diodes, special attention as described herein should be given to the design of the isolation layer 415 and the layers thereabout. Above the region 420 is a lateral channel region 425 made up of one or more lateral channels. The lateral channel(s) are thin, substantially undoped indium-gallium arsenide ("InGaAs") layers that are epitaxially deposited with about 20% indium to form lateral channel(s) with controllable conductivity. For a better understanding of an exemplary embodiment of the lateral channels see the description above with respect to FIG. 5, et seq.

Above the lateral channel region 425 is another region 430 that is epitaxially deposited including sub-layers of AlGaAsP (0.24 Al and 0.05 P) to provide additional free carriers (electrons) for modulation doping of the lateral channel region 425, and to provide a barrier for the carriers in the lateral channel region 425. An etch stop layer 435 embodied in a thin, doped AlAs epitaxial deposition is formed above the region 430. Layers of GaAs are epitaxially deposited above the etch stop layer 435 to form source and drain contact layers 440 for the lateral FET.

A source via (or trench) through the layers of the lateral FET down to the buffer layer 410 is provided to create a low-resistance contact between the lateral channel region 425 and the buffer layer 410. The walls of the source trench are sufficiently sloped so that a thin metal layer (generally designated 445) can be deposited on horizontal and semi-horizontal surfaces, preferably by a vacuum evaporation and deposition process. An electroplating process is thereafter performed to form a low-resistance source interconnect 450. A metal layer 455 is also provided to form a low-resistance ohmic contact for the drain. A gate 460 is thereafter patterned and formed preferably by a self-aligned process in a gate recess in the lateral FET. An enhanced gate-to-drain separation distance 462 between the gate 460 and drain formed in part by the source/drain contact layers 440 is illustrated herein.

A dielectric layer 465 is then formed about the lateral FET, preferably with a low dielectric constant material (e.g., BCB, polyimide, Si glass, or other flowable oxide) to preserve a performance of the lateral FET and to provide mechanical support for a drain contact thereabove. The dielectric layer 465 is then patterned and etched down to the metal layer 455 to form a drain post. An electroplating process is thereafter performed to form a drain post 470. Metallized top and bottom contacts (also referred to as drain and source contacts 475, 480, respectively) coupled to the drain post 470 and a bottom surface of the buffer layer 410, respectively, are sequentially deposited and preferably patterned on the top and bottom surfaces, respectively, of the lateral FET. As mentioned above, the source contact 480 may be provided following the removal of a substrate (not shown). As described with respect to the embodiment of the lateral FET above, selected layers of the lateral FET may include multiple sub-layers therein to further delineate respective features of the device.

Figure 33:
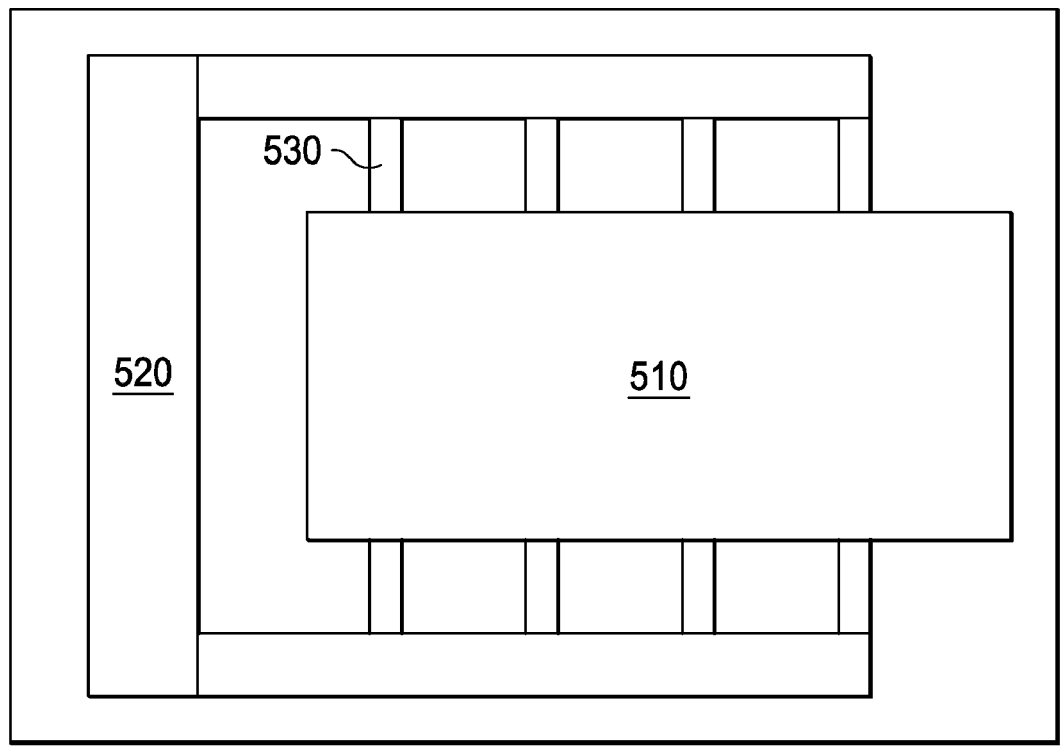
FIG. 33 illustrates a plan view of another embodiment of a semiconductor device constructed according to the principles of the present invention.

Turning now to FIG. 33, illustrated is a plan view of another embodiment of a semiconductor device (e.g., lateral FET) constructed according to the principles of the present invention. A drain contact 510 of the lateral FET provides a wide area surface covering a substantial portion of the die area, enabling a low-resistance contact to the drain. A gate contact 520 with gate extensions 530 contacts a gate of the lateral FET. The couplings (not shown) between the gate extensions 530 on a top surface of the die and the gate are made by plated vias through a dielectric layer using well understood masking, patterning, etching and deposition processes. For a more detailed explanation of an embodiment of the drain contact 510, gate and dielectric layer, see the description of the lateral FET as provided with respect to FIG. 5, et seq. A metallized source contact (not shown) preferably covers an area of the opposing die surface and is formed directly on an epitaxial layer such as a buffer layer to avoid the resistance of a substrate that would otherwise be present, as previously described hereinabove. Thus, the lateral FET with reduced area and low on-resistance is enabled by the device structure and methods of the present invention.

Figure 34:
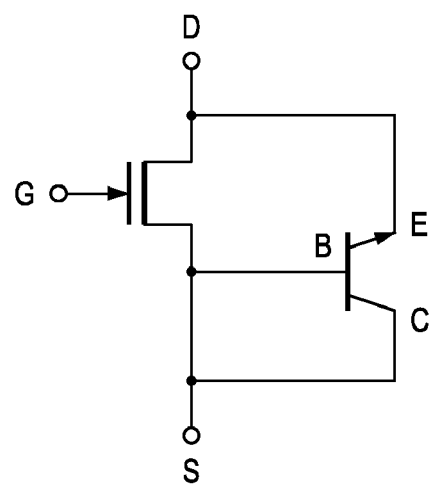
FIG. 34 illustrates an equivalent circuit diagram of a semiconductor device constructed according to the principles of the present invention.

Turning now to FIG. 34, illustrated is an equivalent circuit diagram of a semiconductor device (e.g., lateral FET) constructed according to the principles of the present invention. As described above, the lateral FET is formed on a conductive substrate and includes a drain contact D, gate contact G and a source contact S. An npn bipolar transistor (i.e., back-to-back diodes) is formed within the structure of the lateral FET and includes an emitter E, a base B and a collector C. The base B and collector C of the npn bipolar transistor are coupled to a source interconnect and source contact therefrom, which provides a short circuit across the base B and collector C. As a result, an intrinsic body diode is formed by the emitter-base junction of the npn bipolar transistor in parallel with the source and drain of the lateral FET. Thus, an intrinsic body diode is formed within the lateral FET with a cathode coupled to the drain contact D, and an anode coupled to the source contact S. Of course, oppositely doped semiconductor processes can be used to form the lateral FET, with corresponding changes to the emitter, base, and collector of the bipolar transistor.

The lateral FET as described above is readily operable as a depletion-mode FET. In other words, the channels are enabled to conduct when substantially zero volts is applied between the gate and source contacts thereof (i.e., for "substantially zero gate voltage"). A depletion-mode device is ordinarily expected to be pinched off with negative gate voltage, relying on the current-blocking character of a gate for negative applied voltage. If the gate voltage is raised above about 0.8 volts positive to further enhance the channel conductivity, then gate current is expected to flow. A modest gate current is not harmful to the operation of the lateral FET, and thus the device is ordinarily capable of operation with gate voltage less than about 0.8 volts, or at higher gate voltage with suitable provision to limit the gate current. Exemplary circuits employing depletion mode devices are illustrated and described in U.S. Patent Application Publication No. 2006/0198173, entitled "Control Circuit for a Depletion Mode Switch and Method of Operating the Same," to Rozman, published Sep. 7, 2006, 2006, which is incorporated herein by reference.

An enhancement-mode device can be produced or provided by several alternatives to the processing steps described hereinabove. For purposes of illustration, any modifications to the processing steps to attain an enhancement-mode device will be described with reference to the lateral FET illustrated and described with respect to FIGS. 5 to 30 above. One alternative is to reduce the top delta doping level to a selected level of about $1 \times 10^{12}$ cm$^{-2}$ instead of $4 \times 10^{12}$ cm$^{-2}$, which reduces the level of the free carriers in the lateral channels that can be used to increase channel resistance several orders of magnitude higher than a depletion-mode design with substantially zero gate voltage. It may not be necessary in practical circuit designs for the lateral FET to provide essentially an open circuit when the gate voltage is substantially zero. A careful engineering assessment of the proper doping levels for the layers should be made to determine the best trade-off of channel resistance for substantially zero gate voltage and the resulting on-resistance of the device for a positive gate voltage. The reduction of free carriers in the portion of the lateral channels outside the region of the gate resulting from reduced pulse doping may raise the on-resistance of the lateral FET. This effect can be reduced by selectively implanting the lateral channels with an n-type dopant in regions away from the gate.

Another alternative to preserve low on-resistance of an enhancement-mode device is to recess the gate through the gate recess closer to or proximate the lateral channels and provide higher pulse doping levels. An etch stop layer may be selectively formed under the gate to facilitate this option. This approach relies on the recessed gate metal forming a sufficiently deep depletion region in the lateral channels to provide the necessary device resistance for substantially zero gate voltage.

The lateral FET as described above includes an intrinsic body diode with its anode coupled to the source, and cathode to the drain. When the lateral FET is conducting, a positive current normally flows from source to drain through the lateral channels. When the lateral channels are not conducting and a negative potential is applied to the drain contact, an ohmic contact between the source interconnect and the buffer and isolation layers couples the respective layers together. The resistance of this ohmic contact can be adjusted by selecting a suitably high doping level for the isolation layer, thus providing an anode connection to the source for the intrinsic body diode. The n-type doped layers above (such as the spacer layer above the lateral channels) provide the cathode, and are substantially coupled to the drain.

Another mechanism for conduction through an intrinsic body diode relies on the isolation layer being sufficiently thin that electrons can diffuse therethrough, enabling conduction through a parasitic npn bipolar transistor formed by the substrate and the buffer layer (the collector), the isolation layer (the base), and overlying n-type layers such as the first and second drain contact layers (the emitter). If the thickness of the isolation layer is increased to be greater than the 1000 Å as previously described (preferably in the range of 5000 Å), then electron recombination in the isolation layer will be a dominant effect, and electrons injected from the drain will not successfully diffuse to the substrate. Conduction will occur laterally through the isolation layer to the metallized source contact. Competition between these two mechanisms for operation of the intrinsic body diode can occur, with the dominant effect depending on the thickness and doping of the isolation layer. A forward voltage drop of approximately 1.5 volts is expected for this diode. Localized implant doping to increase the doping level of the isolation layer in a region about the metallized source interconnect can be used to enhance the diode performance.

Design enhancement of a semiconductor device to provide higher breakdown voltage between source and drain with minimal increase in device on-resistance, formed according to the principles of the present invention, will now be described. The device described hereinabove with reference to FIGS. 5 to 30 provides a baseline design with an on-resistance of about 1.27 Ω·mm and an exemplary reverse drain-to-source voltage up to 20 volts, employing a gate-to-drain separation distance (see, e.g., gate-to-drain separation distance 377 of FIG. 21) of 1.5 μm. A preferable higher-voltage design will now be described providing an on-resistance of 2.19 Ω·mm and an exemplary reverse drain-to-source voltage up to 80 volts, employing a gate-to-drain separation distance of 2.5 μm. The results were obtained by simulation of fields and carrier flow on a scale of the device feature sizes using the commercially available simulation tool Silvaco®. Of course, the parameters described herein are for illustrative purposes only and the broad scope of the present invention is not so limited.

Ordinarily, for a field-effect transistor, on-resistance is expected to increase roughly as the 2.6 power of rated breakdown voltage. Thus, increasing the maximum reverse drain-to-source voltage from 20 volts to 80 volts should increase the on-resistance from 1.27 Ω·mm in the baseline case to approximately 47 Ω·mm for an 80 volts drain-to-source breakdown voltage rating. The on-resistance of 2.19 Ω·mm that was obtained by an exemplary enhancement for 80 volts is a significant reduction from ordinary expectation.

A key issue affecting maximum reverse drain-to-source breakdown voltage is the electric field in a region proximal the gate. One technique used in the industry to reduce a high electric field in a PHEMT or other semiconductor device is to introduce a "field plate" (i.e., a highly conductive structure preferably electrically coupled to the gate), such as a patterned metallic deposition, in a region of the device exhibiting such field. The advantage of field plates is to shift and reduce the peak electric field away from a region such as a gate edge (also spreading the electric filed), resulting in a higher maximum reverse drain-to-source breakdown voltage. However, disadvantages of field plates are the extra mask layer and processing steps required for its deposition (such as by sputtering) and associated costs, as well as increased on-resistance resulting from higher channel depletion in an area under a field plate, requiring a larger active device area to provide a required on-resistance.

Another general technique to increase the maximum device breakdown voltage is to increase the gate-to-drain separation distance. This can be accomplished by increasing the recess width between the gate and drain, which can reduce the electric field at the drain-facing edge of the gate. However, a disadvantage of increasing the gate-to-drain separation distance is, again, an increase in device on-resistance and device cost due to the enlarged dimensions thereof.

Substantial improvement in gate-to-drain voltage can be obtained for a compound semiconductor device as described herein without significantly increasing device on-resistance. Such improvement can be obtained by jointly enhancing gate-to-drain separation distance (see, e.g., gate-to-drain separation distance 377 of FIG. 21), increasing the thickness and decreasing the doping concentration of the first spacer layer 313 as illustrated in FIG. 9 and discussed above, and reducing the delta doping concentration of the top and bottom delta-doped layers proximate the lateral channels (e.g., reducing a delta doping concentration to about $1 \times 10^{12}$ cm$^{-2}$ to $3 \times 10^{12}$ cm$^{-2}$ of the first barrier layer 318 and the third spacer layer 326 as illustrated in FIGS. 9-11 and discussed above). In an alternative embodiment of the present invention that will now be described, a semiconductor device is advantageously formed with reduced on-resistance by reversing a portion of the sequence of processing steps as described hereinabove for the formation of a lateral FET.

Referring now to FIGS. 35 to 47, illustrated are cross-sectional views of another embodiment of a semiconductor device (e.g., a lateral FET) formed according to the principles of the present invention. The present embodiment of the lateral FET is constructed in substantially reverse order from the embodiment of the lateral FET illustrated and described with respect to FIGS. 5 to 30. Thus, for purposes of clarity, the layers and reference designators will hereinafter be provided in reverse order to more closely align with the layers and reference designators provided above. For instance, a second source/drain contact layer will be introduced before a first source/drain contact layer in accordance with constructing the lateral FET. The layers of the constructed lateral FET of the present embodiment, however, will be analogous to the layers of the constructed lateral FET illustrated and described above.

Figure 35:
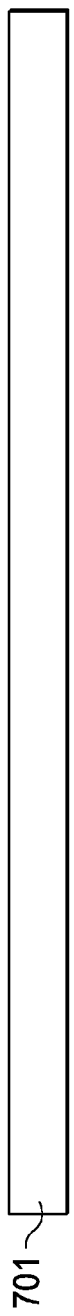
FIGS. 35 to 56 illustrate cross-sectional views of another embodiment of constructing a semiconductor device according to the principles of the present invention.

Beginning with FIG. 35, the lateral FET is formed on substrate 701 (e.g., a GaAs substrate). The substrate 701 is preferably semi-insulating for low cost since it will be removed during a later processing step. Optionally, the substrate 701 may be a doped (e.g., n-type doped) conductive layer (e.g., a conductive substrate). The substrate 701 may be chosen to be sufficiently thick such as 650 μm to provide mechanical support for semiconductor processing and handling, and may be supported by a further underlying medium.

If the substrate 701 is optionally doped, a preferred n-type doping material for GaAs is silicon ("Si"), but selenium ("Se"), tellurium ("Te") or other doping materials or combinations thereof may be employed within the broad scope of the present invention. Although the lateral FET described herein is GaAs based, alternative semiconductor materials may be employed to form the substrate 701 such as a semiconductor material based on indium-phosphide ("InP") as well as oppositely doped semiconductors with essential properties of related materials appropriately altered.

Figure 36:
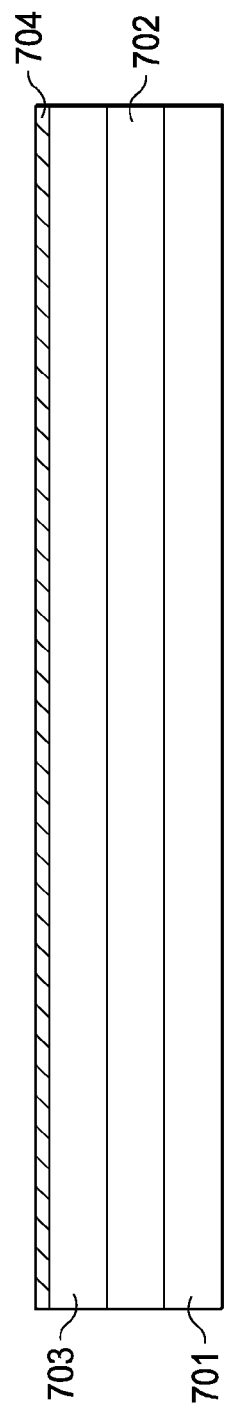

Referring now to FIG. 36, illustrated is a first epitaxial buffer layer 702 (e.g., an n+ epitaxial buffer layer) deposited above the substrate 701. The first epitaxial buffer layer 702 is preferably grown by molecular beam epitaxy or metal-organic chemical-vapor deposition to a preferred thickness of about 3000 angstroms ("Å"). A suitable n-type doping material such as Si may be employed, but alternatively Se, Te or other n-type dopant or combinations thereof may be employed in the epitaxial growth process. A preferred doping density is in the range of $7\times10^{17}$ to $5\times10^{18}$ cm$^{-3}$. The addition of the first epitaxial buffer layer 702 generally provides a more uniform crystal structure for further epitaxial depositions than an ordinary, doped or undoped GaAs substrate 701, and thus may be optionally included for the formation of the above layers for improved device characteristics.

Above the first epitaxial buffer layer 702 is a super lattice buffer layer 703, which is an alternating aluminum-gallium arsenide/gallium arsenide ("AlGaAs/GaAs") super lattice buffer that is sequentially deposited epitaxially to improve the smoothness of the surface of the crystal and to increase the mobility of the electrons in the channel to be formed thereabove. The presence of aluminum may also act as a "getter" to capture and disable oxygen atoms that may otherwise be present in the subsequent growth. The super lattice buffer layer 315 is deposited preferably with ten alternating layers of AlGaAs (0.24 Al), preferably about 185 Å thick, and GaAs, preferably about 15 Å thick. The total thickness of the super lattice buffer layer 315 is approximately 2000 Å.

Following deposition of the super lattice buffer layer 703, a first etch stop layer 704 is deposited thereabove. The first etch stop layer 704 is embodied in a thin aluminum-arsenide ("AlAs"), aluminum-gallium-arsenide ("AlGaAs"), indium-phosphide ("InP"), or indium-gallium-phosphide ("InGaP") epitaxial deposition. Chemical-vapor deposition or other vacuum deposition process such as molecular beam epitaxy can be used for formation of the first etch stop layer 704, using techniques well known in the art. When an aluminum-arsenide deposition is used for the first etch stop layer 704, a relatively higher concentration of aluminum would typically be used to provide a more robust etch stop layer for a subsequent etching process. The first etch stop layer 704 provides an etch stop for substantially complete removal of the substrate 701, the first epitaxial buffer layer 702 and the super lattice buffer layer 703 in a later processing step. The first etch stop layer 703 is preferably about 25 to 500 Å thick, and can be optionally doped n-type with a doping level approximately in the range of $1\times10^{17}$ to $5\times10^{18}$ cm$^{-3}$ or left undoped.

Figure 37:
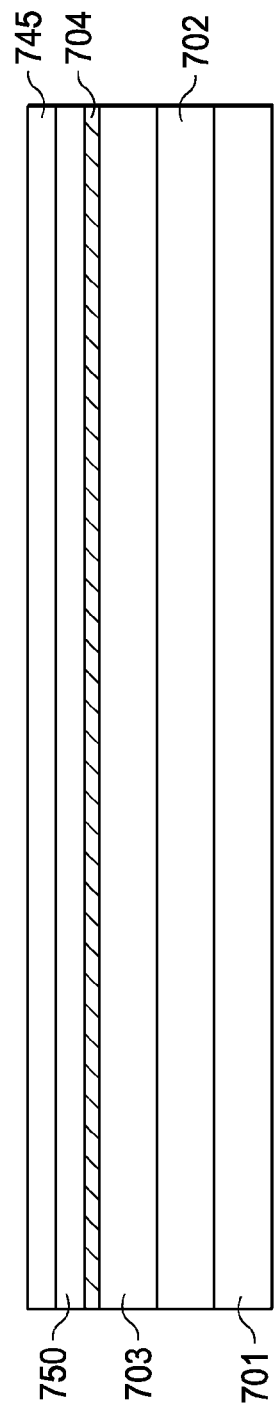

Turning now to FIG. 37, layers of GaAs are epitaxially deposited above the first etch stop layer 704 to form source/drain contact layers for the lateral FET. A second source/drain contact layer 750 of about 500 Å of a heavily doped n+ layer of GaAs is epitaxially deposited on the first etch stop layer 704 with a doping level in the range of $1\times10^{18}$ to $1\times10^{19}$ cm$^{-3}$ to improve formation of ohmic contacts for the source and drain and to reduce resistance in the source-to-gate and drain-to-gate regions of the channels. Then, a first source/drain contact layer 745 of about 300 Å of an n-type doped layer of GaAs is epitaxially deposited above the second source/drain contact layer 750, preferably using Si as the dopant with a doping level in the range of $1\times10^{17}$ to $1\times10^{18}$ cm$^{-3}$.

Figure 38:
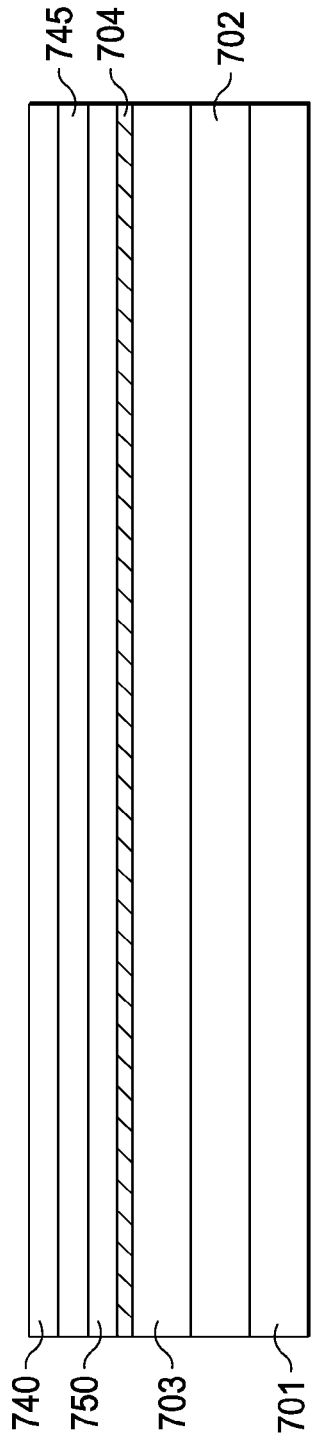

Turning now to FIG. 38, a second etch stop layer 740 embodied in a thin aluminum-arsenide ("AlAs"), indium-phosphide ("InP"), or indium-gallium-phosphide ("InGaP") epitaxial deposition is formed above the first source/drain contact layer 745. The second etch stop layer 740 provides an etch stop for a later, trench-forming process for GaAs layers to be further deposited and doped thereabove. The second etch stop layer 740 is preferably about 25 Å thick and can be doped n-type with a doping level in the range of $1\times10^{17}$ to $5\times10^{18}$ cm$^{-3}$ or undoped.

Figure 39:
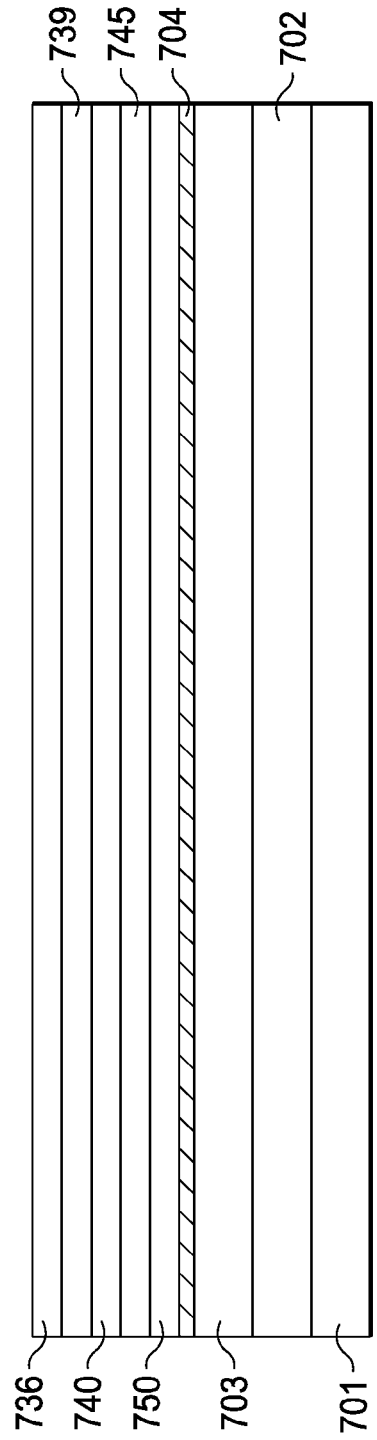

Turning now to FIG. 39, a recess layer 739 of GaAs is then epitaxially deposited on the second etch stop layer 740, preferably at about 230 Å and Si-doped with a doping level in the range of $1\times10^{17}$ to $5\times10^{17}$ or undoped. A second barrier layer 736 located above the recess layer 739 (embodied in an aluminum-gallium arsenide layer) is then epitaxially deposited at about 210 Å with an n-doping level in the range of $1\times10^{17}$ to $5\times10^{17}$ cm$^{-3}$ or undoped. An n-pulse doping with Si ("delta doped"), preferably to a doping level of about $4\times10^{12}$ cm$^{-2}$, is thereafter performed thereon to supply the free carriers to the channel thereabove by the mechanism of modulation doping.

Figure 40:
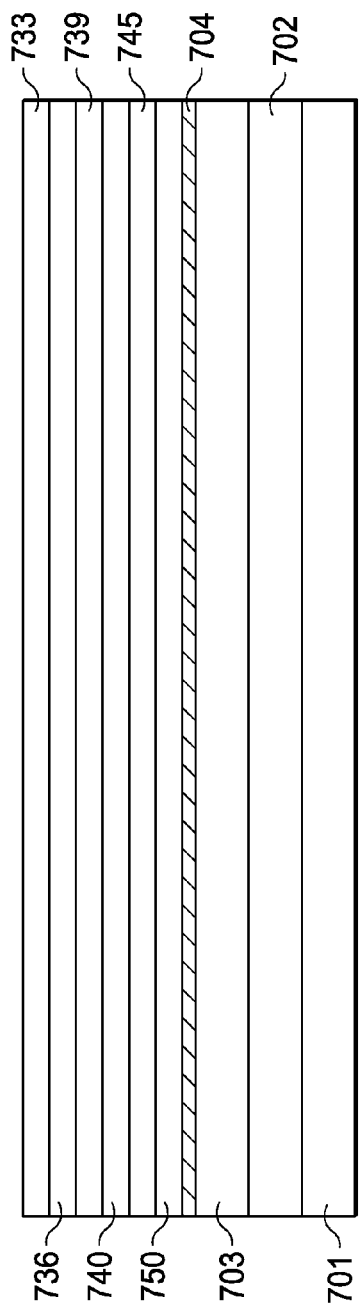

Turning now to FIG. 40, a seventh spacer layer 733 [e.g., a substantially undoped AlGaAsP (0.24 Al and 0.05 P) spacer] is then epitaxially deposited at approximately 40 Å above the second barrier layer 736 to separate the effects of dopants from the channel, thereby separating the free carriers from the ionized sites and improving electron mobility therein.

Figure 41:
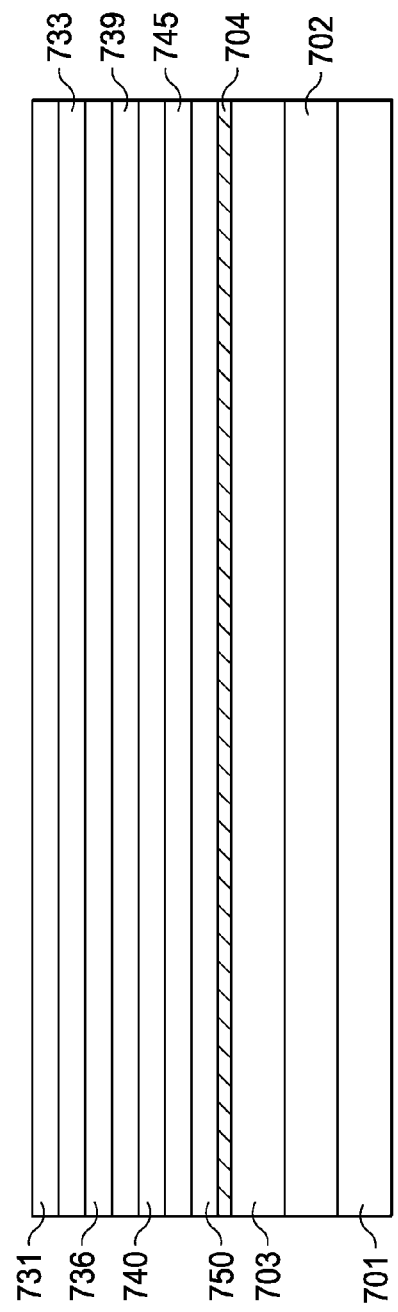

Turning now to FIG. 41, above the seventh spacer layer 733 is a thin, indium-gallium arsenide ("InGaAs") layer that is epitaxially deposited with about 20% indium to form a third lateral channel 731 with controllable conductivity. Again, due to the substantial lattice mismatch between GaAs and InGaAs, the third lateral channel 731 is inherently lattice-strained and is preferably less than about 100 Å to reduce lattice dislocations and formation of polycrystalline structure in the layers to be deposited thereabove.

Figure 42:
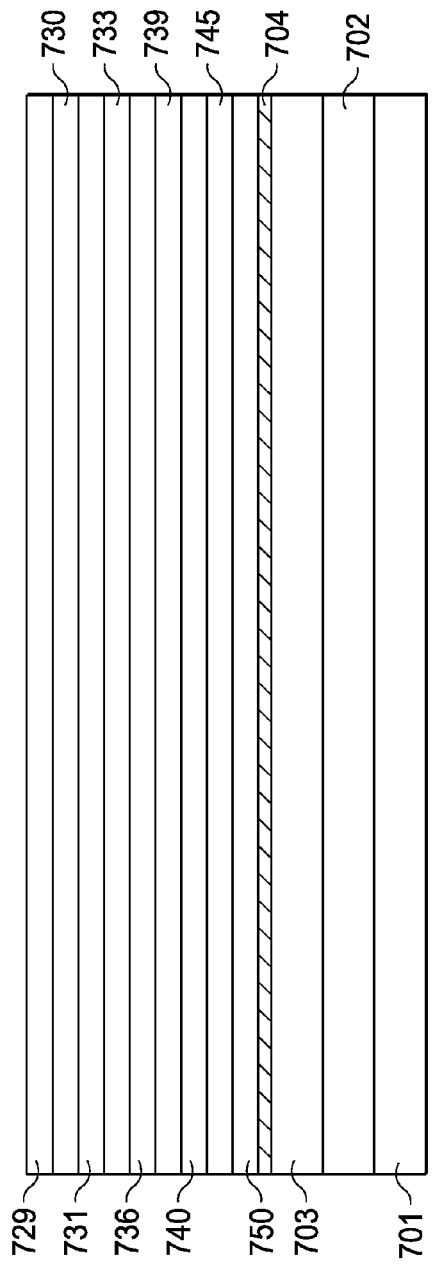

Turning now to FIG. 42, a sixth spacer layer 730 [e.g., a substantially undoped AlGaAsP (0.24 Al and 0.05 P) spacer] is then epitaxially deposited at approximately 40 Å above the third lateral channel 731 to separate the effects of dopants from the channel, thereby separating the free carriers from the ionized sites and improving the electron mobility therein. An n-pulse doping with Si ("delta doped"), preferably to a level of about $4\times10^{12}$ cm$^{-2}$, is thereafter performed thereon to supply free carriers to the third lateral channel 731 below and to a second lateral channel to be deposited thereabove by the mechanism of modulation doping. A fifth spacer layer 729 [e.g., a substantially undoped AlGaAsP (0.24 Al and 0.05 P) spacer] is then epitaxially deposited at approximately 40 Å above the sixth spacer layer 730 to separate the effects of dopants from a second lateral channel to be deposited thereabove, again separating free carriers from the ionized sites and improving electron mobility of a second lateral channel.

Figure 43:
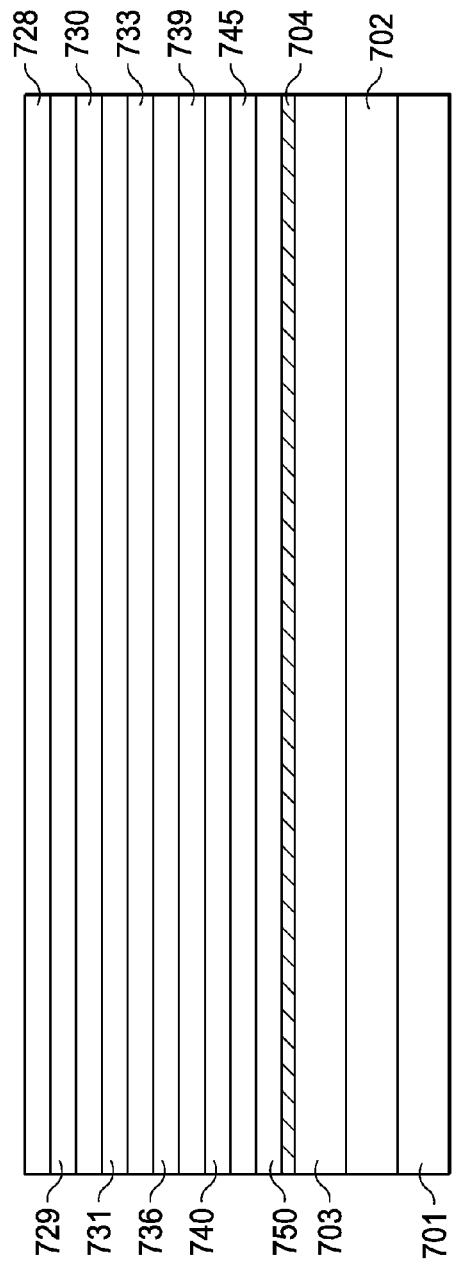

Turning now to FIG. 43, above the fifth spacer layer 729 is a thin, indium-gallium arsenide ("InGaAs") layer that is epitaxially deposited with about 20% indium to form a second lateral channel 728 with controllable conductivity. Again, due to the substantial lattice mismatch between GaAs and InGaAs, the second lateral channel 728 is inherently lattice-strained and is preferably less than about 100 Å to prevent lattice dislocations and formation of polycrystalline structure in the layers to be deposited thereabove.

Figure 44:
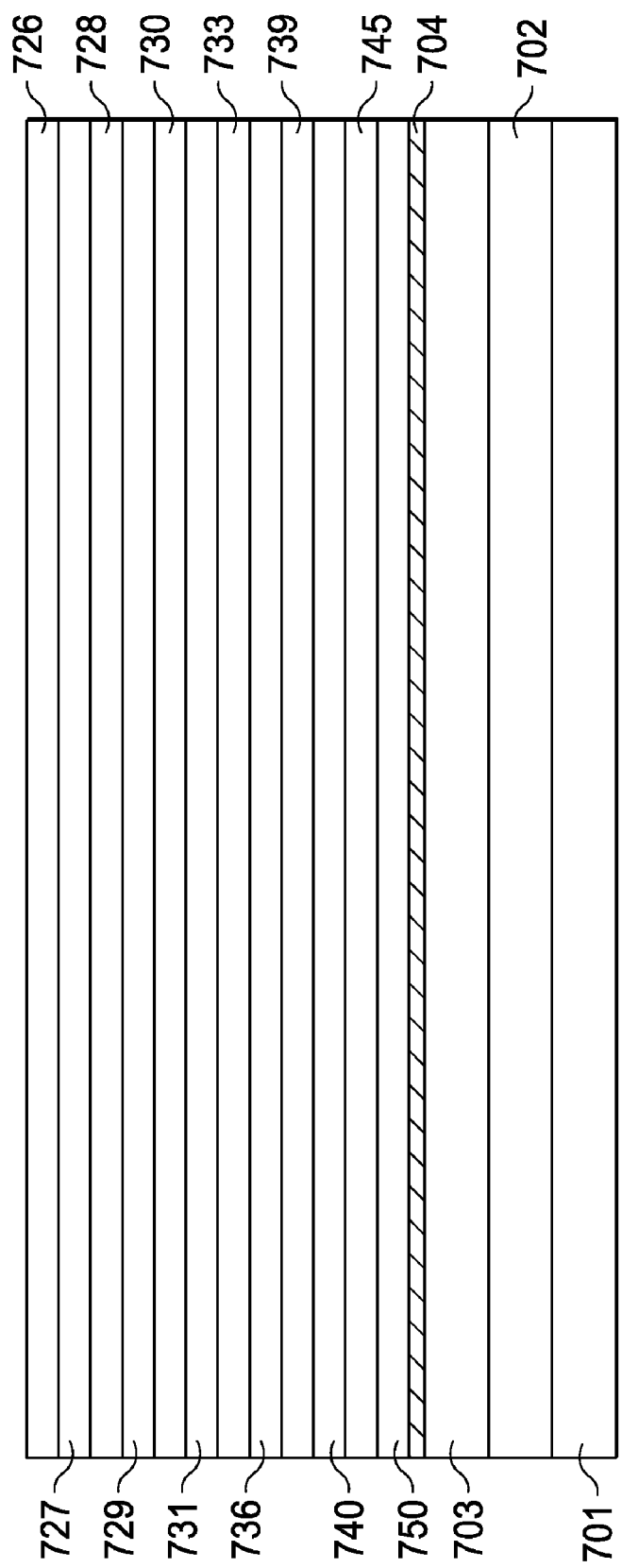

Turning now to FIG. 44, a fourth spacer layer 727 [e.g., a substantially undoped AlGaAsP (0.24 Al and 0.05 P) spacer] is then epitaxially deposited at approximately 40 Å above the second lateral channel 728 to separate the effects of dopants from the channel, thereby separating the free carriers from the ionized sites and improving the electron mobility therein. An n-pulse doping with Si ("delta doped"), preferably to a level of about $4\times10^{12}$ cm$^{-2}$, is thereafter performed thereon to supply free carriers to the second lateral channel 728 below and to a first lateral channel to be deposited thereabove by the mechanism of modulation doping. A third spacer layer 726 [e.g., a substantially undoped AlGaAsP (0.24 Al and 0.05 P) spacer] is then epitaxially deposited at approximately 40 Å above the fourth spacer layer 727 to separate the effects of dopants from a first lateral channel to be deposited thereabove, again separating free carriers from the ionized sites and improving electron mobility of a second lateral channel.

Figure 45:
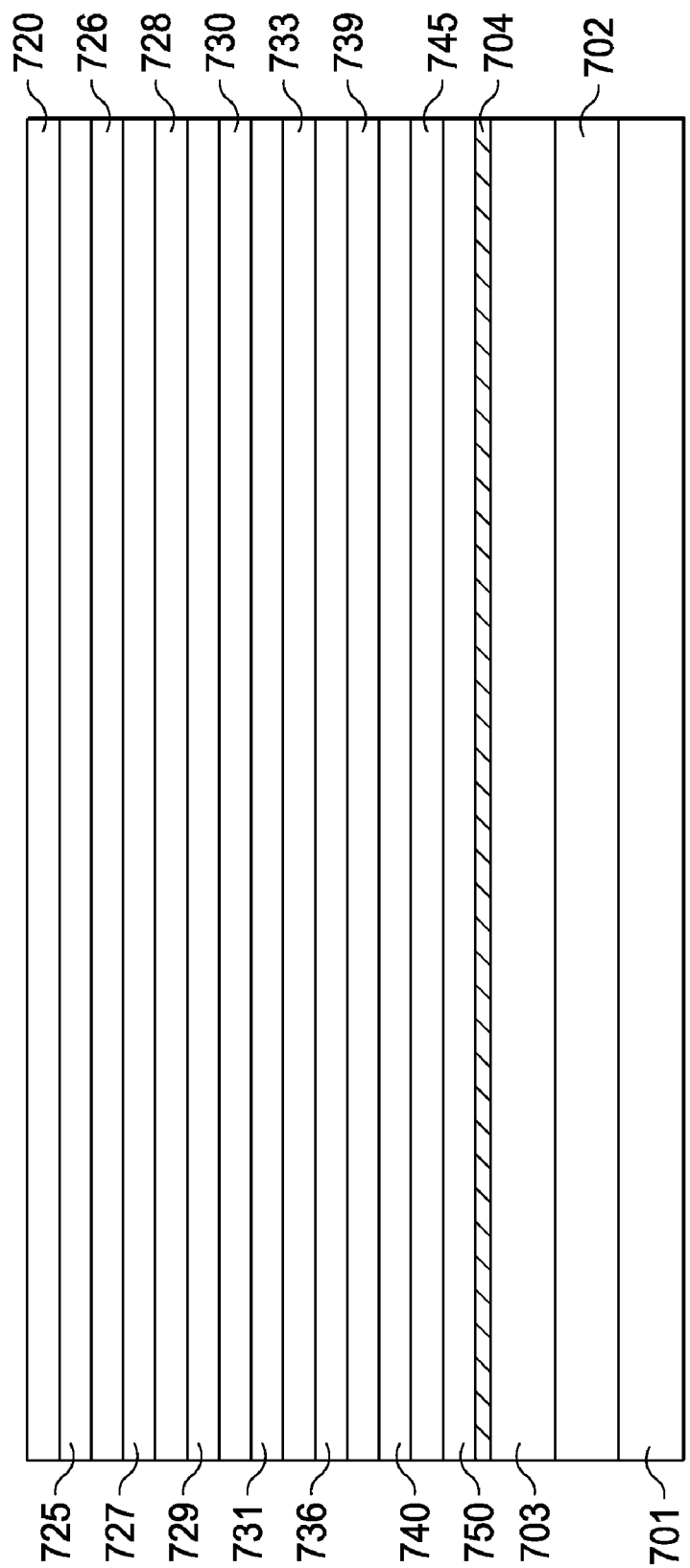

Turning now to FIG. 45, above the third spacer layer 726 is a thin, indium-gallium arsenide ("InGaAs") layer that is epitaxially deposited with about 20% indium to form a first lateral channel 725 with controllable conductivity. Due to the substantial lattice mismatch between GaAs and InGaAs, the first lateral channel 725 is inherently lattice-strained (i.e., it is "pseudomorphic") and is preferably less than about 100 Å to prevent lattice dislocations and formation of polycrystalline structure in the layers to be deposited thereabove. The lattice-strained channel provides higher carrier mobility owing to a reduced effective mass of the carriers. The first lateral channel 725 provides the controllable conduction mechanism between the source and drain of the lateral FET and provides a modulation-doped channel with reduced crystalline irregularities for the free carriers supplied by adjacent layers. A second spacer layer 720 is undoped and deposited at about 40 Å to provide a spacer layer separating the free carriers in the first lateral channel 725 from ionized impurity sites. An n-pulse doping with Si ("delta doped"), preferably to a level of about $4 \times 10^{12}$ cm$^{-2}$, is performed on the second spacer layer 720 to induce additional free electrons with enhanced mobility that migrate across the second spacer layer 720 to the first lateral channel 725.

Figure 46:
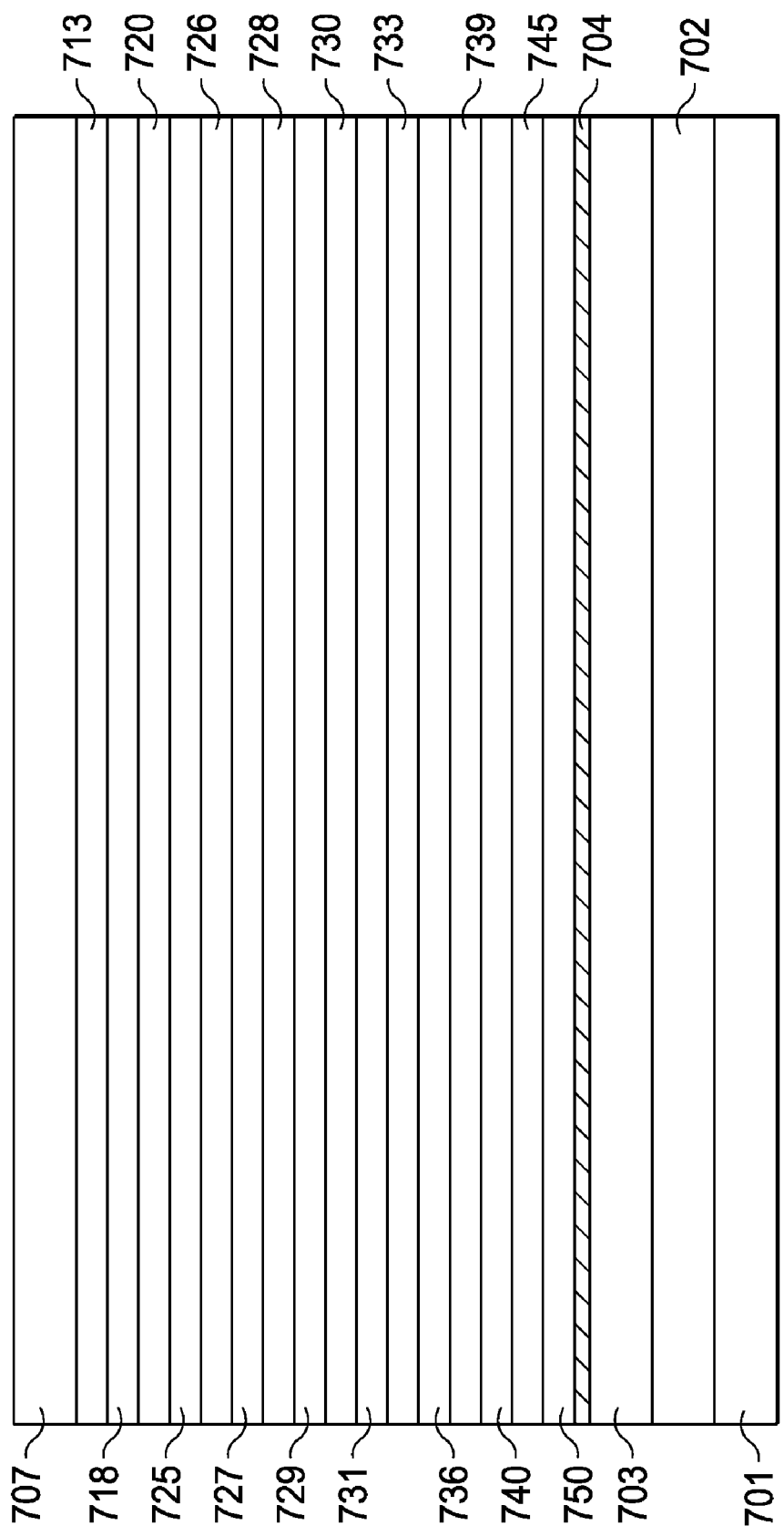

Turning now to FIG. 46, above second spacer layer 720, a first barrier layer 718 (embodied in an undoped AlGaAs layer) is then epitaxially deposited at about 210 Å with an n-doping level in the range of $1 \times 10^{17}$ to $5 \times 10^{17}$ cm$^{-3}$ or undoped. Above the first barrier layer 718, a first spacer layer 713 is a thick, but lightly doped p-type GaAs layer that is epitaxially deposited at about 10000 Å and preferably lightly doped to about $1 \times 10^{15}$ cm$^{-3}$. The thickness of the first spacer layer 713 may be increased and its doping density decreased to provide a higher breakdown voltage for the lateral FET. The first spacer layer 713 limits an internal electric field within the lateral FET and helps to limit breakdown when the lateral FET is transitioned to a non-conducting state. As a result, an applied voltage is substantially blocked between the source and drain terminals thereof. The first spacer layer 713 is lightly doped and sufficiently thick, such as 5000 Å to 25000 Å, to provide a sufficiently high voltage blocking capability for the lateral FET. Different layer thickness ranging from 5000 Å to 25000 Å and doping levels such as $1 \times 10^{15}$ cm$^{-3}$ to $5 \times 10^{16}$ cm$^{-3}$ may be used depending on, for example, the appropriate level of voltage blocking necessary for the lateral FET. An undoped layer or a lightly doped n-type layer can also be used in place of the lightly doped p-type layer.

Above the first spacer layer 713 is an isolation layer (e.g., a p-type doped isolation layer) 707 that is epitaxially grown and formed sufficiently thin to prevent substantial recombination of minority carriers that might be injected therein during certain modes of operation of the lateral FET. A preferred thickness of the isolation layer 707 is approximately 1000 Å and a preferred dopant is carbon with a doping density between about $5 \times 10^{18}$ cm$^{-3}$ to $5 \times 10^{19}$ cm$^{-3}$. A thickness of the isolation layer 707, however, can range from about 300 Å to 2000 Å and beyond, and may be deposited with a doping density roughly inversely proportional to the thickness.

Figure 47:
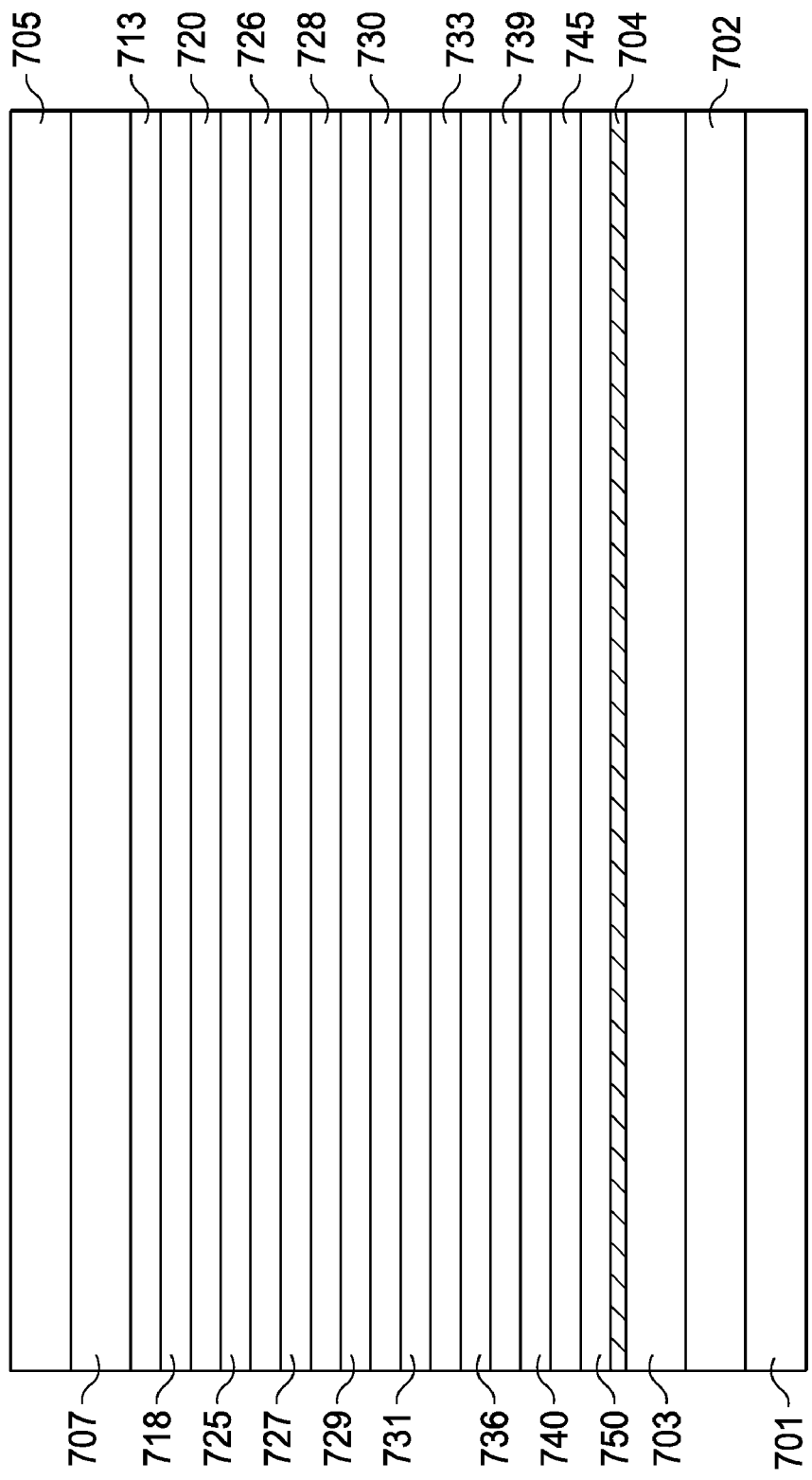

Turning now to FIG. 47, above the isolation layer 707 is a second epitaxial buffer layer (e.g., an n+ epitaxial buffer layer) 705 that is preferably grown by molecular beam epitaxy or metal-organic chemical-vapor deposition to a thickness of about 3000 angstroms ("Å"). A suitable n-type doping material such as Si may be employed, but alternatively Se, Te or other n-type dopant or combinations thereof may be employed in the epitaxial growth process. A preferred doping density is in the range of $7 \times 10^{17}$ to $5 \times 10^{18}$ cm$^3$. The addition of the second epitaxial buffer layer 705 provides a highly doped and highly conductive layer for later deposition of a metal contact thereon to form a low resistance, ohmic source contact. While the second epitaxial buffer layer 705 may be 3000 Å, a thicker layer may be grown to provide increased rigidity of the die after a later thinning step described below regarding removal of the substrate. The added on-resistance of the device as a result of making the second epitaxial buffer layer 705 thicker is not significant. The thickness of the second epitaxial buffer layer 705 can be reduced to less than 1000 Å to provide further reduction of substrate resistance in the direction of carrier flow with appropriate device handling precautions to prevent breakage. Preferably, the thickness of the second epitaxial buffer layer 705 is less than five μm to provide low electrical resistance to carrier flow vertically through the layer.

Figure 48:
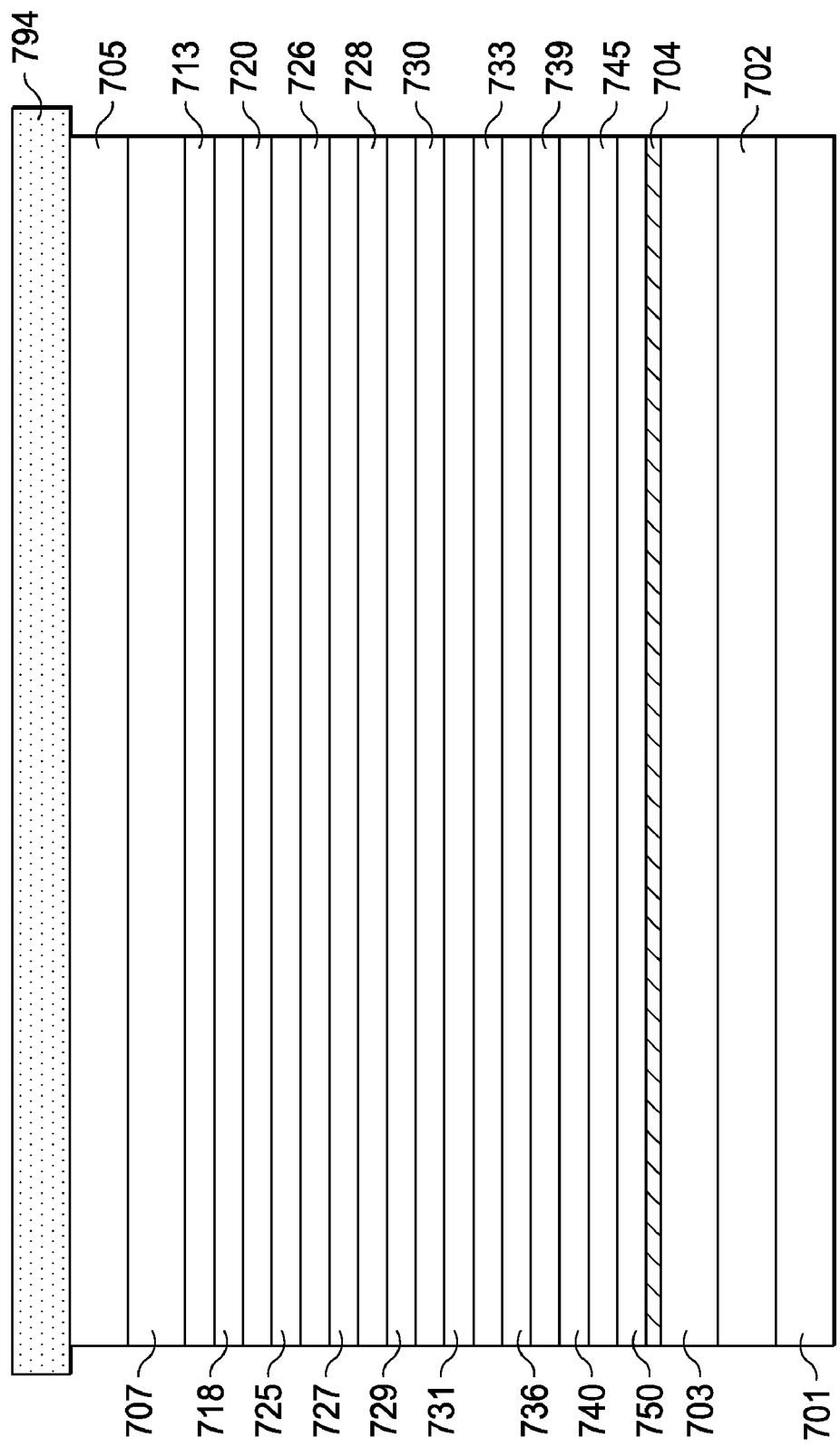
Figure 49:
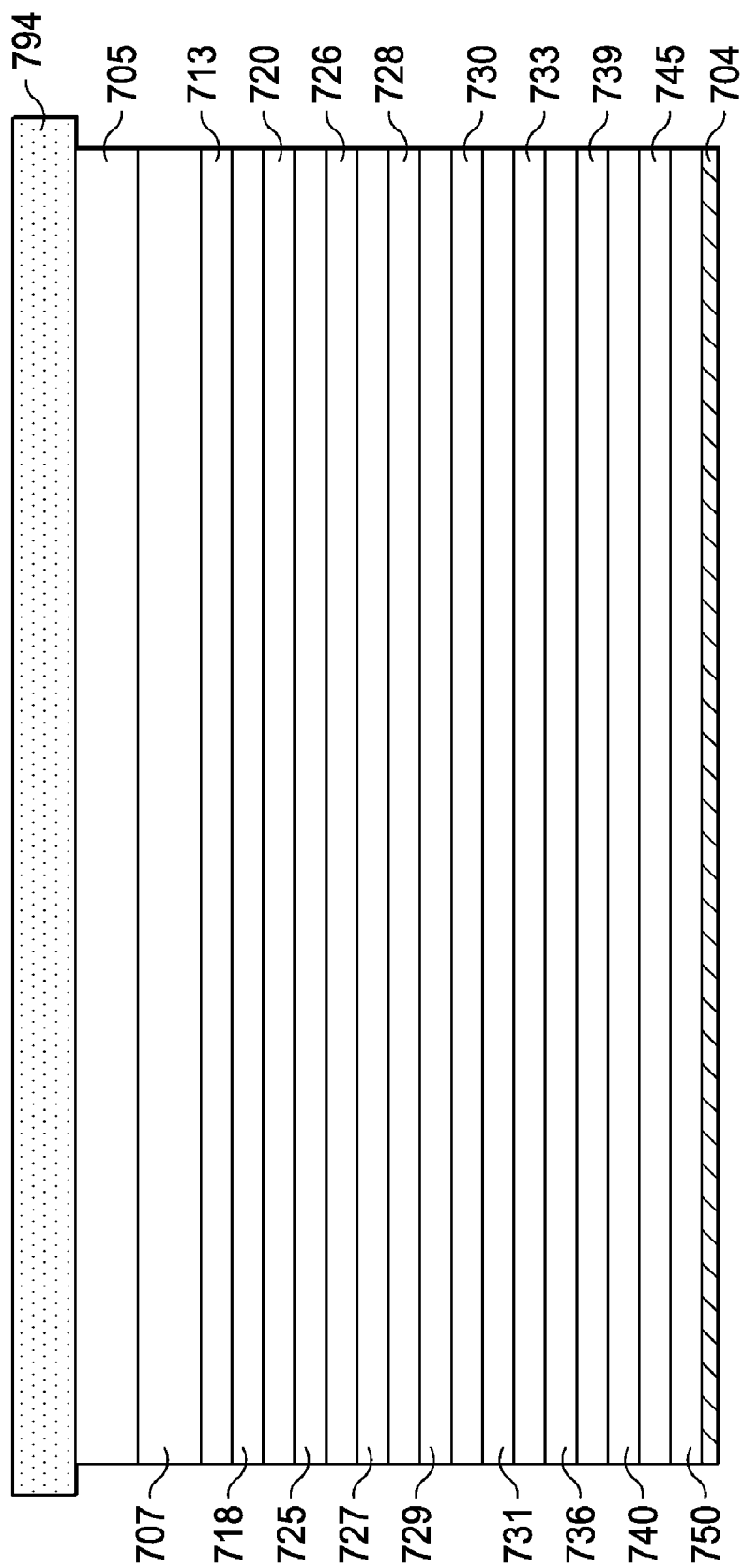

Turning now to FIG. 48, the wafer is removably bonded onto a first carrier 794 (e.g., a sapphire, aluminum oxide carrier), with the substrate 701 exposed. Suitable bonding materials include high-temperature wax or tape, as commonly used in the art. The wafer substrate 701, the first epitaxial buffer layer 702 and the super lattice buffer layer 703 are then thinned, initially by grinding and then by wet etching, using techniques similar to those used for standard wafer thinning. After the bulk of the substrate 701, the first epitaxial buffer layer 702 and the super lattice buffer layer 703 are removed, the remainder of the thinning can be performed with a dry etching process, such as a dry etching with fluorine-based gas, that has high throughput and is highly selective to the first etch stop layer 704. A fluorine-based etch can form a protective surface (AlF$_3$) across the first etch stop layer 704 during a dry-etching process. The dry etch should be performed with high uniformity across the wafer, using techniques well known in the art. The result of these etching processes is complete removal of the substrate 701, the first epitaxial buffer layer 702 and the super lattice buffer layer 703 as illustrated in FIG. 49, leaving the first etch stop layer 704 as the outer, exposed layer of the wafer.

Figure 50:
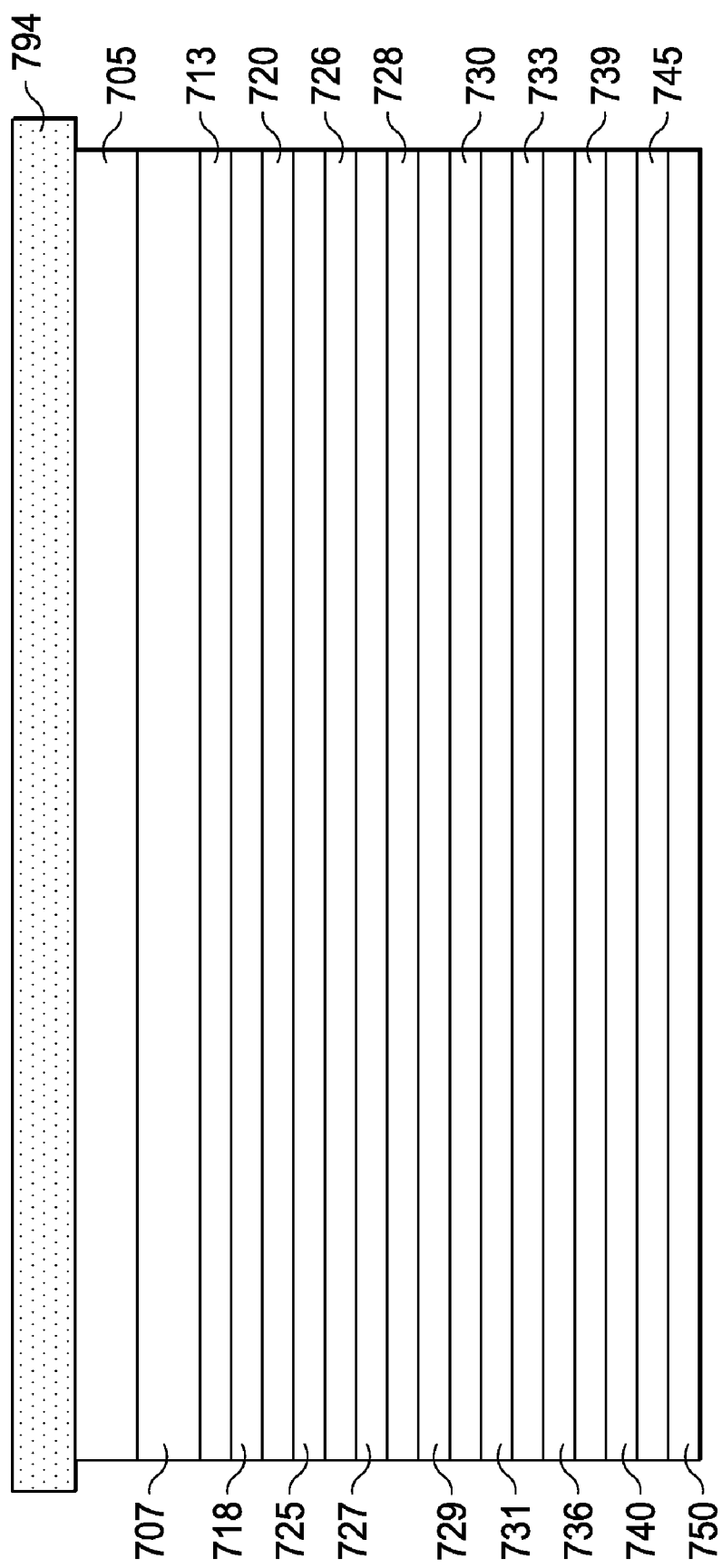

Turning now to FIG. 50, the first etch stop layer 704 is removed using a wet etching such as a hydrochloric acid ("HCl")-based etch that is selective to gallium arsenide, exposing thereby the second source/drain contact layer 750. At this point the PHEMT epitaxial structure of the wafer is exposed, and PHEMT wafer processing can be continued to define device structure.

Figure 51:
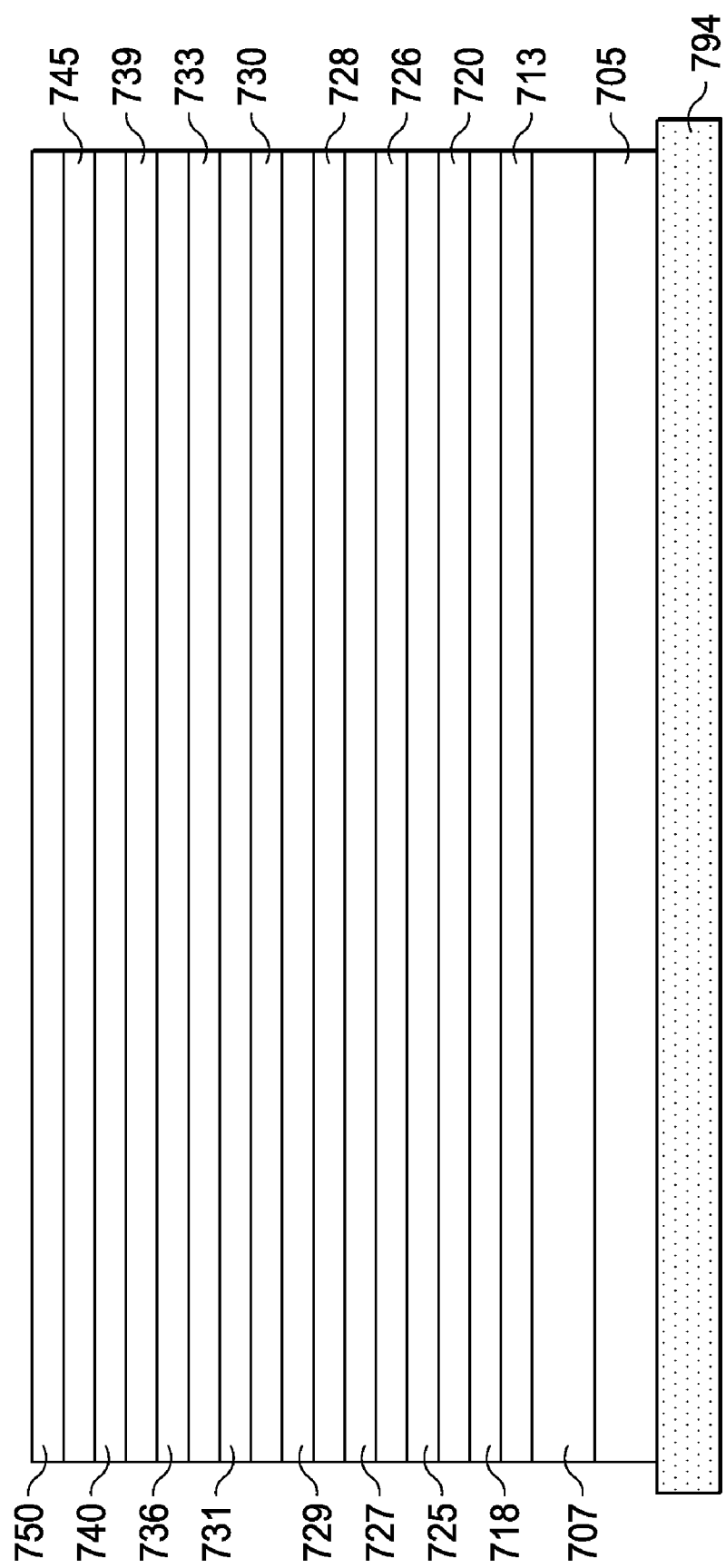
Figure 52:
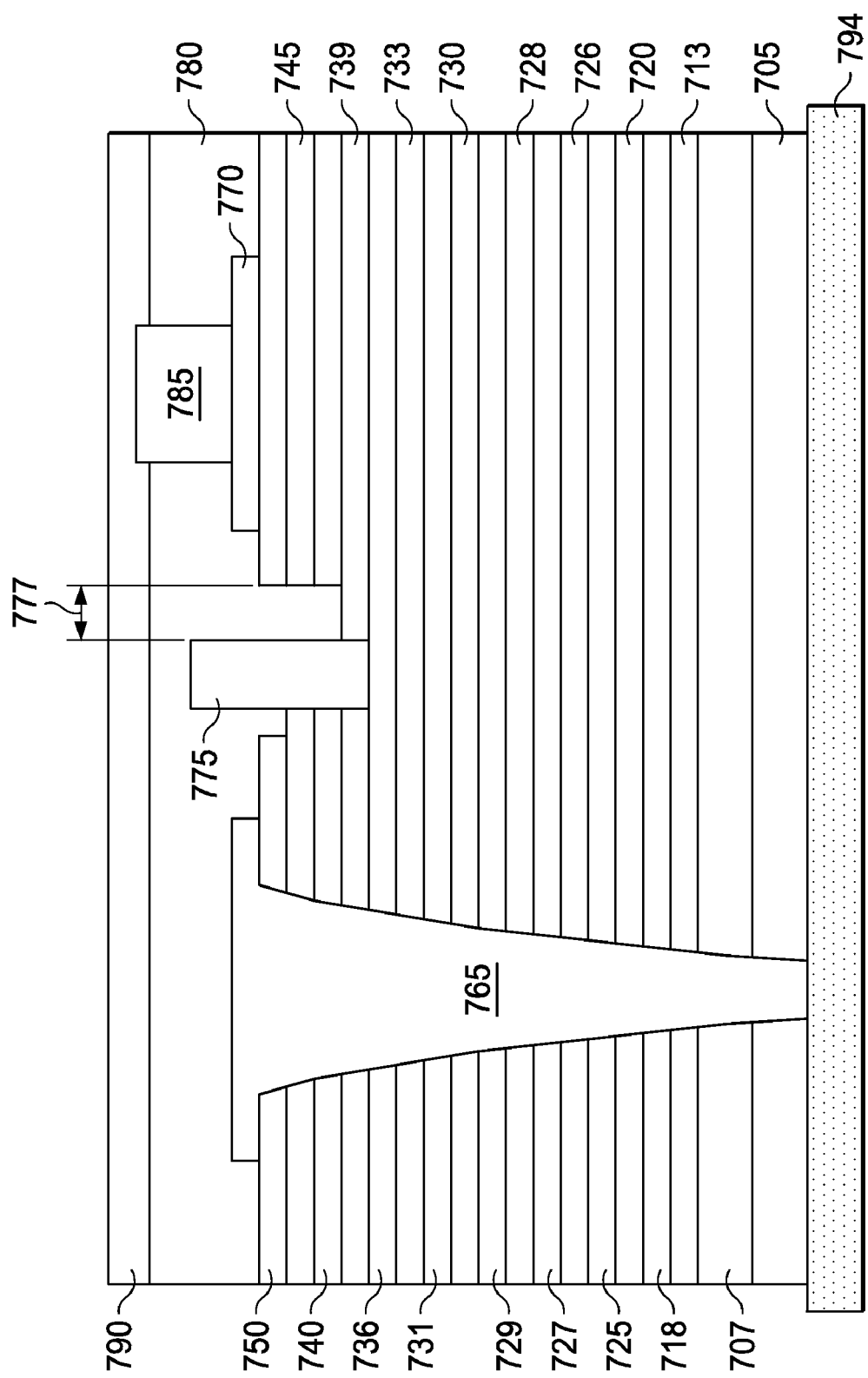

Turning now to FIG. 51, the lateral FET of FIG. 50 is physically inverted and prepared for further processing steps. At this point in the processing sequence, the substrate 701, the first epitaxial buffer layer 702, the super lattice buffer layer 703 and the first etch stop layer 704 have been removed. The wafer is now mechanically supported by the first carrier 794 in place of the aforementioned layers, and with the second source/drain contact layer 750 exposed on the wafer's top surface. The structure of the device corresponds with the structure illustrated and described with reference to FIG. 13 (but with the removal and replacement of the aforementioned layers in the presently discussed device). Further processing steps corresponding to the steps illustrated and described with reference to FIGS. 14 to 25 may now be performed on the device illustrated in FIG. 52, supported now by the first carrier 794, and will not be repeated in the interest of brevity. The result of these processing steps is illustrated in FIG. 52, complete with source interconnect 765, metal layer 770, gate 775, drain post 785, dielectric layer 780, and metal drain contact 790. The present embodiment also illustrates a gate-to-drain separation distance 777.

In a preferred embodiment as illustrated in FIG. 52, the source interconnect 765 is formed to the bottom of the second epitaxial buffer layer 705 to provide a path with electrical low resistance to a metal source contact. In an optional further embodiment, an etch stop layer (not shown) can be formed on the outside surface of the second epitaxial buffer layer 705 at an appropriate step in the processing sequence (i.e., after the second epitaxial buffer layer 705 is formed), and later removed, to provide a mechanism to controllably form the trench for the source interconnect 765 entirely through the second epitaxial buffer layer 705. In addition to low electrical resistance that can be advantageously achieved by extending the source interconnect 765 to the bottom of the epitaxial buffer layer 705, the thermal resistance of the device is also thereby enhanced.

Figure 53:
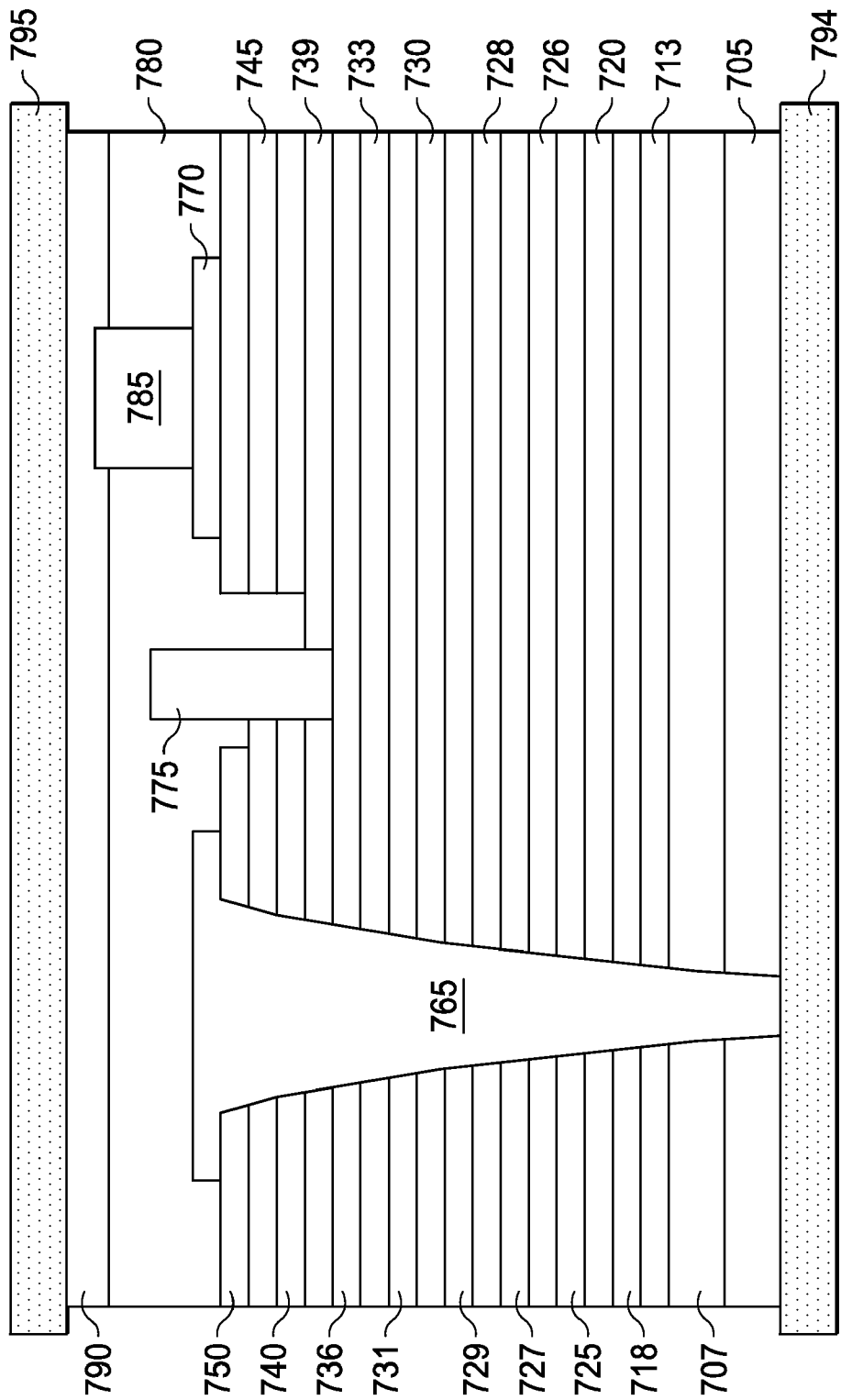
Figure 54:
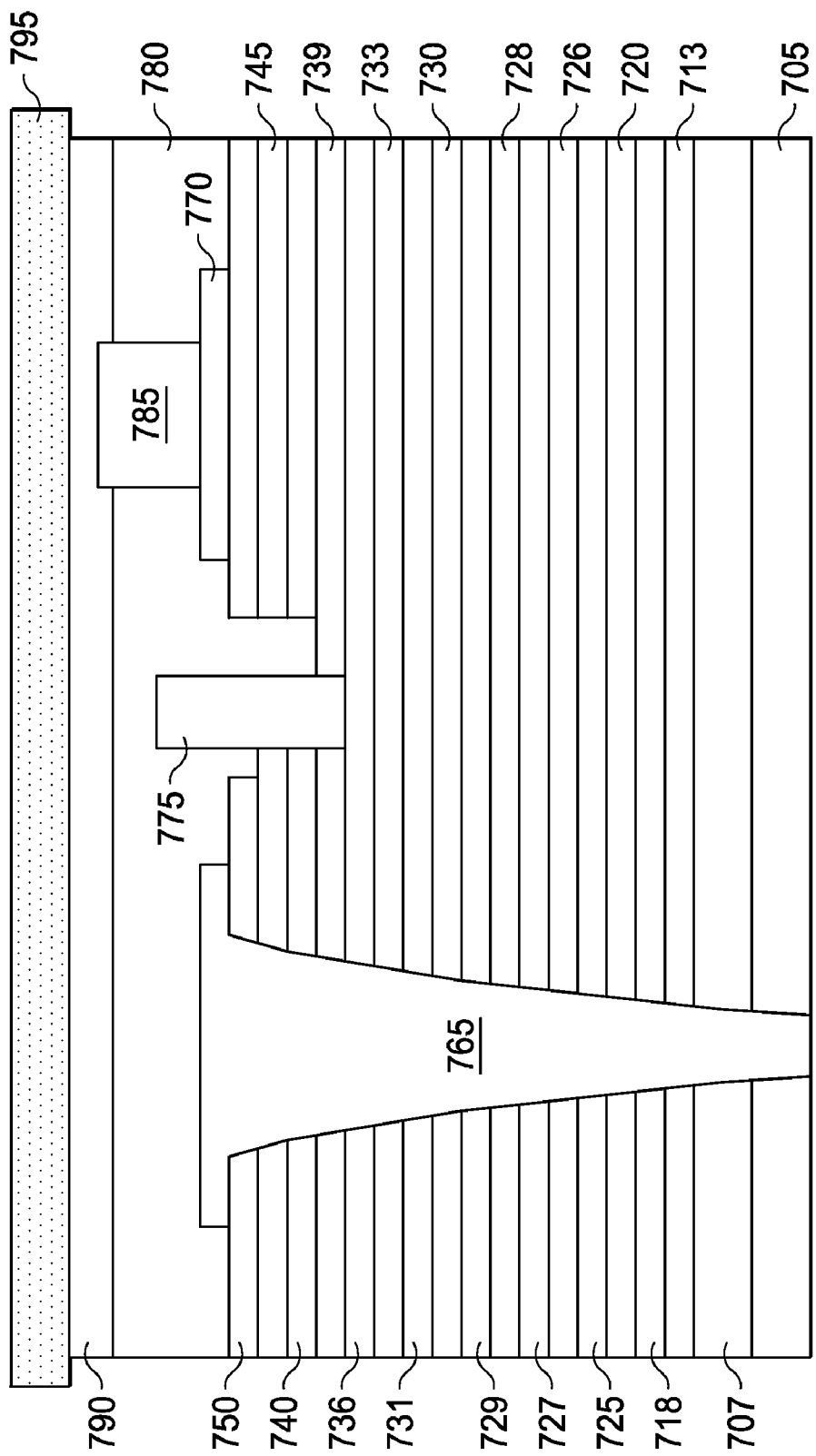

Turning now to FIG. 53, illustrated is the lateral FET with a second carrier 795 (e.g., a sapphire aluminum oxide carrier) removably bonded to the exposed surface of the wafer. Suitable releasable bonding materials that accommodate separation of a carrier from a wafer include high-temperature wax or tape, as commonly used in the art. The wafer is bonded to the second carrier 795 to provide mechanical support during and after removal of the first carrier 794. With suitable mechanical protection to the wafer against die breakage, bonding to the second carrier 795 is an optional step. The first carrier 794 is then removed as illustrated in FIG. 54.

Figure 55:
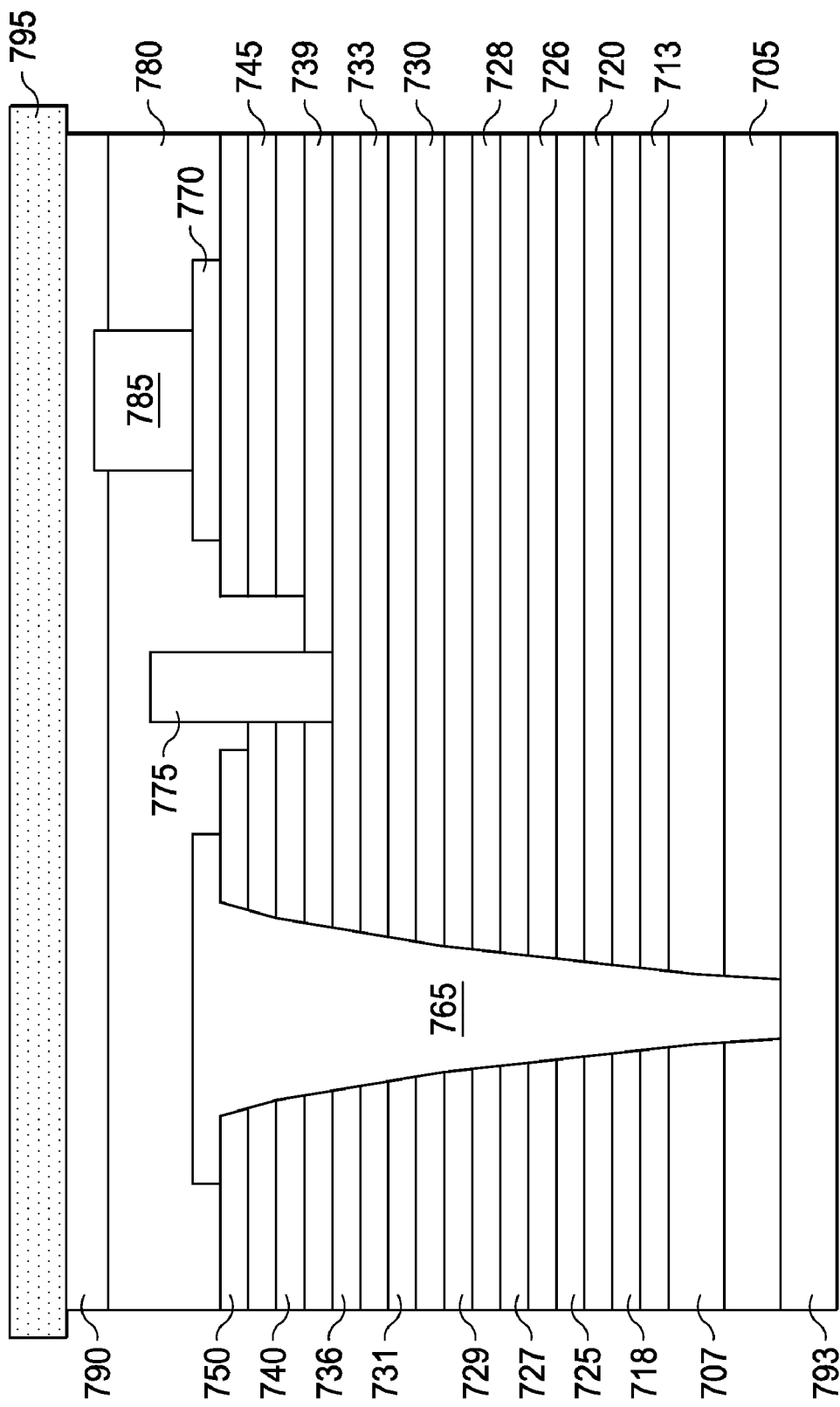
Figure 56:
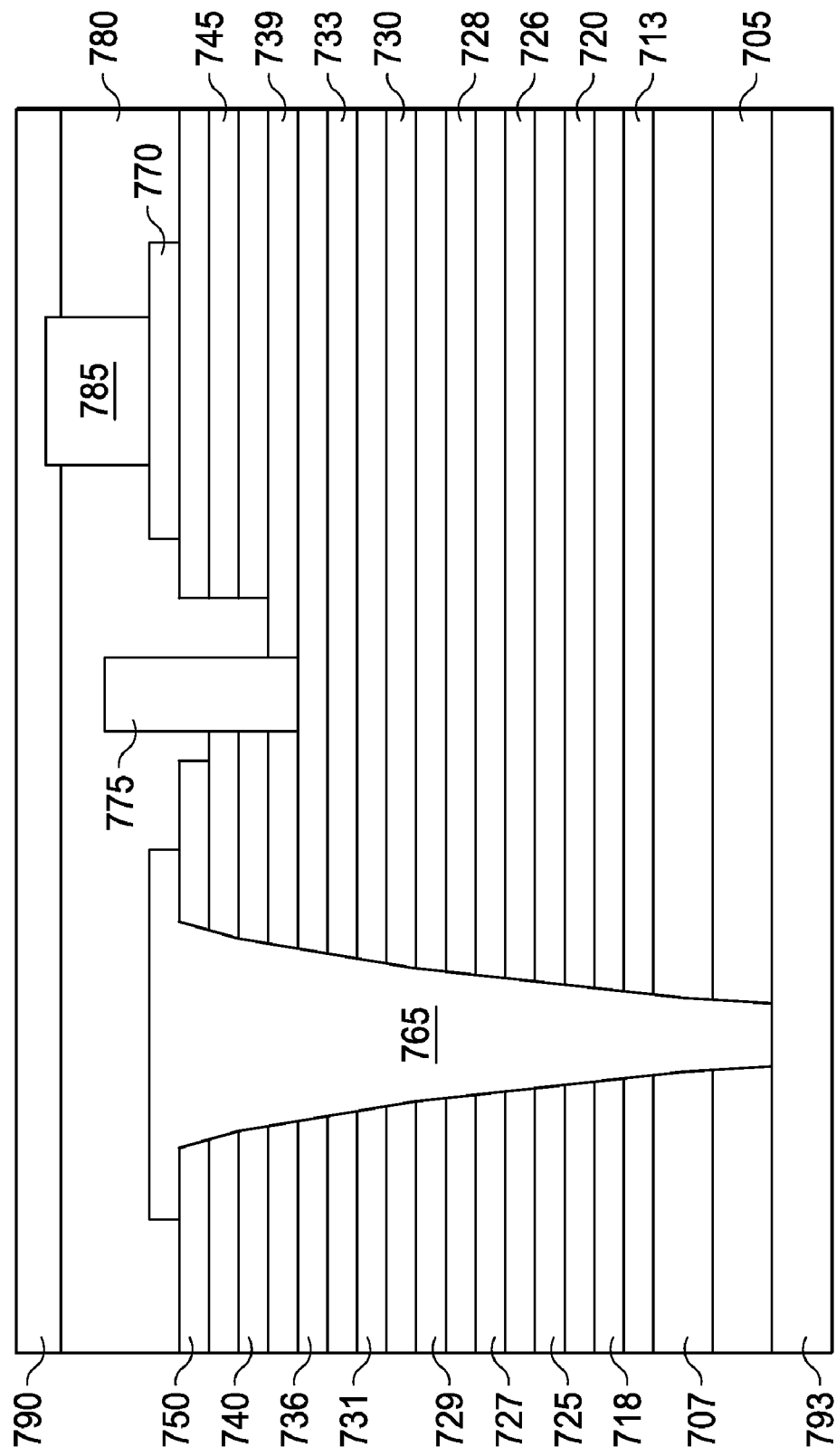

Turning now to FIG. 55, a metallic layer of gold-germanium-nickel-gold is selectively or blanket deposited (preferably evaporated) onto the back of the wafer to form a wide-area, low-resistance ohmic source contact 793 on the second epitaxial buffer layer 705. A further overlying sublayer of gold may be optionally plated onto the gold-germanium-nickel-gold layer to provide further mechanical support and to reduce the resistance of this layer as described previously with reference to FIG. 29, and the thin wafer can optionally be bonded to another carrier, such as one of silicon carbide, or to a metal heatsink, such as one of aluminum. The second carrier 795 is then separated from the wafer using ordinary techniques in the art for carrier removal, with the result as illustrated in FIG. 56.

The lateral FET as described above is readily operable as a depletion-mode FET as described above with reference to the device illustrated in FIGS. 5 to 34. In addition, an enhancement-mode device similarly can be produced or provided by alternatives as described hereinabove to the processing steps. A further alternative to preserve low on-resistance of an enhancement-mode device is similarly to recess the gate as described hereinabove through the gate recess closer to or proximate the lateral channels and provide higher pulse doping levels.

Thus, a lateral FET configured with switched contacts on opposing surfaces, an intrinsic body diode and lateral channel (s) that may be modulation doped has been introduced. The lateral FET can be configured as a depletion-mode or as an enhancement-mode device. The resulting lateral FET can be designed and packaged to exhibit very low on-resistance and be operable with very fast switching speeds.

Thus, the present invention provides a semiconductor device with a metallic contact formed directly on an epitaxial buffer layer, and a method of forming the same. In one embodiment, the semiconductor device includes an epitaxial buffer layer having a source contact covering a substantial portion of a bottom surface thereof, a lateral channel above the epitaxial buffer layer, a drain contact above the lateral channel, and an interconnect that connects the lateral channel to the epitaxial buffer layer, operable to provide a low resistance coupling between the first contact and the lateral channel. In a preferred embodiment, the interconnect is a metallized interconnect. In a further preferred embodiment, the interconnect is located in a trench formed through the semiconductor device down to the source contact. In a preferred embodiment, the epitaxial buffer layer is less than five micrometers ("µm") thick. In a further preferred embodiment, another lateral channel is formed within the semiconductor device. In a further preferred embodiment, a modulation doped spacer layer is interposed between the lateral channels.

In a preferred embodiment, a gate is located in a gate recess interposed between the lateral channel and the drain contact. In a preferred embodiment, a dielectric layer is interposed between the lateral channel and the drain contact. In a further preferred embodiment, the epitaxial buffer layer is formed from gallium arsenide. In a further preferred embodiment, the lateral channel is formed from indium gallium arsenide. In a preferred embodiment, a gate located in a gate recess located in the semiconductor device proximate the lateral channel thereby providing an enhancement mode device.

In another aspect, the present invention provides a semiconductor device including an epitaxial buffer layer having a source contact covering a substantial portion of a bottom surface thereof, a lateral channel above the conductive substrate, a drain contact above the lateral channel, an interconnect that connects the lateral channel to the epitaxial buffer layer operable to provide a low resistance coupling between the source contact and the lateral channel, and an intrinsic body diode operable to provide a conductive path between the source and drain contacts. In a preferred embodiment, the epitaxial buffer layer is less than five µm thick. In a preferred embodiment, an intrinsic body diode is formed at least in part by an isolation layer and a barrier layer above the epitaxial buffer layer. In a preferred embodiment, a gate is located in a gate recess interposed between the lateral channel and the drain contact.

In another aspect, the present invention provides a method of forming a semiconductor device. In a preferred embodiment, the method includes forming a first epitaxial buffer layer over a semiconductor substrate, forming an etch stop layer over the first epitaxial buffer layer, forming a second epitaxial buffer layer over the etch stop layer, and forming a pseudomorphic, high electron mobility device over the second epitaxial buffer layer. In a preferred embodiment, the method includes removably bonding a carrier to an upper surface of the device, removing the substrate and the first epitaxial buffer layer using grinding and etching processes, removing the first etch stop layer using a wet etching, and forming a metal contact on the exposed surface of the second epitaxial buffer layer. In a preferred embodiment, the method includes then separating the carrier from the device.

Those skilled in the art should understand that the previously described embodiments of the field-effect transistor and related methods of forming the same are submitted for illustrative purposes only. In addition, other embodiments capable of providing the advantages as described above are well within the broad scope of the present invention. While the field-effect transistor has been described as providing advantages in the environment of a power supply, other applications therefor are well within the broad scope of the present invention.

For a better understanding of power electronics, see "Principles of Power Electronics," by J. G. Kassakian, M. F. Schlecht and G. C. Verghese, Addison-Wesley (1991). For a better understanding of semiconductor devices and processes, see "Fundamentals of III-V Devices," by William Liu, John Wiley and Sons, (1999). For a better understanding of gallium arsenide processing, see "Modern GaAs Processing Methods," by Ralph Williams, Artech House, Second Ed. (1990). The aforementioned references are incorporated herein by reference.

Also, although the present invention and its advantages have been described in detail, it should be understood that various changes, substitutions and alterations can be made herein without departing from the spirit and scope of the invention as defined by the appended claims. For example, many of the processes discussed above can be implemented in different methodologies and replaced by other processes, or a combination thereof, to form the devices providing reduced on-resistance, gate drive energy, and costs as described herein.

Moreover, the scope of the present application is not intended to be limited to the particular embodiments of the process, machine, manufacture, composition of matter, means, methods and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps. Additionally, the terms "above," "formed over" or other similar terminology employed in reference to the semiconductor device or method of forming the same shall not be limited to "directly above" or "directly formed over" and, unless otherwise specified, the scope of the present invention contemplates that intervening layers may be present when characterizing a layer above, over, formed over, etc. another layer. In addition, while the illustrated embodiments describe a source contact on a bottom surface of a substrate and a drain contact on a top surface thereof, those skilled in the art understand that the contacts for a FET may be reversed as described herein and still fall within the broad scope of the present invention.

What is claimed is:

1. A semiconductor device, comprising:
   a conductive, low resistance epitaxial buffer layer having a contact covering a substantial portion of a bottom surface of said buffer layer without a substrate therebetween;
   a lateral channel above said buffer layer;
   another contact above said lateral channel; and
   an interconnect formed through said lateral channel and said buffer layer, operable to provide a low resistance coupling between said contact and said lateral channel.

2. The semiconductor device as recited in claim 1 further comprising another lateral channel between said contact and said another contact.

3. The semiconductor device as recited in claim 1 further comprising an isolation layer interposed between said buffer layer and said lateral channel.

4. The semiconductor device as recited in claim 3, further comprising:
   a spacer layer above said isolation layer;
   a super lattice buffer layer above said spacer layer;
   a modulation doped barrier layer above said super lattice buffer layer; and
   another spacer layer above said barrier layer.

5. The semiconductor device as recited in claim 3, further comprising:
   a spacer layer above said isolation layer;
   a modulation doped barrier layer above said spacer layer; and
   another spacer layer above said barrier layer.

6. The semiconductor device as recited in claim 1, further comprising:
   a modulation doped spacer layer above said lateral channel;
   a barrier layer above said spacer layer;
   a recess layer above said barrier layer; and
   an etch stop layer above said recess layer.

7. The semiconductor device as recited in claim 1, further comprising:
   a spacer layer above said lateral channel;
   a modulation doped barrier layer above said spacer layer;
   a recess layer above said barrier layer; and
   an etch stop layer above said recess layer.

8. The semiconductor device as recited in claim 1, further comprising:
   a source/drain contact layer above said lateral channel; and
   a metal layer and a drain post interposed between said source/drain contact layer and said another contact.

9. The semiconductor device as recited in claim 1 wherein said contact is a source contact and said another contact is a drain contact for said semiconductor device.

10. The semiconductor device as recited in claim 1 further comprising a gate located in a gate recess interposed between said lateral channel and said another contact.

11. A semiconductor device, comprising:
    a low resistance buffer layer having a contact covering a substantial portion of a bottom surface of said buffer layer without a substrate therebetween;
    a lateral channel above said buffer layer;
    another contact above said lateral channel; and
    an interconnect formed through said lateral channel and said buffer layer, operable to provide a low resistance coupling between said contact and said lateral channel.

12. The semiconductor device as recited in claim 11 further comprising another lateral channel between said contact and said another contact.

13. The semiconductor device as recited in claim 11 further comprising an isolation layer interposed between said buffer layer and said lateral channel.

14. The semiconductor device as recited in claim 13, further comprising:
    a spacer layer above said isolation layer;
    a super lattice buffer layer above said spacer layer;
    a modulation doped barrier layer above said super lattice buffer layer; and
    another spacer layer above said barrier layer.

15. The semiconductor device as recited in claim 13, further comprising:
    a spacer layer above said isolation layer;
    a modulation doped barrier layer above said spacer layer; and
    another spacer layer above said barrier layer.

16. The semiconductor device as recited in claim 11, further comprising:

a modulation doped spacer layer above said lateral channel;

a barrier layer above said spacer layer;

a recess layer above said barrier layer; and an etch stop layer above said recess layer.

17. The semiconductor device as recited in claim 11, further comprising:

a spacer layer above said lateral channel;

a modulation doped barrier layer above said spacer layer;

a recess layer above said barrier layer; and an etch stop layer above said recess layer.

18. The semiconductor device as recited in claim 11, further comprising:

a source/drain contact layer above said lateral channel; and a metal layer and a drain post interposed between said source/drain contact layer and said another contact.

19. The semiconductor device as recited in claim 11 wherein said contact is a source contact and said another contact is a drain contact for said semiconductor device.

20. The semiconductor device as recited in claim 11 further comprising a gate located in a gate recess interposed between said lateral channel and said another contact.

* * * * *

UNITED STATES PATENT AND TRADEMARK OFFICE
CERTIFICATE OF CORRECTION

PATENT NO. : 7,675,090 B2  
APPLICATION NO. : 11/732301  
DATED : March 9, 2010  
INVENTOR(S) : Sadaka et al.

Page 1 of 1

It is certified that error appears in the above-identified patent and that said Letters Patent is hereby corrected as shown below:

On the Title Page, Section (56) References Cited, OTHER PUBLICATIONS, 1st entry, delete "GaAs/AIGaAs" and insert --GaAs/AlGaAs--.
On the Title Page, Section (56) References Cited, OTHER PUBLICATIONS, Page 3, Column 1, 2nd entry, delete "GaN/AIN" and insert --GaN/AlN--.
On the Title Page, Section (56) References Cited, OTHER PUBLICATIONS, Page 3, Column 1, 2nd entry, delete "3921" and insert --3821--.
On the Title Page, Section (56) References Cited, OTHER PUBLICATIONS, Page 3, Column 2, 1st entry, delete "design" and insert --Design--.
In Col. 7, line 58, delete "$cm^3$" and insert --$cm^{-3}$--.
In Col. 8, line 5, delete "75-μm" and insert --75-25 μm--.
In Col. 10, line 39, remove paragraph return at beginning of line.
In Col. 10, line 40, delete "verses" and insert --versus--.
In Col. 15, line 35, delete "$5x10^{17}$" and insert --$5x10^{17}cm^{-3}$--.
In Col. 22, line 30, delete "Sep. 7, 2006,2006," and insert --Sep. 7, 2006,--.
In Col. 24, line 3, delete "filed" and insert --field--.
In Col. 25, line 49, delete "703" and insert --704--.
In Col. 26, line 11, delete "$5x10^{17}$" and insert --$5x10^{17}cm^{-3}$--.
In Col. 28, line 9, delete "$cm^3$" and insert --$cm^{-3}$--.

Signed and Sealed this

Eighth Day of June, 2010

David J. Kappos
*Director of the United States Patent and Trademark Office*